(12) United States Patent
Miyake

(10) Patent No.: US 10,297,331 B2
(45) Date of Patent: May 21, 2019

(54) SEMICONDUCTOR DEVICE AND ELECTRONIC DEVICE

(71) Applicant: Semiconductor Energy Laboratory Co., Ltd., Kanagawa-ken (JP)

(72) Inventor: Hiroyuki Miyake, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 231 days.

(21) Appl. No.: 15/333,723

(22) Filed: Oct. 25, 2016

(65) Prior Publication Data

US 2017/0125122 A1    May 4, 2017

(30) Foreign Application Priority Data

Oct. 30, 2015 (JP) ................................ 2015-214320

(51) Int. Cl.
| | | |
|---|---|---|
| G11C 19/00 | (2006.01) | |
| G11C 19/28 | (2006.01) | |
| H01L 27/12 | (2006.01) | |
| H01L 29/786 | (2006.01) | |
| G09G 3/36 | (2006.01) | |

(52) U.S. Cl.
CPC ............ *G11C 19/28* (2013.01); *G11C 19/287* (2013.01); *H01L 27/124* (2013.01); *H01L 27/1225* (2013.01); *H01L 27/1251* (2013.01); *H01L 27/1255* (2013.01); *H01L 29/7869* (2013.01); *H01L 29/78648* (2013.01); *G09G 3/3677* (2013.01); *G09G 2310/0286* (2013.01)

(58) Field of Classification Search
None
See application file for complete search history.

(56) References Cited

U.S. PATENT DOCUMENTS

| | | | |
|---|---|---|---|
| 7,202,863 B2 | 4/2007 | Kimura et al. | |
| 7,486,269 B2 | 2/2009 | Moon | |
| 7,586,478 B2 | 9/2009 | Azami et al. | |
| 7,786,985 B2 | 8/2010 | Kimura et al. | |
| 7,903,079 B2 | 3/2011 | Azami et al. | |
| 8,044,906 B2 | 10/2011 | Kimura et al. | |
| 8,059,078 B2 | 11/2011 | Kimura et al. | |
| 8,284,151 B2 | 10/2012 | Azami et al. | |
| 8,456,402 B2 | 6/2013 | Kimura et al. | |
| 8,659,532 B2 | 2/2014 | Azami et al. | |
| 8,718,224 B2 * | 5/2014 | Toyotaka ............... | G11C 19/28 377/64 |
| 8,729,550 B2 | 5/2014 | Yamazaki et al. | |
| 8,742,811 B2 | 6/2014 | Umezaki | |
| 8,744,038 B2 | 6/2014 | Hirose | |

(Continued)

FOREIGN PATENT DOCUMENTS

JP   2005-050502 A   2/2005

*Primary Examiner* — Tuan T Lam
(74) *Attorney, Agent, or Firm* — Husch Blackwell LLP

(57) ABSTRACT

A highly reliable semiconductor device is provided. A semiconductor device includes a shift register including a pulse output circuit formed using transistors having the same conductivity type, or the like. A transistor including a back gate is used as a transistor in which a potential difference between a source and a drain is not generated and positive stress is applied to a gate in a non-selection period of the pulse output circuit. In the non-selection period, stress applied to the transistors is reduced by interchanging the potentials of the gates and those of the back gates.

18 Claims, 38 Drawing Sheets

(56) References Cited

U.S. PATENT DOCUMENTS

| | | |
|---|---|---|
| 8,823,620 B2 | 9/2014 | Kimura et al. |
| 8,891,285 B2 | 11/2014 | Takemura |
| 8,907,348 B2 | 12/2014 | Miyairi et al. |
| 8,987,048 B2 | 3/2015 | Yamazaki et al. |
| 8,994,636 B2 | 3/2015 | Umezaki |
| 9,136,385 B2 | 9/2015 | Azami et al. |
| 9,184,185 B2 | 11/2015 | Yamazaki et al. |
| 9,190,425 B2 | 11/2015 | Kimura et al. |
| 9,337,826 B2 | 5/2016 | Koyama et al. |
| 9,406,699 B2 | 8/2016 | Umezaki |
| 9,472,263 B2 | 10/2016 | Takemura |
| 9,494,830 B2 | 11/2016 | Yamazaki et al. |
| 2011/0102409 A1* | 5/2011 | Hayakawa .......... H01L 27/1225 345/212 |
| 2013/0341618 A1 | 12/2013 | Koyama |
| 2014/0002426 A1 | 1/2014 | Tanada et al. |
| 2014/0012173 A1* | 1/2014 | Newman ............... A61F 5/0127 602/28 |
| 2014/0246669 A1 | 9/2014 | Miyairi et al. |
| 2014/0266304 A1 | 9/2014 | Hirose |
| 2015/0228799 A1 | 8/2015 | Koezuka et al. |
| 2016/0248419 A1 | 8/2016 | Koyama et al. |
| 2017/0263497 A1* | 9/2017 | Yamazaki ......... H01L 21/76861 |
| 2018/0130435 A1* | 5/2018 | Lee ..................... G09G 3/3677 |

\* cited by examiner

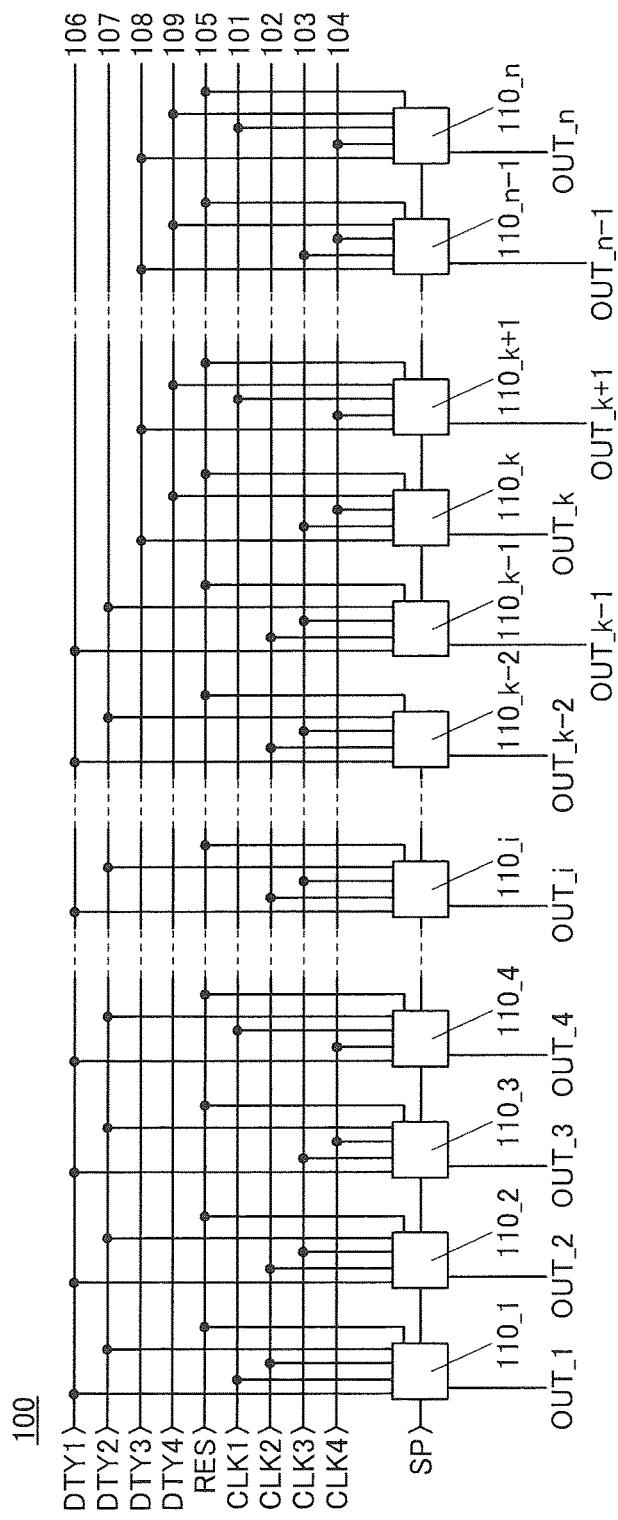
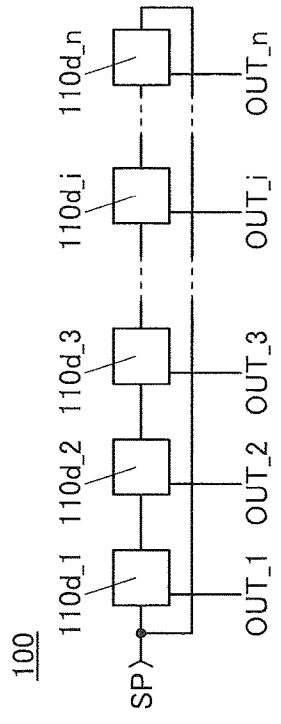
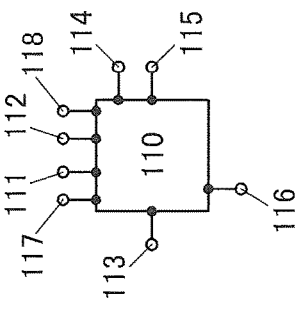
FIG. 1A 100
FIG. 1B
FIG. 1C 100

FIG. 6A
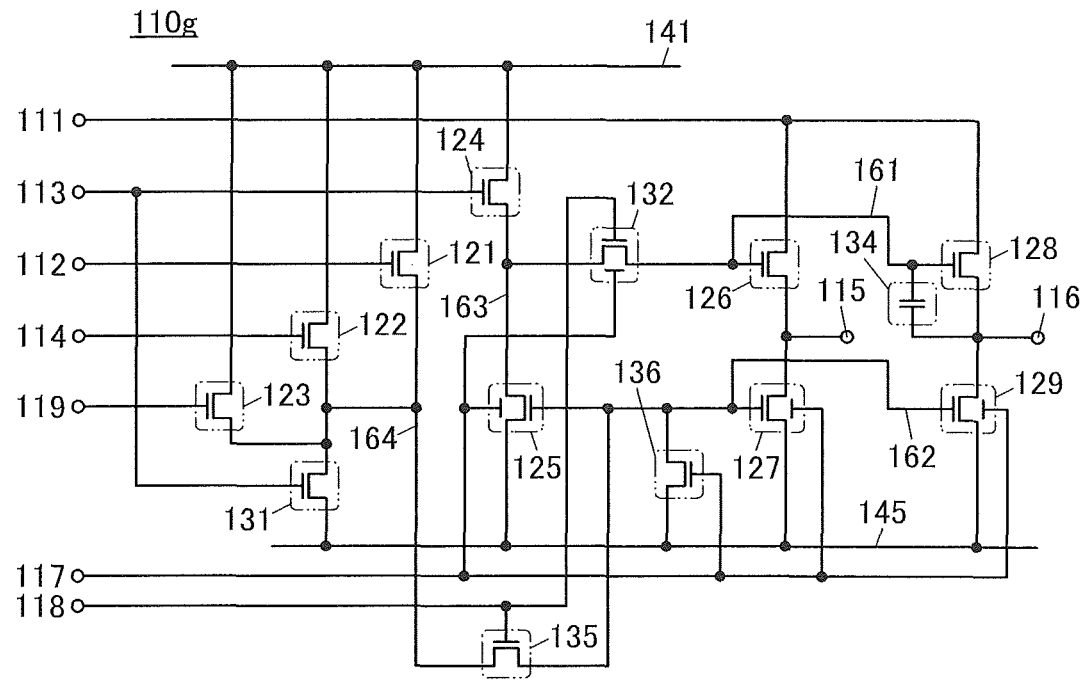
FIG. 6B1
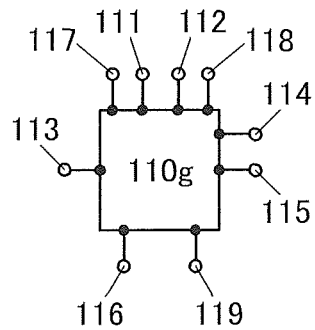
FIG. 6B2
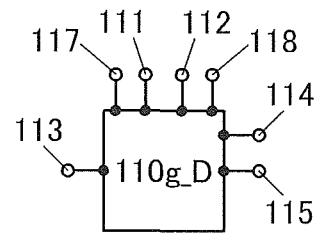
FIG. 6C
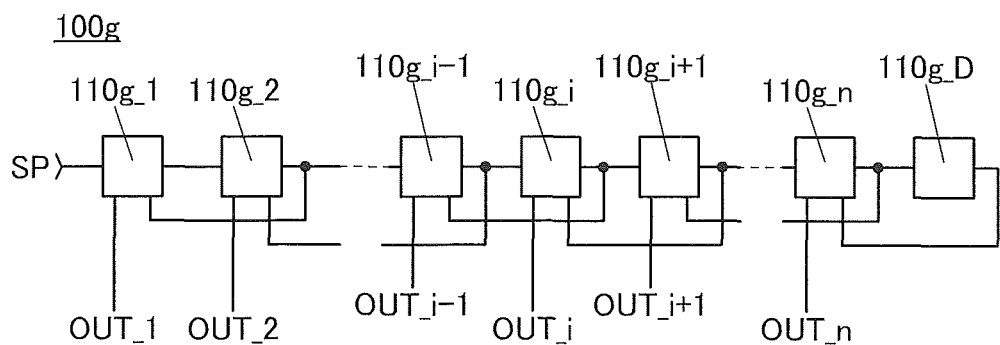

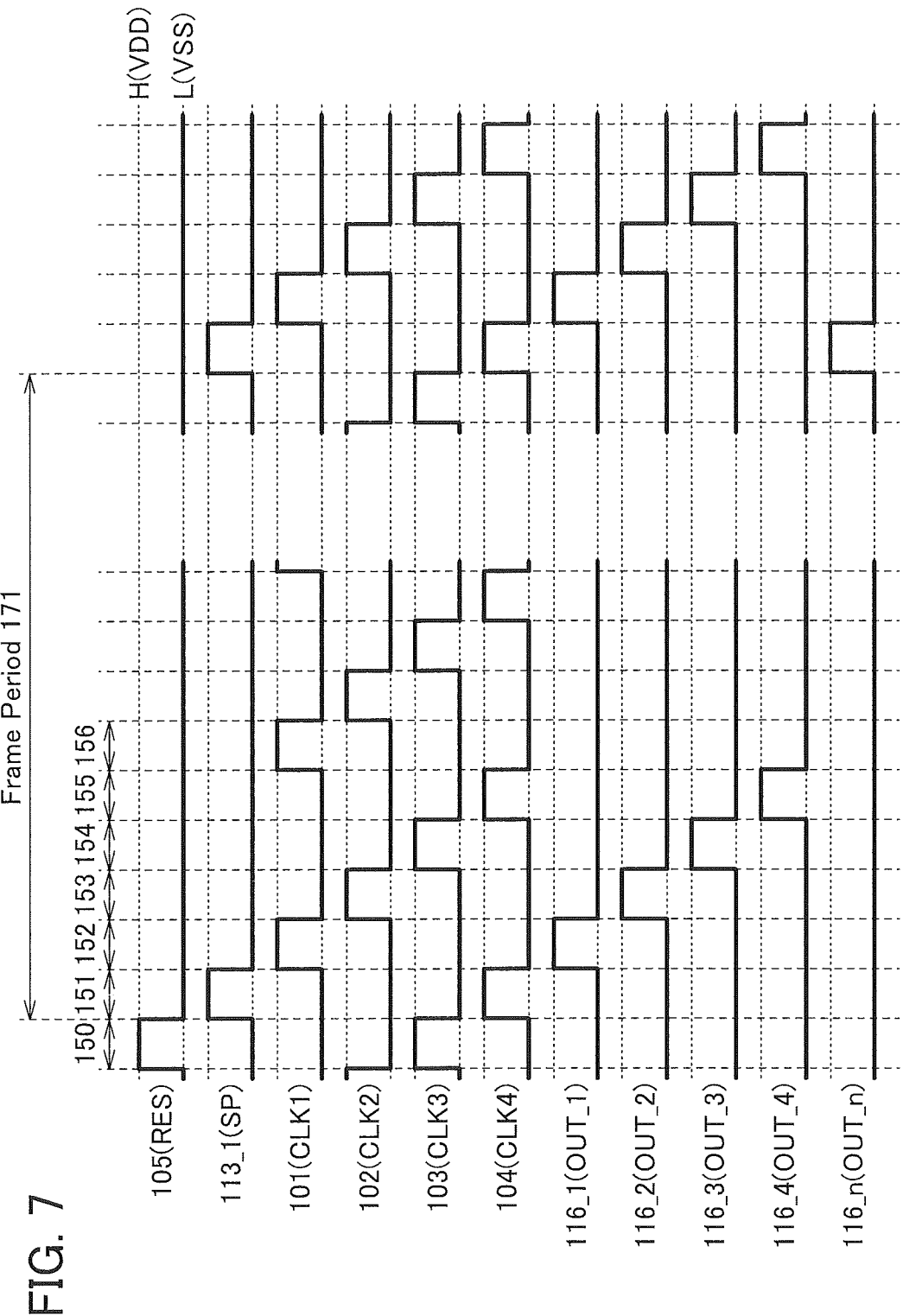

FIG. 20A1
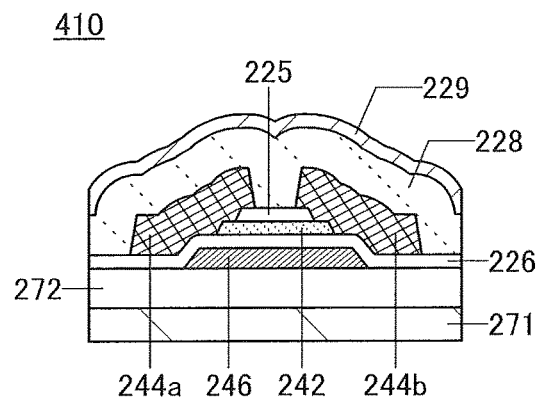
FIG. 20A2
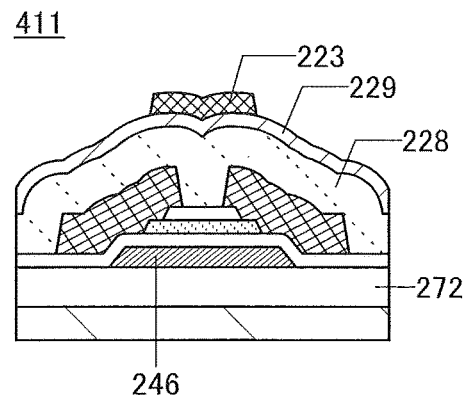
FIG. 20B1
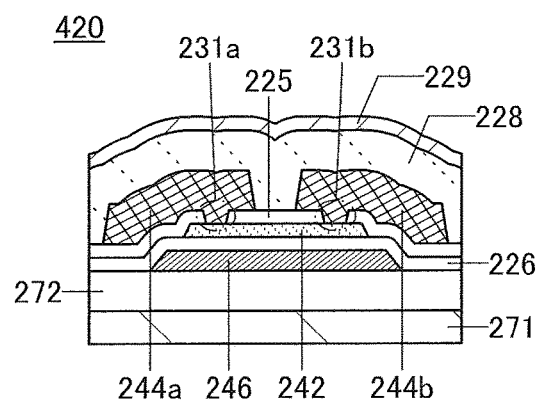
FIG. 20B2
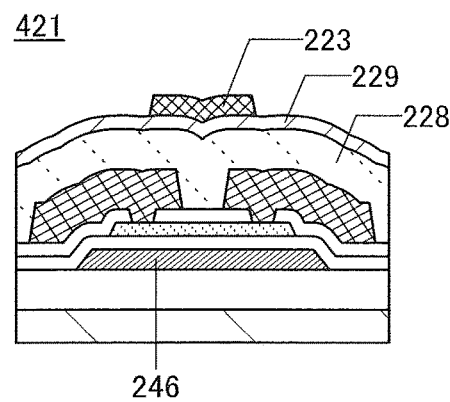
FIG. 20C1
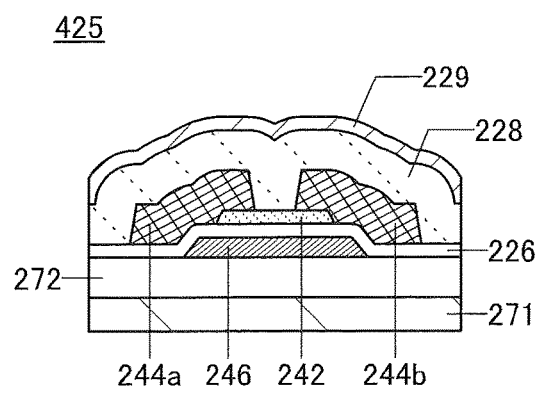
FIG. 20C2
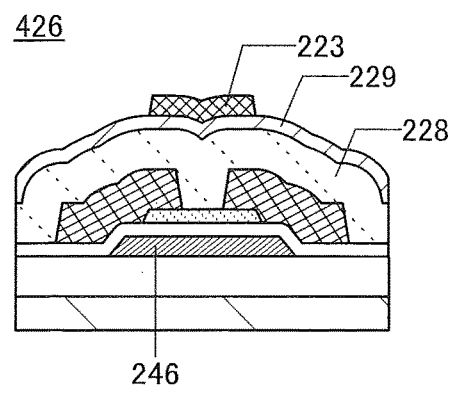

FIG. 21A1
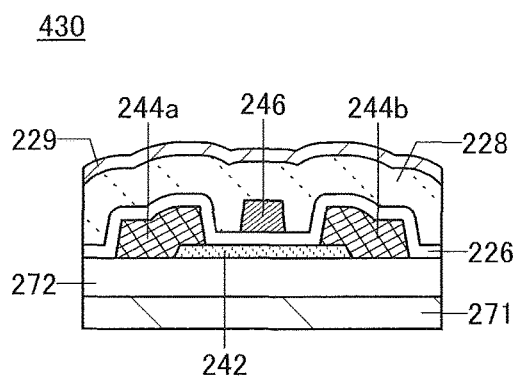
FIG. 21A2
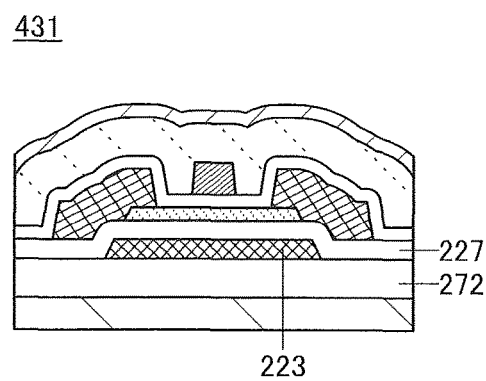
FIG. 21A3
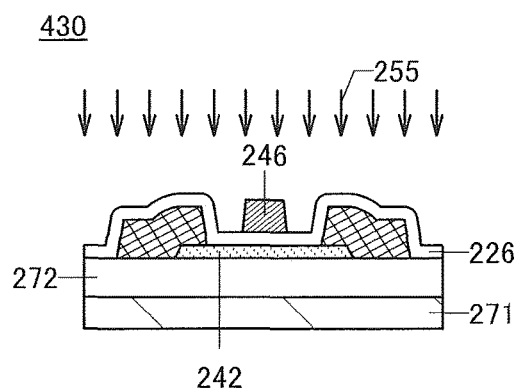
FIG. 21B1
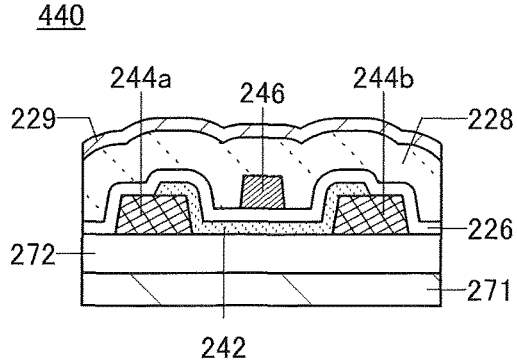
FIG. 21B2
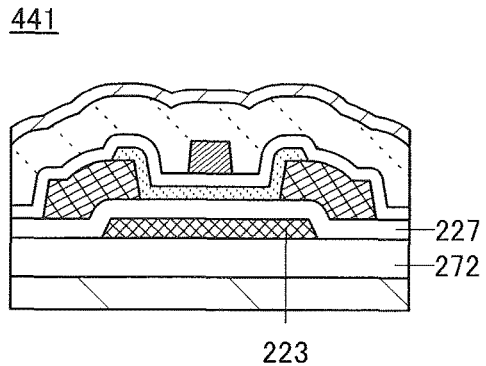

FIG. 22A1
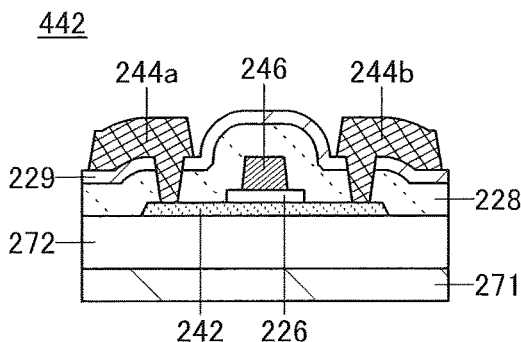
FIG. 22A2
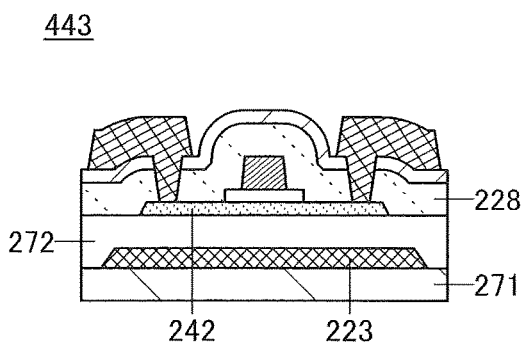
FIG. 22A3
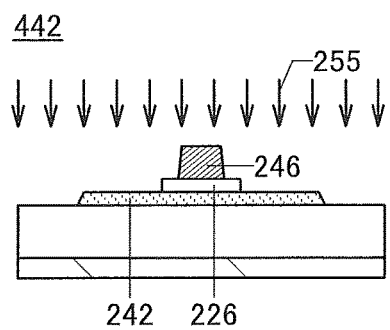
FIG. 22B1
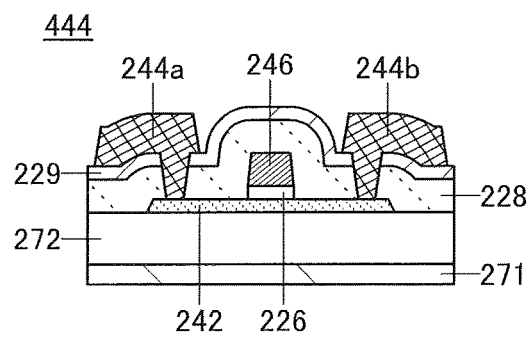
FIG. 22B2
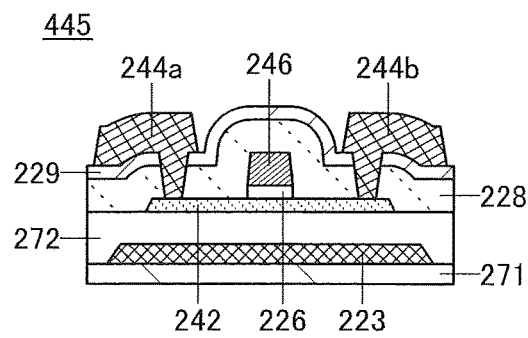
FIG. 22C1
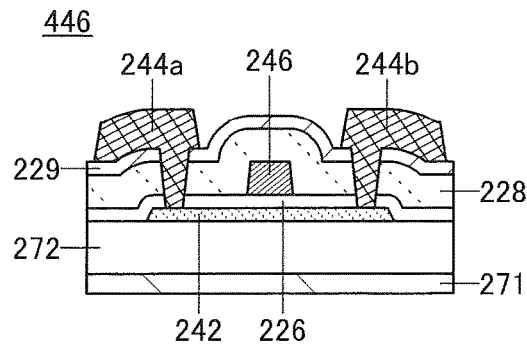
FIG. 22C2
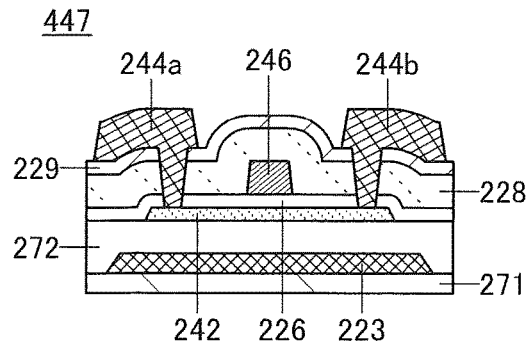

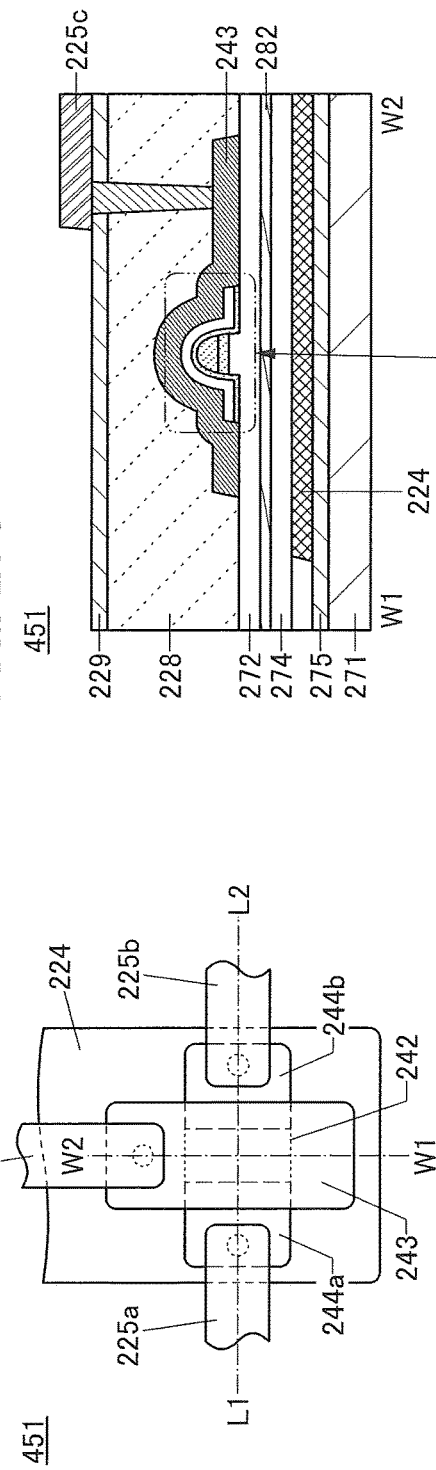
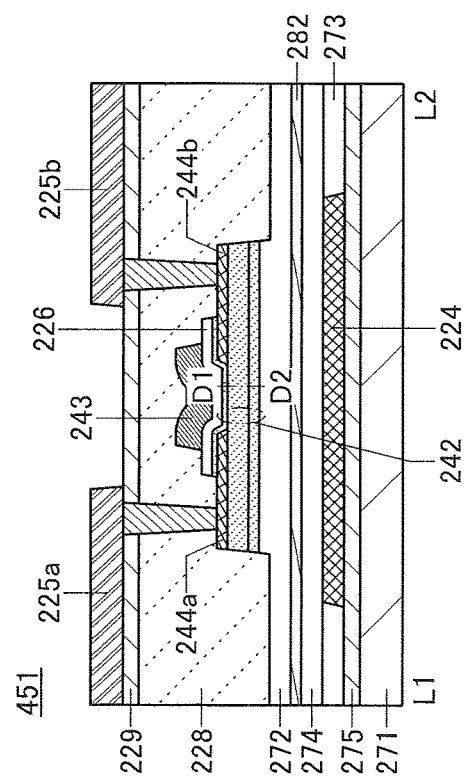
FIG. 23A
FIG. 23B
FIG. 23C

451a

451a

451a

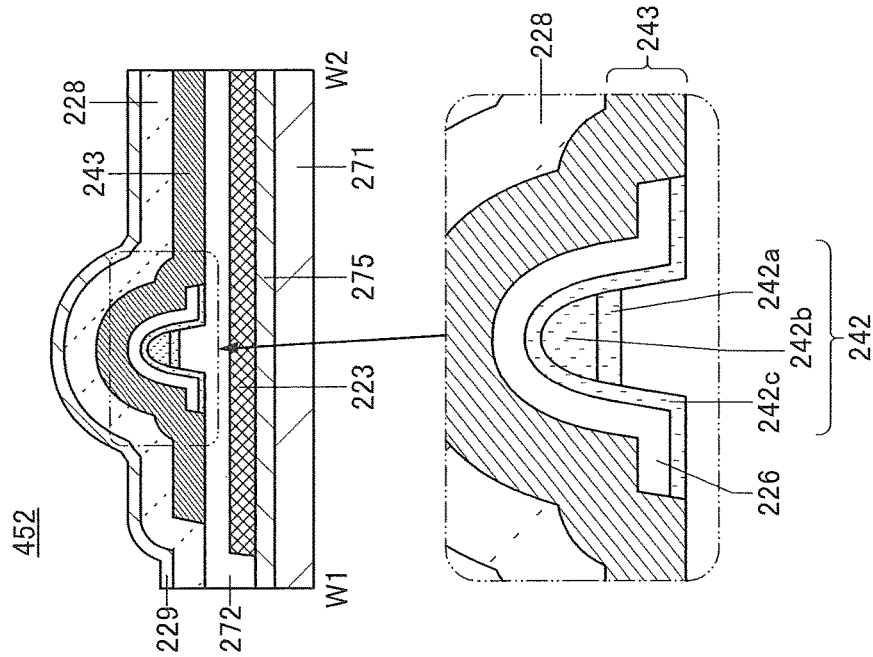
FIG. 25C
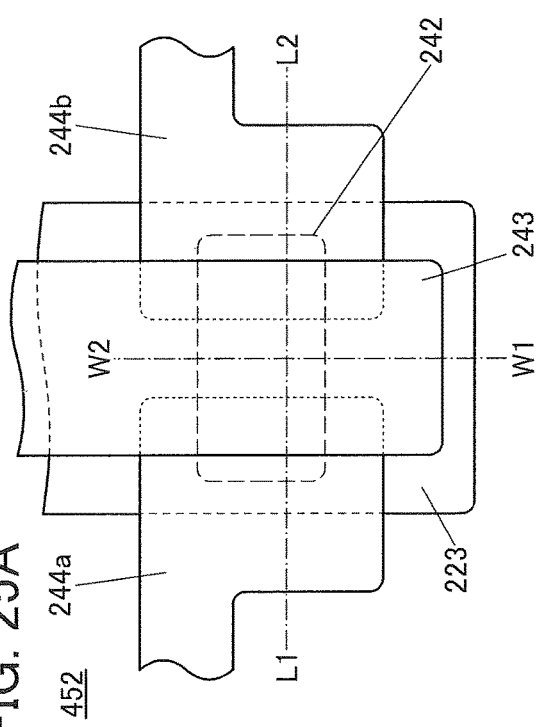
FIG. 25A
FIG. 25B

454

454

454

454a

454a

454a

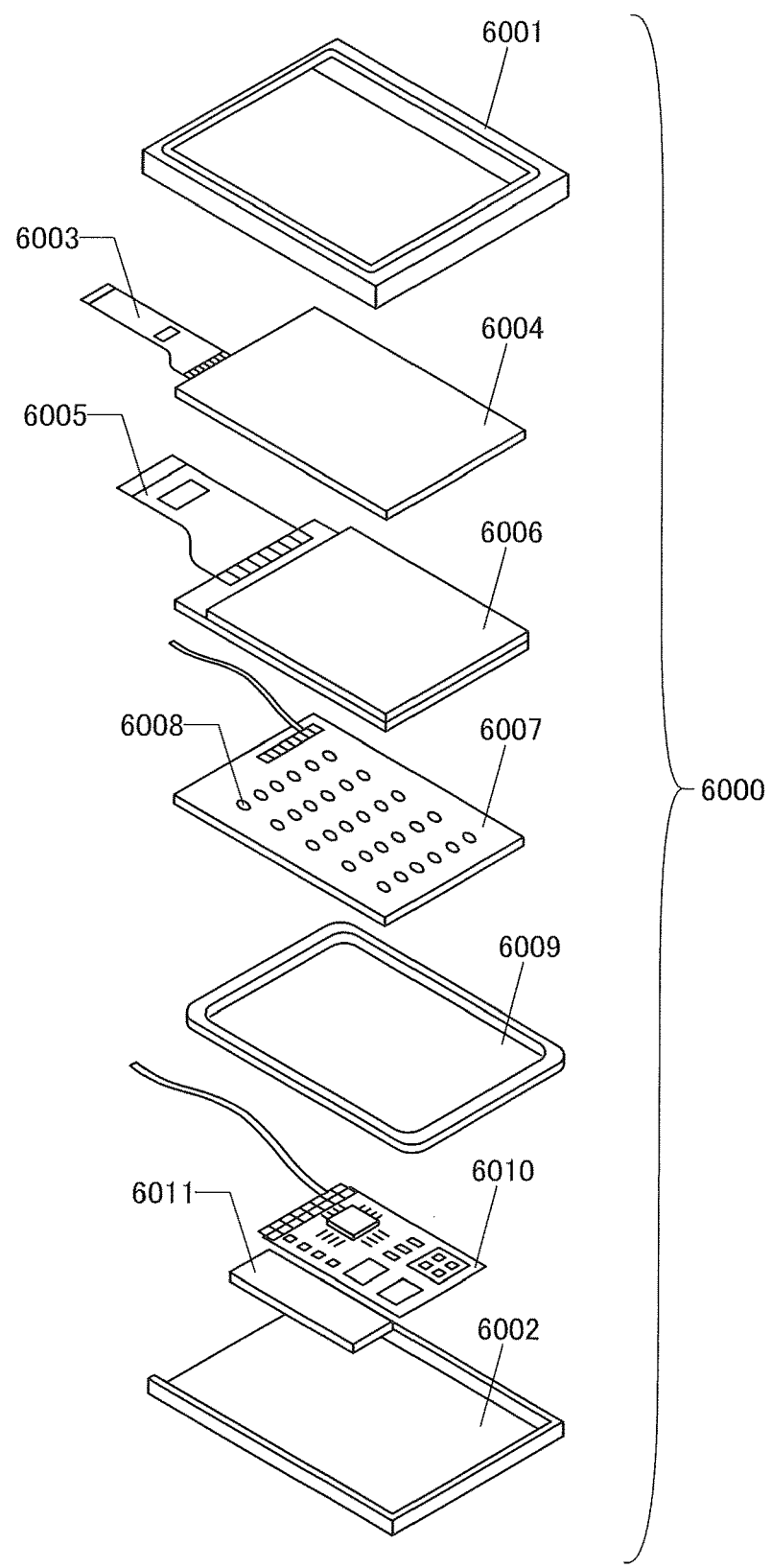

SEMICONDUCTOR DEVICE AND ELECTRONIC DEVICE

BACKGROUND OF THE INVENTION

1. Field of the Invention

One embodiment of the invention disclosed in this specification and the like relates to an object, a method, or a manufacturing method. In addition, one embodiment of the invention disclosed in this specification and the like relates to a process, a machine, manufacture, or a composition of matter.

In particular, one embodiment of the invention disclosed in this specification and the like relates to a semiconductor device and an electronic device including the semiconductor device.

In this specification and the like, a semiconductor device generally means a device that can function by utilizing semiconductor characteristics. A display device (e.g., a liquid crystal display device and a light-emitting display device), a lighting device, an electro-optical device, a power storage device, a memory device, a semiconductor circuit, an imaging device, an electronic device, and the like may include a semiconductor device.

2. Description of the Related Art

With the widespread of large display devices such as liquid crystal televisions, higher value added products have been demanded and thus under development. In particular, a technique to configure a driver circuit such as a scan line driver circuit over the same substrate as a pixel portion, using thin film transistors (TFTs) whose channel regions are made of an amorphous semiconductor has been actively developed because the technique greatly contributes to reduction in cost and improvement in reliability.

A thin film transistor whose channel region is formed using an amorphous semiconductor causes deterioration such as an increase in threshold voltage or a decrease in field-effect mobility. If deterioration in the thin film transistor proceeds, there arises a problem such that a driver circuit may have difficulty in operation and may fail to display an image. Therefore, a shift register capable of suppressing deterioration in a thin film transistor is disclosed in Patent Document 1. In Patent Document 1, in order to suppress degradation of thin film transistor characteristics, two thin film transistors are provided and the thin film transistors are connected between an output terminal of a flip-flop and a wiring to which VSS (hereinafter referred to as negative power supply) is supplied. Moreover, one thin film transistor and the other thin film transistor are alternately turned on. In such a manner, a period during which each of the thin film transistors is on can be shortened by approximately half in a frame period; therefore, degradation of characteristics of the thin film transistors can be suppressed to some extent.

REFERENCE

Patent Document

[Patent Document 1] Japanese Published Patent Application No. 2005-050502

SUMMARY OF THE INVENTION

An object of one embodiment of the present invention is to provide a highly reliable semiconductor device or the like. Another object of one embodiment of the present invention is to provide a semiconductor device or the like with high productivity. Another object of one embodiment of the present invention is to provide a semiconductor device or the like with low power consumption. Another object of one embodiment of the present invention is to provide a novel semiconductor device or the like.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including a shift register including a pulse output circuit formed using transistors having the same conductivity, or the like. In a non-selection period of the pulse output circuit, a transistor including a back gate is used as a transistor in which a potential difference between a source and a drain is not generated and positive stress is applied to a gate. In the non-selection period, by interchanging the potentials of the gates and those of the back gates, stress applied to the transistors can be relieved.

One embodiment of the present invention is a semiconductor device including first to twelfth transistors. The ninth to twelfth transistors each include a first gate and a second gate. One of a source and a drain of the first transistor is electrically connected to a first wiring. The other of the source and the drain of the first transistor is electrically connected to one of a source and a drain of the second transistor. The other of the source and the drain of the second transistor is electrically connected to a second wiring. One of a source and a drain of the third transistor is electrically connected to the first wiring. The other of the source and the drain of the third transistor is electrically connected to the other of the source and the drain of the first transistor. One of a source and a drain of the fourth transistor is electrically connected to the first wiring. The other of the source and the drain of the fourth transistor is electrically connected to one of a source and a drain of the ninth transistor. A gate of the fourth transistor is electrically connected to a gate of the second transistor. The other of the source and the drain of the ninth transistor is electrically connected to the second wiring. The first gate of the ninth transistor is electrically connected to the first gate of the tenth transistor. The second gate of the ninth transistor is electrically connected to a third wiring. One of a source and a drain of the eleventh transistor is electrically connected to the other of the source and the drain of the fourth transistor. The other of the source and the drain of the eleventh transistor is electrically connected to a gate of the fifth transistor. The first gate of the eleventh transistor is electrically connected to a fourth wiring. The second gate of the eleventh transistor is electrically connected to the second gate of the ninth transistor. One of a source and a drain of the fifth transistor is electrically connected to one of a source and a drain of the sixth transistor. The other of the source and the drain of the fifth transistor is electrically connected to one of a source and a drain of the tenth transistor. The second gate of the tenth transistor is electrically connected to the third wiring. The other of the source and the drain of the sixth transistor is electrically connected to one of a source and a drain of the twelfth transistor. A gate of the sixth transistor is electrically connected to the gate of the fifth transistor. The other of the source and the drain of the twelfth transistor is electrically connected to the second wiring. The first gate of the twelfth transistor is electrically connected to the first gate of the tenth transistor. The second gate of the twelfth transistor is electrically connected to the third wiring. One of a source and a drain of the seventh transistor is electrically connected to the first gate of the tenth transistor. The other of the source and the drain of the seventh transistor is electrically connected to the second wiring. A gate of the seventh transistor is electrically connected to the third wiring. One of a source and a drain of the eighth transistor is electrically connected to the other of the source and the drain of the third transistor. The other of the source and the drain of the eighth transistor is electrically connected to the first gate of the tenth transistor. A gate of the eighth transistor is electrically connected to the fourth wiring.

The semiconductor device of one embodiment of the present invention may include a first capacitor. One of electrodes of the first capacitor may be electrically connected to the gate of the sixth transistor, and the other of the electrodes of the first capacitor may be electrically connected to one of the source and the drain of the twelfth transistor.

The semiconductor device of one embodiment of the present invention may include a second capacitor. One of electrodes of the second capacitor may be electrically connected to the other of the source and the drain of the third transistor, and the other of the electrodes of the second capacitor may be electrically connected to the second wiring.

The semiconductor device of one embodiment of the present invention may include a third capacitor. One of electrodes of the third capacitor may be electrically connected to the first gate of the tenth transistor, and the other of the electrodes of the third capacitor may be electrically connected to the second wiring.

One of the source and the drain of the sixth transistor may be electrically connected to a wiring through which a first clock signal is supplied. A gate of the first transistor may be electrically connected to a wiring through which a reset signal is supplied. The gate of the second transistor may be electrically connected to a wiring through which a start signal is supplied. A gate of the third transistor may be electrically connected to a wiring through which a second clock signal is supplied.

The semiconductor device of one embodiment of the present invention may have a function of outputting a signal from the other of the source and the drain of the fifth transistor. The semiconductor device of one embodiment of the present invention may have a function of outputting a signal from the other of the source and the drain of the sixth transistor.

It is preferable that each of the first to twelfth transistors include an oxide semiconductor as a semiconductor layer in which a channel is formed.

A highly reliable semiconductor device or the like can be provided. Alternatively, a semiconductor device or the like with high productivity can be provided. Alternatively, a semiconductor device or the like with low power consumption can be provided. Alternatively, a semiconductor device or the like including a unipolar logic circuit whose output voltage hardly decreases can be provided. Alternatively, a novel semiconductor device or the like can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIG. 1A is a diagram showing an example of a shift register, and FIGS. 1B and 1C are diagrams showing examples of pulse output circuits.

FIGS. 6A, 6B1, and 6B2 are diagrams each showing an example of a pulse output circuit, and FIG. 6C is a diagram showing an example of a shift register.

FIG. 7 is a timing chart illustrating operation of a shift register.

FIGS. 20A1, 20A2, 20B1, 20B2, 20C1, and 20C2 illustrate examples of transistors.

FIGS. 21A1, 21A2, 21A3, 21B1, and 21B2 illustrate examples of transistors.

FIGS. 22A1, 22A2, 22A3, 22B1, 22B2, 22C1, and 22C2 illustrate examples of transistors.

FIGS. 23A to 23C illustrate an example of a transistor.
FIGS. 25A to 25C illustrate an example of a transistor.
FIG. 37 illustrates an example of a display module.

DETAILED DESCRIPTION OF THE INVENTION

Figure 2A:
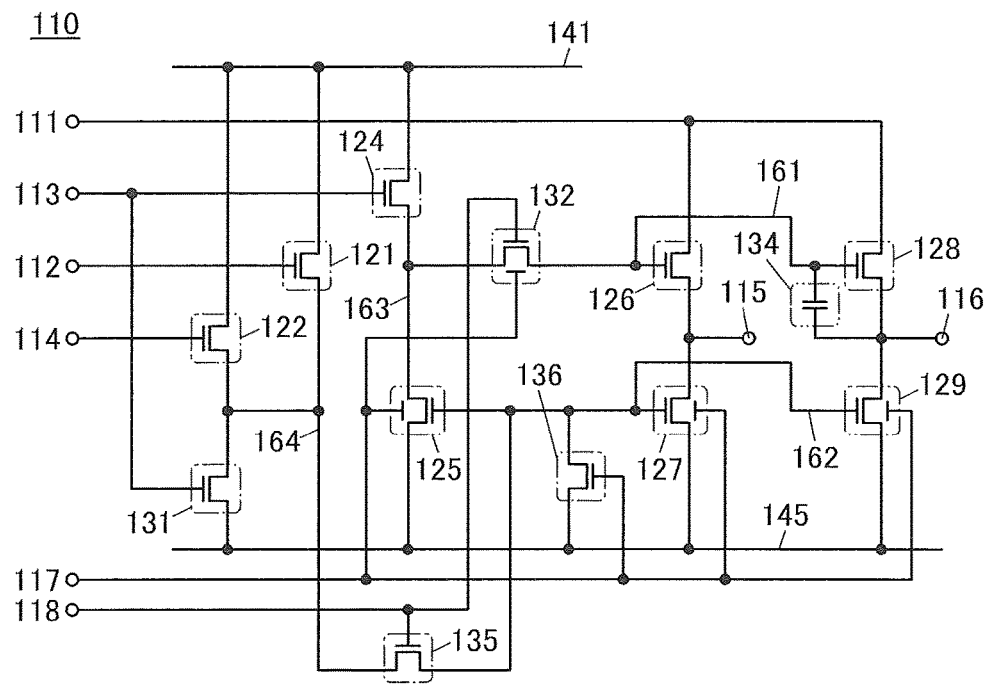
FIGS. 2A and 2B each illustrate an example of a pulse output circuit.

Embodiments of the present invention will be described with reference to drawings and the like. Note that the present invention is not limited to the following description, and it is easily understood by those skilled in the art that various changes and modifications can be made without departing from the spirit and scope of the present invention. Accordingly, the present invention should not be interpreted as being limited to the content of the following embodiments. Note that in the structures of the invention described below, the same portions or portions having similar functions are denoted by the same reference numerals in different drawings, and description of such portions is not repeated in some cases.

The position, size, range, and the like of each component illustrated in the drawings and the like are not accurately represented in some cases to facilitate understanding of the invention. Therefore, the disclosed invention is not necessarily limited to the position, size, range, or the like disclosed in the drawings and the like.

In the drawings, some components might not be illustrated for easy understanding of the invention. In addition, some hidden lines and the like might not be shown.

Note that ordinal numbers such as "first" and "second" and the like in this specification and the like are used in order to avoid confusion among components and do not denote the priority or the order such as the order of steps or the stacking order. A term without an ordinal number in this specification and the like might be provided with an ordinal number in a claim in order to avoid confusion among components. In addition, a term with an ordinal number in this specification and the like might be provided with a different ordinal number in a claim. Moreover, a term with an ordinal number in this specification and the like might not be provided with any ordinal number in a claim.

In addition, in this specification and the like, the term such as an "electrode" or a "wiring" does not limit a function of a component. For example, an "electrode" is used as part of a "wiring" in some cases, and vice versa. Furthermore, the term "electrode" or "wiring" can also mean a combination of a plurality of "electrodes" and "wirings" formed in an integrated manner.

Note that the term "over" or "under" in this specification and the like does not necessarily mean that a component is placed "directly on" or "directly below" and "directly in contact with" another component. For example, the expression "electrode B over insulating layer A" does not necessarily mean that the electrode B is on and in direct contact with the insulating layer A and can mean the case where another component is provided between the insulating layer A and the electrode B.

Furthermore, functions of the source and the drain might be switched depending on operation conditions, e.g., when a transistor having a different polarity is employed or a direction of current flow is changed in circuit operation. Thus, the terms "source" and "drain" can be switched in this specification.

In this specification and the like, when it is explicitly described that X and Y are connected, the case where X and Y are electrically connected, the case where X and Y are functionally connected, and the case where X and Y are directly connected are included therein. Accordingly, another element may be provided between elements having a connection relation illustrated in drawings and texts, without being limited to a predetermined connection relation, for example, the connection relation illustrated in the drawings and the texts.

Note that in this specification and the like, the expression "electrically connected" includes the case where components are connected through an "object having any electric function". There is no particular limitation on an "object having any electric function" as long as electric signals can be transmitted and received between components that are connected through the object. Accordingly, even when the expression "to be electrically connected" is used in this specification, there is a case in which no physical connection is made and a wiring is just extended in an actual circuit.

Note that the channel length refers to, for example, a distance between a source (source region or source electrode) and a drain (drain region or drain electrode) in a region where a semiconductor (or a portion where a current flows in a semiconductor when a transistor is on) and a gate electrode overlap with each other or a region where a channel is formed (also referred to as a "channel formation region") in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

A channel width refers to, for example, the length of a portion where a source and a drain face each other in a region where a semiconductor (or a portion where a current flows in a semiconductor when a transistor is on) and a gate electrode overlap with each other, or a region where a channel is formed in a top view. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is actually formed (also referred to as an "effective channel width") is different from a channel width shown in a top view of a transistor (also referred to as an "apparent channel width") in some cases. For example, in a transistor having a gate electrode covering side surfaces of a semiconductor layer, an effective channel width is greater than an apparent channel width, and its influence cannot be ignored in some cases. For example, in a miniaturized transistor having a gate electrode covering a side surface of a semiconductor, the proportion of a channel region formed in a side surface of a semiconductor is increased. In that case, an effective channel width is greater than an apparent channel width.

In such a case, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, an apparent channel width is referred to as a surrounded channel width (SCW) in some cases. Furthermore, in this specification, in the case where the term "channel width" is simply used, it may denote a surrounded channel width and an apparent channel width.

Alternatively, in this specification, in the case where the term "channel width" is simply used, it may denote an effective channel width in some cases. Note that a channel length, a channel width, an effective channel width, an apparent channel width, a surrounded channel width, and the like can be determined by analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

Unless otherwise specified, a transistor described in this specification and the like refers to an enhancement (normally-off) field-effect transistor (FET). Unless otherwise specified, a transistor described in this specification and the like is an n-channel transistor, and a source and a drain are electrically connected to each other (on state) when a voltage ($V_{gs}$) between a gate and the source exceeds the threshold voltage ($V_{th}$). Unless otherwise specified, $V_{th}$ of the transistors described in this specification and the like are the same.

Note that an impurity in a semiconductor refers to, for example, elements other than the main components of the semiconductor. For example, an element with a concentration lower than 0.1 atomic % can be regarded as an impurity. When an impurity is contained, the density of states (DOS) in a semiconductor may be increased, the carrier mobility may be decreased, or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the oxide semiconductor; specifically, there are hydrogen (included in water), lithium, sodium, silicon, boron, phosphorus, and carbon, for example. In the case of an oxide semiconductor, oxygen vacancy may be formed by entry of impurities such as hydrogen. Furthermore, in the case where the semiconductor is silicon, examples of an impurity which changes characteristics of the semiconductor include oxygen, Group 1 elements except hydrogen, Group 2 elements, Group 13 elements, and Group 15 elements.

In this specification, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. The term "perpendicular" or "orthogonal" indicates that the angle formed between two straight lines is greater than or equal to 80° and less than or equal to 100°, and accordingly also includes the case where the angle is greater than or equal to 85° and less than or equal to 95°. A term "substantially perpendicular" indicates that the angle formed between two straight lines is greater than or equal to 60° and less than or equal to 120°.

In the specification and the like, the terms "identical", "the same", "equal", "uniform", and the like (including synonyms thereof) used in describing calculation values and actual measurement values allow for a margin of error of ±20% unless otherwise specified.

In this specification and the like, a high power supply potential $V_{DD}$ (hereinafter also simply referred to as $V_{DD}$ or H potential) is a power supply potential higher than a low power supply potential $V_{SS}$. The low power supply potential $V_{SS}$ (hereinafter also simply referred to as $V_{SS}$ or L potential) is a power supply potential lower than the high power supply potential $V_{DD}$. In addition, a ground potential can be used as $V_{DD}$ or $V_{SS}$. For example, in the case where a ground potential is used as $V_{DD}$, $V_{SS}$ is lower than the ground potential, and in the case where a ground potential is used as $V_{SS}$, $V_{DD}$ is higher than the ground potential.

A voltage usually refers to a potential difference between a given potential and a reference potential (e.g., a ground potential (GND potential) or a source potential). Potentials are relative values, and a potential supplied to a wiring or the like is sometimes changed depending on the reference potential. Thus, a voltage can be referred to as a potential and vice versa in some cases. In this specification and the like, $V_{SS}$ is referred to as a reference potential unless otherwise specified.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Embodiment 1

In this embodiment, examples of pulse output circuits, which are a kind of semiconductor circuits, and shift registers each including any of the pulse output circuits will be described with reference to drawings.

<Conventional Shift Register>

First, an example of a configuration and operation of a conventional shift register will be described with reference to FIGS. 14A to 14C, FIG. 15, FIG. 16, FIGS. 17A and 17B, FIGS. 18A and 18B, and FIG. 19.

<Configuration of Shift Register 900>

Figure 14A:
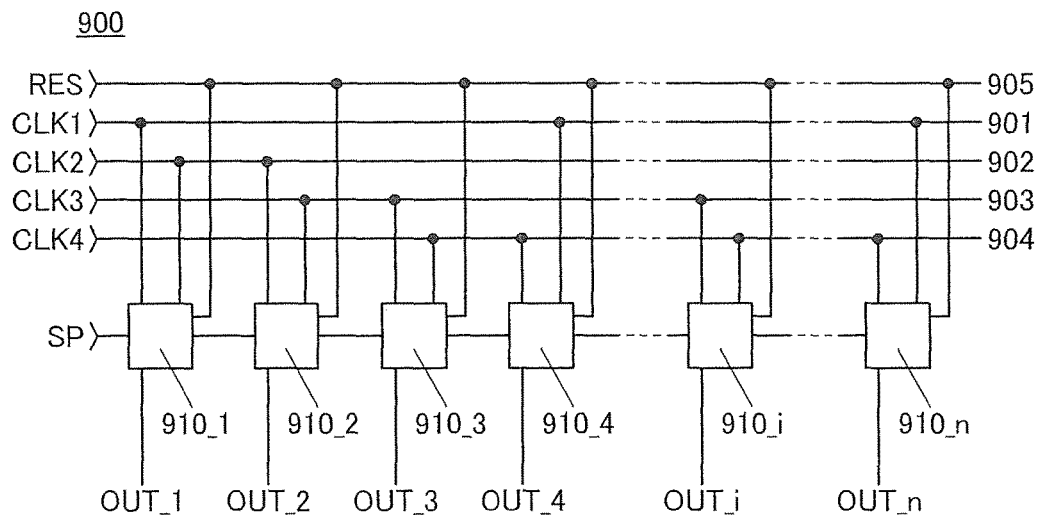
FIG. 14A is a diagram showing an example of a shift register.

A shift register 900 illustrated in FIG. 14A includes n (n is a natural number of 2 or more) pulse output circuits 910. In this specification and the like, the pulse output circuit 910 in a first stage and the pulse output circuit 910 in an n-th stage are referred to as a pulse output circuit 910_1 and a pulse output circuit 910_n, respectively, in some cases. Furthermore, the pulse output circuit 910 in an i-th stage (i is a natural number of greater than or equal to 1 and less than or equal to n) is referred to as a pulse output circuit 910_i in some cases. A terminal, an output signal OUT, and the like of the pulse output circuit 910 are referred in a manner similar to the above in some cases. For example, an output signal OUT of the pulse output circuit 910_i is referred to as an output signal OUT_i in some cases.

The shift register 900 includes a wiring 905 through which a reset signal RES is supplied and wirings 901 to 904 through which clock signals are supplied. The wirings 901 to 904 are supplied with first to fourth clock signals CLK1 to CLK4, respectively.

The clock signal is a signal which changes between H and L potentials at regular intervals, and the first to fourth clock signals CLK1 to CLK4 are delayed by ¼ period sequentially. In this embodiment, control or the like of the pulse output circuit is performed with the first to fourth clock signals CLK1 to CLK4.

Figure 14B:
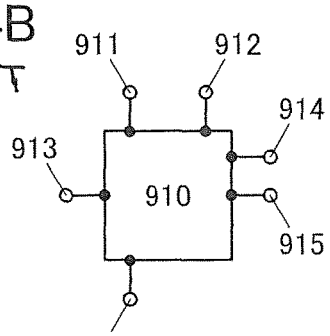
FIGS. 14B and 14C are diagrams showing an example of a pulse output circuit.

The pulse output circuits 910 each include terminals 911 to 916 (see FIG. 14B). The terminals 911 and 912 are each electrically connected to one of the wirings 901 to 904. For example, in FIG. 14A, the terminals 911 and 912 of the pulse output circuit 910_1 are electrically connected to the wirings 901 and 902, respectively. The terminals 911 and 912 of the pulse output circuit 910_2 are electrically connected to the wirings 902 and 903, respectively. The terminals 914 are electrically connected to the wiring 905.

A start signal SP is supplied to the terminal 913 of the pulse output circuit 910_1 and an output signal OUT_1 is output from the terminal 916 thereof. The terminal 913 of the pulse output circuit 910_i is electrically connected to the terminal 915 of the pulse output circuit 910_i−1 (pulse output circuit 910 in an i−1-th stage). The terminal 915 of the pulse output circuit 910_i is electrically connected to the terminal 913 of the pulse output circuit 910_i+1. An output signal OUT_i is output from the terminal 916 of the pulse output circuit 910_i. An output signal OUT_n is output from the terminal 916 of the pulse output circuit 910_n in the n-th stage.

Note that the pulse output circuit 910_n does not necessarily include the terminal 915. When the pulse output circuit 910_n includes the terminal 915, the terminal 915 (terminal 915_n) may be electrically connected to the terminal 913 (terminal 913_1) of the pulse output circuit 910_1 in the first stage.

[Configuration of Pulse Output Circuit 910]

Figure 14C:
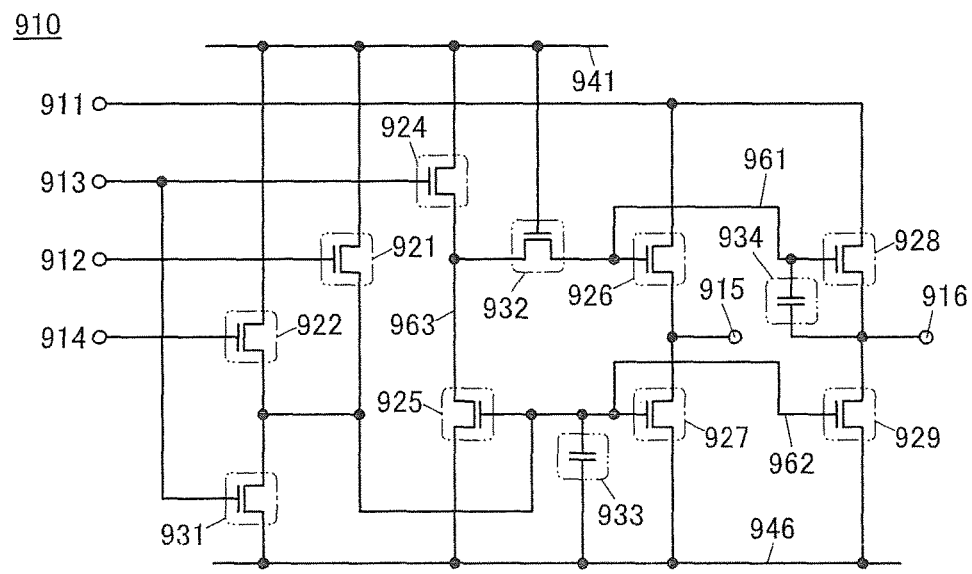

Next, the configuration of the pulse output circuit 910 will be described (see FIG. 14C). The pulse output circuit 910 includes a transistor 921, a transistor 922, transistors 924 to 929, a transistor 931, a transistor 932, a capacitor 933, and a capacitor 934.

One of a source and a drain of the transistor 921 is electrically connected to a wiring 941, the other of the source and the drain of the transistor 921 is electrically connected to a node 962, and a gate of the transistor 921 is electrically connected to the terminal 912. One of a source and a drain of the transistor 922 is electrically connected to the wiring 941, the other of the source and the drain of the transistor 922 is electrically connected to the node 962, and a gate of the transistor 922 is electrically connected to the terminal 914. One of a source and a drain of the transistor 924 is electrically connected to the wiring 941, the other of the source and the drain of the transistor 924 is electrically connected to a node 963, and a gate of the transistor 924 is electrically connected to the terminal 913. One of a source and a drain of the transistor 925 is electrically connected to the node 963, the other of the source and the drain of the transistor 925 is electrically connected to a wiring 946, and a gate of the transistor 925 is electrically connected to the node 962. One of a source and a drain of the transistor 926 is electrically connected to the terminal 911, the other of the source and the drain of the transistor 926 is electrically connected to the terminal 915, and a gate of the transistor 926 is electrically connected to a node 961. One of a source and a drain of the transistor 927 is electrically connected to the terminal 915, the other of the source and the drain of the transistor 927 is electrically connected to the wiring 946, and a gate of the transistor 927 is electrically connected to the node 962. One of a source and a drain of the transistor 928 is electrically connected to the terminal 911, the other of the source and the drain of the transistor 928 is electrically connected to the terminal 916, and a gate of the transistor 928 is electrically connected to the node 961. One of a source and a drain of the transistor 929 is electrically connected to the terminal 916, the other of the source and the drain of the transistor 929 is electrically connected to the wiring 946, and a gate of the transistor 929 is electrically connected to the node 962. One of a source and a drain of the transistor 931 is electrically connected to the node 962, the other of the source and the drain of the transistor 931 is electrically connected to the wiring 946, and a gate of the transistor 931 is electrically connected to the terminal 913. One of a source and a drain of the transistor 932 is electrically connected to the node 963, the other of the source and the drain of the transistor 932 is electrically connected to the node 961, and a gate of the transistor 932 is electrically connected to the wiring 941. One electrode of the capacitor 933 is electrically connected to the node 962, and the other electrode of the capacitor 933 is electrically connected to the wiring 946.

<Operation of Shift Register 900>

Figure 15:
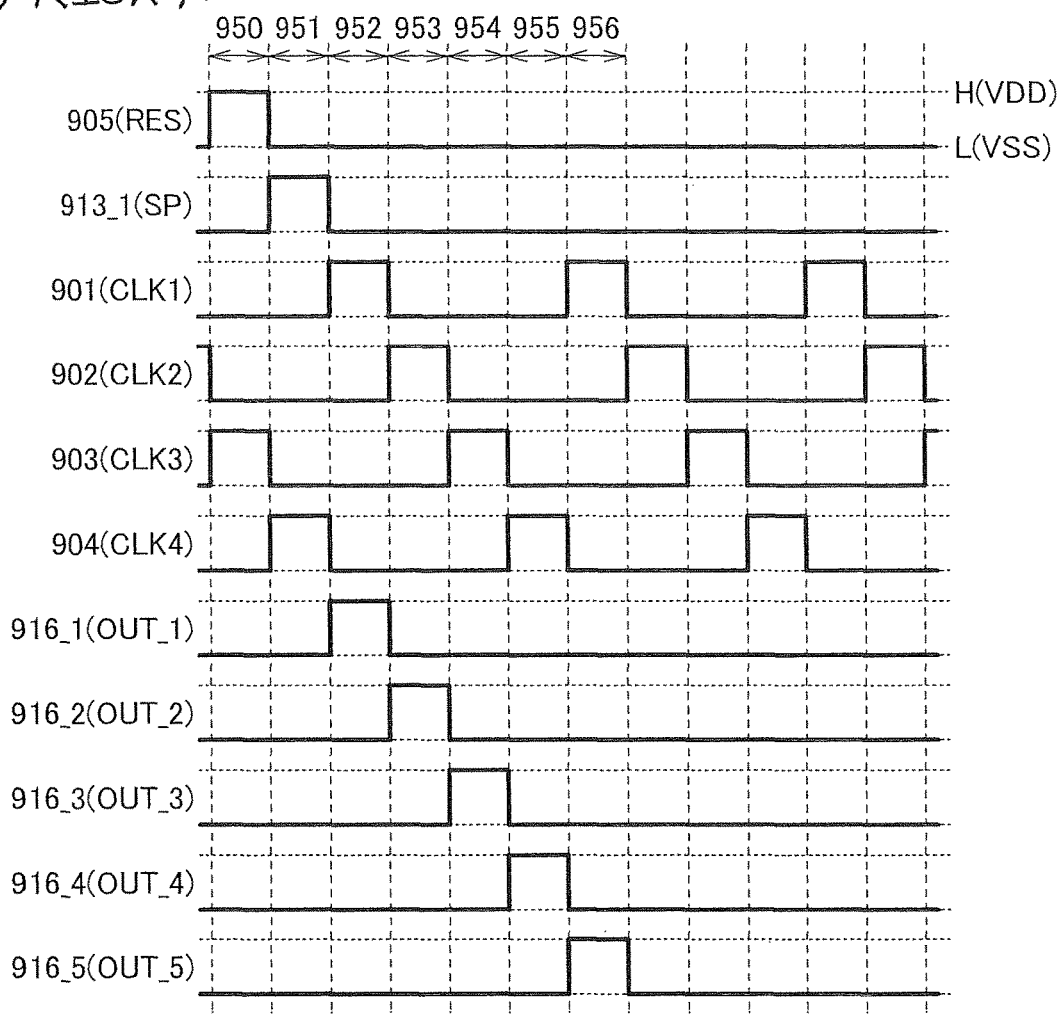
FIG. 15 is a timing chart showing operation of a shift register.

Next, operation of the shift register 900 illustrated in FIG. 14A is described with reference to FIG. 15. FIG. 15 is a timing chart showing the operation of the shift register 900 and shows sequential output of the output signal OUT at the H potential to the terminals 916_1 to 916_5 from the operation start of the shift register 900.

First, the reset signal RES is supplied to the wiring 905 (period 950). Next, the start signal SP is supplied to the terminal 913_1 of the pulse output circuit 910_1 (period 951). Next, the H potential is output from the terminals 915_1 and 916_1 in synchronization with the clock signal CLK1 (period 952). The potential supplied to the terminal 915 is the same as the potential supplied to the terminal 916; therefore, the potential change in the terminal 915 is not shown in FIG. 15. The output of the terminal 915_1 is input to the terminal 913_2. Next, the H potential is output from the terminal 916_2 in synchronization with the clock signal CLK2 (period 953). The output of the terminal 9152 is input to the terminal 913_3. Next, the H potential is output from the terminal 916_3 in synchronization with the clock signal CLK3. The output of the terminal 915_3 is input to the terminal 913_4 (period 954). Next, the H potential is output from the terminal 916_4 in synchronization with the clock signal CLK4. The output of the terminal 915_4 is input to the terminal 913_5 (period 955). Next, the H potential is output from the terminal 916_5 in synchronization with the clock signal CLK1. The output of the terminal 915_5 is input to the terminal 913_6 (period 956). In this manner, the H potential is sequentially output from the terminals 916 in the first to n-th stages.

[Operation of Pulse Output Circuit 910]

Figure 16:
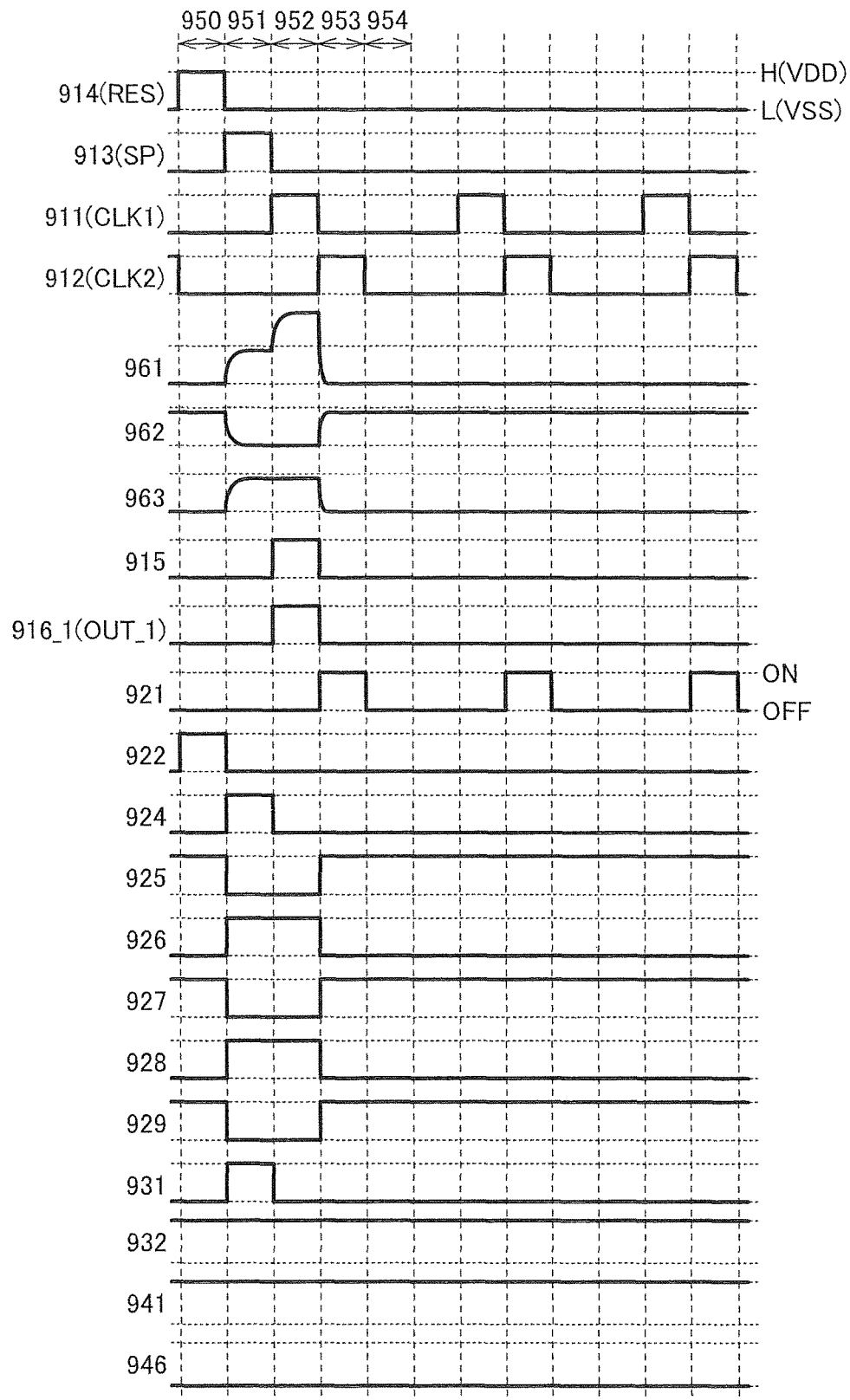
FIG. 16 is a timing chart showing operation of a pulse output circuit.
Figure 17A:
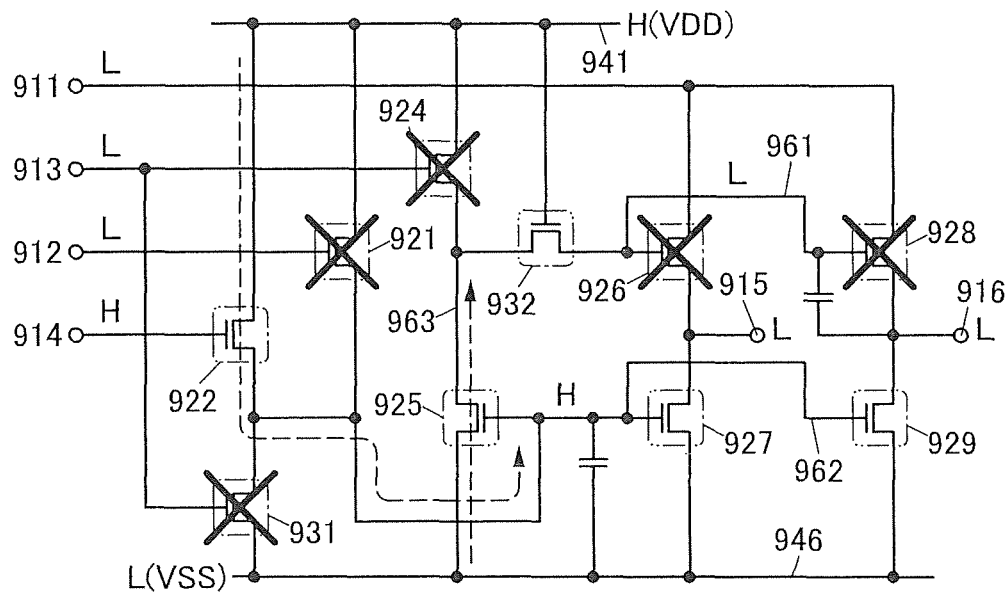
FIGS. 17A and 17B are circuit diagrams illustrating operation of a pulse output circuit.
Figure 17B:
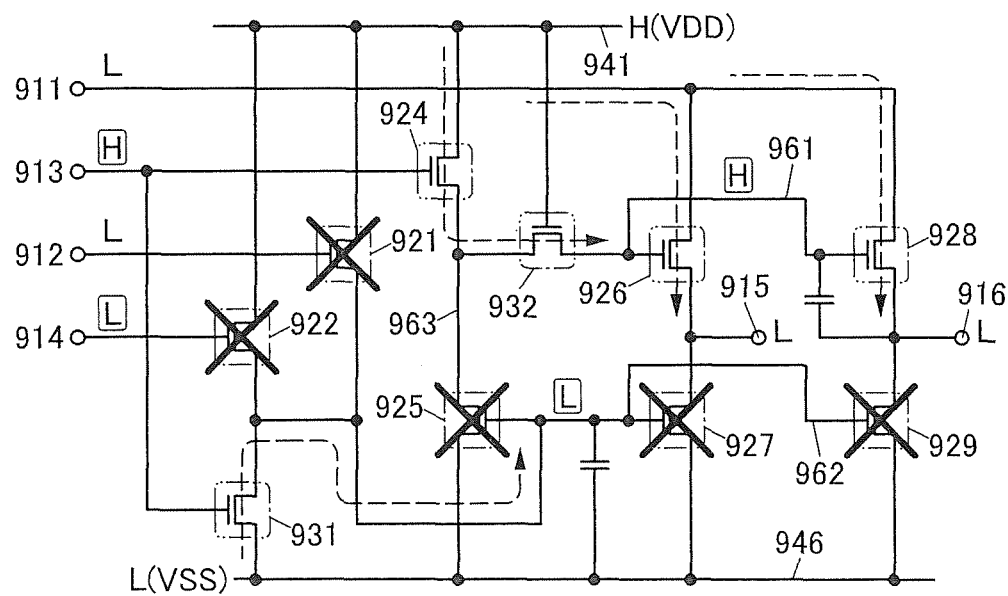
Figure 18A:
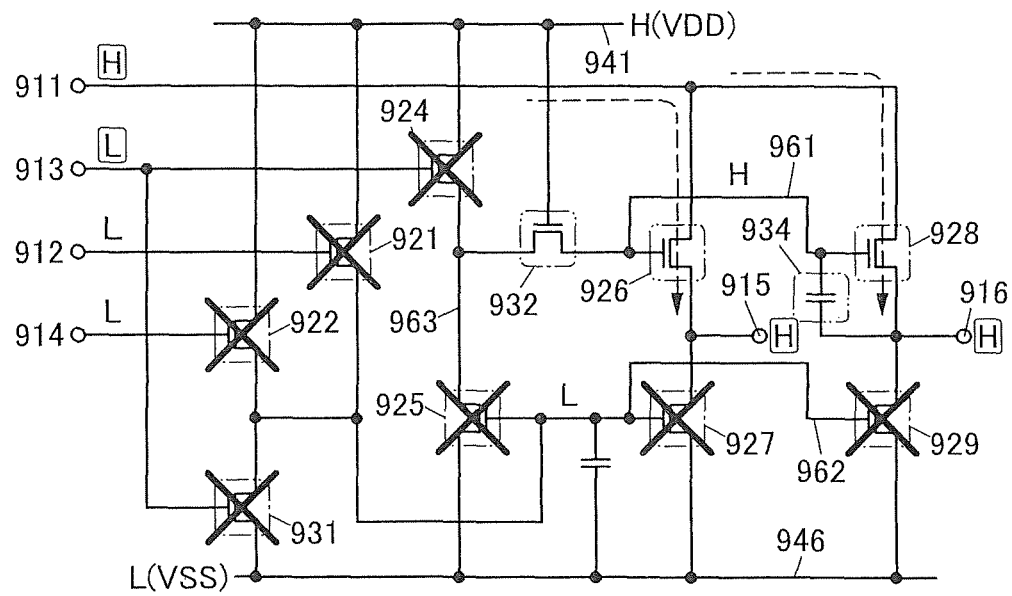
FIGS. 18A and 18B are circuit diagrams illustrating operation of a pulse output circuit.
Figure 18B:
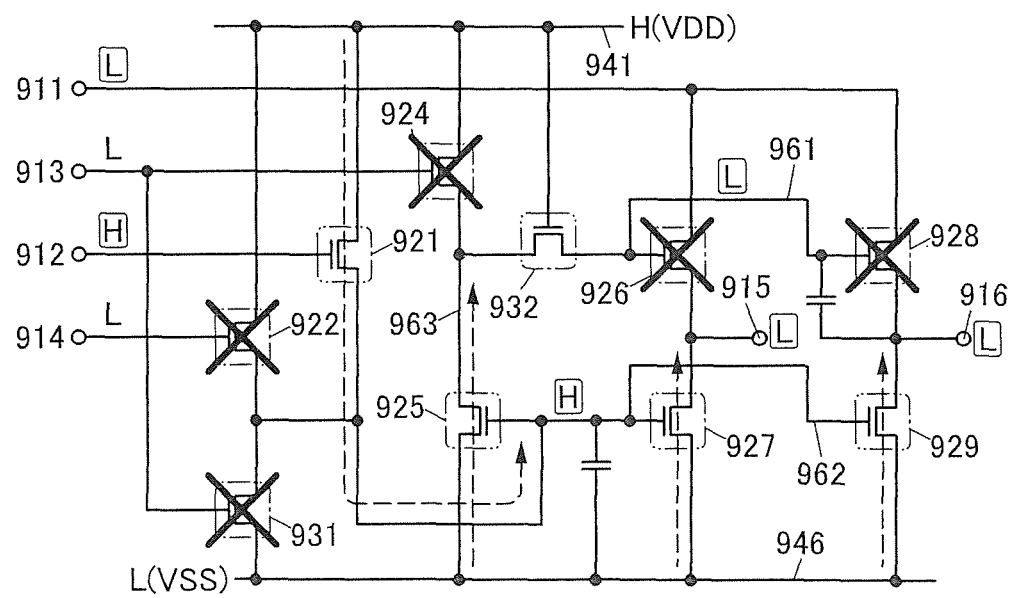
Figure 19:
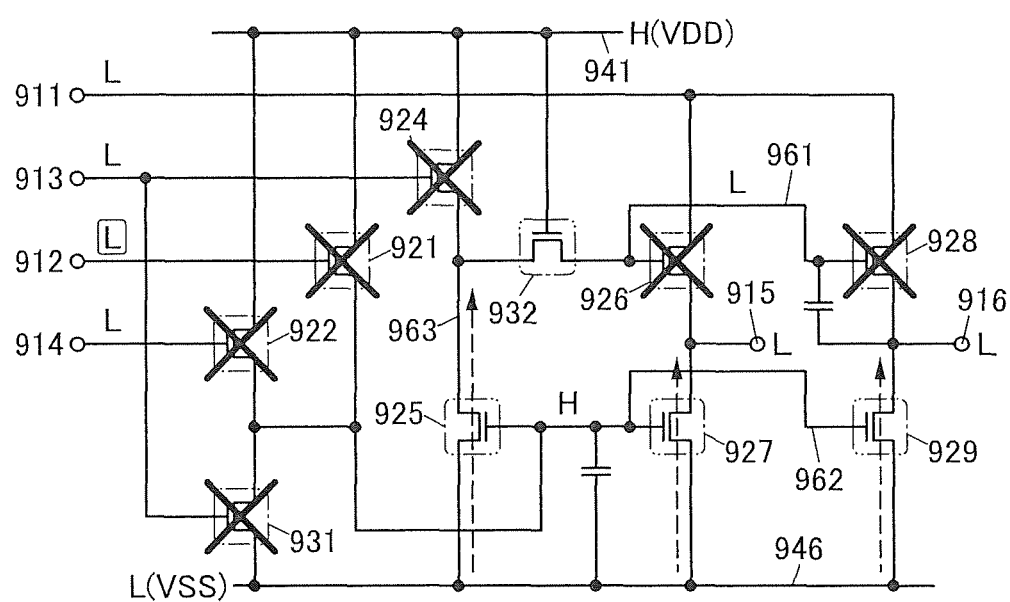
FIG. 19 is a circuit diagram illustrating operation of a pulse output circuit.

Next, the operation of the pulse output circuit 910 included in the shift register 900 will be described with reference to FIG. 16, FIGS. 17A and 17B, FIGS. 18A and 18B, and FIG. 19. FIG. 16 is a timing chart showing the operation of the pulse output circuit 910_1 in the first stage. FIGS. 17A and 17B, FIGS. 18A and 18B, and FIG. 19 are circuit diagrams showing the operation of the pulse output circuit 910_1.

FIG. 16 shows potential changes in the terminals 911 to 916 and the nodes 961 to 963. FIG. 16 further shows the on/off states of the transistor 921, the transistor 922, the transistors 924 to 929, the transistor 931, and the transistor 932. During the operation of the shift register 900, the wirings 941 and 946 are supplied with the H potential and the L potential, respectively.

[Period 950 (See FIG. 17A)]

Each node in the circuit is in a floating state before power is supplied to the shift register. After power is supplied to the shift register, the output signal OUT is irregularly output from the pulse output circuit 910 depending on the state of each node in some cases. The shift register can be normally operated by supplying the reset signal RES immediately after the power is supplied, for example.

The reset signal RES is supplied to the terminals 914 of all of the pulse output circuits 910. Then, the transistors 922 of all of the pulse output circuits 910 are turned OD, so that the H potential (accurately, H potential−$V_{th}$) is supplied to all of the nodes 962. The transistors 925 included in all of the pulse output circuits 910 are turned on, so that the L potential is supplied to all of the nodes 961. Thus, all of the output signals OUT become the L potentials.

[Period 951 (see FIG. 17B)]

The start signal SP is supplied to the terminal 913, so that the transistors 924 and 931 are turned on. When the transistor 924 is turned on, the potentials of the nodes 961 and 963 of the pulse output circuit 910_1 become the H potentials (accurately, H potential−$V_{th}$), so that the transistors 926 and 928 in the pulse output circuit 910_1 are turned on. Since the L potential is supplied to the terminal 911_1, the outputs of the terminals 915_1 and 916_1 remain at the L potentials. When the transistor 931 is turned on, the potential of the node 962 becomes the L potential. Note that the terminals 913_i in the subsequent stages are supplied with the output signals of the terminals 915_i−1 in the preceding stages.

[Period 952 (see FIG. 18A)]

The L potential is supplied to the terminal 913, and the H potential (clock signal CLK1) is supplied to the terminal 911. When the L potential is supplied to the terminal 913, the transistor 924 is turned off, so that the node 961 becomes a floating state. When the H potential is supplied to the terminal 911, the potential of the terminal 916 is increased. Since the node 961 and the terminal 916 are connected to each other via the capacitor 934, the potential of the node 961 is raised to 2×VDD−$V_{th}$ at the maximum by the bootstrap operation. Thus, the H potential is output from the terminals 915 and 916. Since the node 963 is electrically connected to the node 961 via the transistor 932, the potential of the node 963 remains at the H potential (accurately, H potential−$V_{th}$). The output of the terminal 915 is input to the terminal 913 of the pulse output circuit 910 in the subsequent stage.

In this specification and the like, a period from supply of the H potential to the terminal 913_i to output of the H potential from the terminal 915_i and/or the terminal 916_i is referred to as a "selection period" of the pulse output circuit 910_i. For example, the periods 951 and 952 are collectively referred to as a selection period of the pulse output circuit 910_1. The periods 952 and 953 are collectively referred to as a selection period of the pulse output circuit 910_2. In this specification and the like, a period other than the selection period is referred to as a "non-selection period".

[Period 953 (see FIG. 18B)]

The L potential is supplied to the terminal 911 and the H potential (clock signal CLK2) is supplied to the terminal 912. When the H potential is supplied to the terminal 912, the transistor 921 is turned on, so that the potential of the node 962 becomes the H potential (accurately, H potential−$V_{th}$). Then, the transistor 925 is turned on, so that the node 961 is set at the L potential. The transistor 927 is turned on, so that the L potential is output from the terminal 915. The transistor 929 is turned on, so that the L potential is output from the terminal 916.

[Period 954 (See FIG. 19)]

The L potential is supplied to the terminal 912, so that the transistor 921 is turned off. In the pulse output circuit 910_1, the L potential is output from the terminals 915 and 916 until the H potential is supplied to the terminal 913 next, even if the H potential is supplied to the terminal 911.

By repeatedly performing the above operation in every pulse output circuit 910, the output signal OUT at the H level can be sequentially output from the terminals 916 in the first to n-th stages.

In all of the pulse output circuits 910, the potentials of the sources and the drains of the transistors 925, 927, 929, and 932 are the L potentials and the potentials of the gates thereof are the H potentials until the H potential is supplied to the terminal 913 after the output signal OUT is output. Thus, the transistors 925, 927, 929, and 932 are each set in a state where positive stress is applied to the gate during the non-selection period.

Since positive stress is applied to the gates of the transistors 925, 927, 929, and 932 in most of the operation period of the shift register as described above, the transistor characteristics might degrade, hence decreasing the reliability.

<Shift Register of One Embodiment of Present Invention>

Next, examples of configurations and operation of a shift register of one embodiment of the present invention will be described with reference to FIGS. 1A to 1C, FIGS. 2A and 2B, FIGS. 3A and 3B, FIGS. 4A and 4B, FIGS. 5A to 5D, FIGS. 6A to 6C, FIG. 7, and FIG. 8.

<Configuration of Shift Register 100>

A shift register 100 illustrated in FIG. 1A includes n pulse output circuits 110. In this specification and the like, the pulse output circuit 110 in a first stage and the pulse output circuit 110 in an n-th stage are referred to as a pulse output circuit 110_1 and a pulse output circuit 110_n, respectively, in some cases. Furthermore, the pulse output circuit 110 in an i-th stage is referred to as a pulse output circuit 110_i in some cases. A terminal, an output signal OUT, and the like of the pulse output circuit 110 are referred in a manner similar to the above in some cases. For example, an output signal OUT of the pulse output circuit 110_i is referred to as an output signal OUT_i in some cases.

The shift register 100 includes wirings 101 to 104 through which clock signals are supplied, a wiring 105 through which the reset signal RES is supplied, a wiring 106 through which a signal DTY1 is supplied, a wiring 107 through which a signal DTY2 is supplied, a wiring 108 through which a signal DTY3 is supplied, and a wiring 109 through which a signal DTY4 is supplied. The wirings 101 to 104 are supplied with the first to fourth clock signals CLK1 to CLK4, respectively.

The pulse output circuits 110 each include terminals 111 to 118 (see FIG. 1B). The terminals 111 and 112 are each electrically connected to one of the wirings 101 to 104. For example, in FIG. 1A, the terminals 111 and 112 of the pulse output circuit 110_1 in the first stage are electrically connected to the wirings 101 and 102, respectively. The terminals 111 and 112 of the pulse output circuit 110_2 in the second stage are electrically connected to the wirings 102 and 103, respectively. The terminals 114 are electrically connected to the wiring 105.

The start signal SP is supplied to the terminal 113 of the pulse output circuit 110_1 in the first stage and the output signal OUT_1 is output from the terminal 116 thereof. The terminal 113 of the pulse output circuit 110_i in the i-th stage is electrically connected to the terminal 115 of the pulse output circuit 110_i−1 in an i−1-th stage. The terminal 115 of the pulse output circuit 110_i in the i-th stage is electrically connected to the terminal 113 of the pulse output circuit 110_i+1 in an i+1-th stage. The output signal OUT_i is output from the terminal 116 of the pulse output circuit 110_i in the i-th stage. The output signal OUT_n is output from the terminal 116 of the pulse output circuit 110_n in the n-th stage.

Note that the pulse output circuit 110_n in the n-th stage does not necessarily include the terminal 115. When the pulse output circuit 110_n includes the terminal 115, the terminal 115 (terminal 115_n) may be electrically connected to the terminal 113_1 of the pulse output circuit 110_1 in the first stage (see FIG. 1C).

In the pulse output circuit 110_1 in the first stage to the pulse output circuit 110_k−1 in the k−1-th stage (k is a natural number of greater than or equal to 1 and less than or equal to n), the terminals 117 and 118 are electrically connected to the wirings 106 and 107, respectively. In the pulse output circuit 110_k in the k-th stage to the pulse output circuit 110_n in the n-th stage, the terminals 117 and 118 are electrically connected to the wirings 108 and 109, respectively.

[Configuration of Pulse Output Circuit 110]

Next, the configuration of the pulse output circuit 110 will be described (see FIG. 2A). The pulse output circuit 110 includes a transistor 121, a transistor 122, transistors 124 to 129, a transistor 131, a transistor 132, a transistor 135, a transistor 136, and a capacitor 134. A transistor including a gate and a back gate is used as each of the transistors 125, 127, 129, and 132.

In general, the back gate is formed using a conductive layer. The gate and the back gate are positioned so that a channel formation region of a semiconductor layer is provided between the gate and the back gate. The back gate can function in a manner similar to that of the gate. The potential of the back gate may be the same as that of the gate or may be a GND potential or a given potential. By changing the potential of the back gate independently of the potential of the gate, the threshold voltage of the transistor can be changed. In this specification and the like, one of the gate and the back gate is referred to as a "first gate", and the other is referred to as a "second gate".

One of a source and a drain of the transistor 121 is electrically connected to a wiring 141, the other of the source and the drain of the transistor 121 is electrically connected to a node 164, and a gate of the transistor 121 is electrically connected to the terminal 112. One of a source and a drain of the transistor 122 is electrically connected to the wiring 141, the other of the source and the drain of the transistor 122 is electrically connected to the node 164, and a gate of the transistor 122 is electrically connected to the terminal 114. One of a source and a drain of the transistor 124 is electrically connected to the wiring 141, the other of the source and the drain of the transistor 124 is electrically connected to a node 163, and a gate of the transistor 124 is electrically connected to the terminal 113. One of a source and a drain of the transistor 125 is electrically connected to the node 163, the other of the source and the drain of the transistor 125 is electrically connected to a wiring 145, a first gate of the transistor 125 is electrically connected to the node 162, and a second gate of the transistor 125 is electrically connected to the terminal 117. One of a source and a drain of the transistor 126 is electrically connected to the terminal 111, the other of the source and the drain of the transistor 126 is electrically connected to the terminal 115, and a gate of the transistor 126 is electrically connected to a node 161. One of a source and a drain of the transistor 127 is electrically connected to the terminal 115, the other of the source and the drain of the transistor 127 is electrically connected to the wiring 145, a first gate of the transistor 127 is electrically connected to the node 162, and a second gate of the transistor 127 is electrically connected to the terminal 117. One of a source and a drain of the transistor 128 is electrically connected to the terminal 111, the other of the source and the drain of the transistor 128 is electrically connected to the terminal 116, and a gate of the transistor 128 is electrically connected to the node 161. One of a source and a drain of the transistor 129 is electrically connected to the terminal 116, the other of the source and the drain of the transistor 129 is electrically connected to the wiring 145, a first gate of the transistor 129 is electrically connected to the node 162, and a second gate of the transistor 129 is electrically connected to the terminal 117. One of a source and a drain of the transistor 131 is electrically connected to the node 164, the other of the source and the drain of the transistor 131 is electrically connected to the wiring 145, and a gate of the transistor 131 is electrically connected to the terminal 113. One of a source and a drain of the transistor 132 is electrically connected to the node 163, the other of the source and the drain of the transistor 132 is electrically connected to the node 161, a first gate of the transistor 132 is electrically connected to the terminal 118, and a second gate of the transistor 132 is electrically connected to the terminal 117. One of a source and a drain of the transistor 135 is electrically connected to the node 164, the other of the source and the drain of the transistor 135 is electrically connected to the node 162, and a gate of the transistor 135 is electrically connected to the terminal 118. One of a source and a drain of the transistor 136 is electrically connected to the node 162, the other of the source and the drain of the transistor 136 is electrically connected to the wiring 145, and a gate of the transistor 136 is electrically connected to the terminal 117. One electrode of the capacitor 134 is electrically connected to the node 161, and the other electrode of the capacitor 134 is electrically connected to the terminal 116.

The pulse output circuit 110 of one embodiment of the present invention can be formed using transistors having the same conductivity type. Thus, a pulse output circuit can be provided with high productivity. A semiconductor device can be provided with high productivity. Although the pulse output circuit 110 is formed using n-channel transistors in this embodiment, they can be replaced with p-channel transistors.

Modification Example 1

Figure 2B:
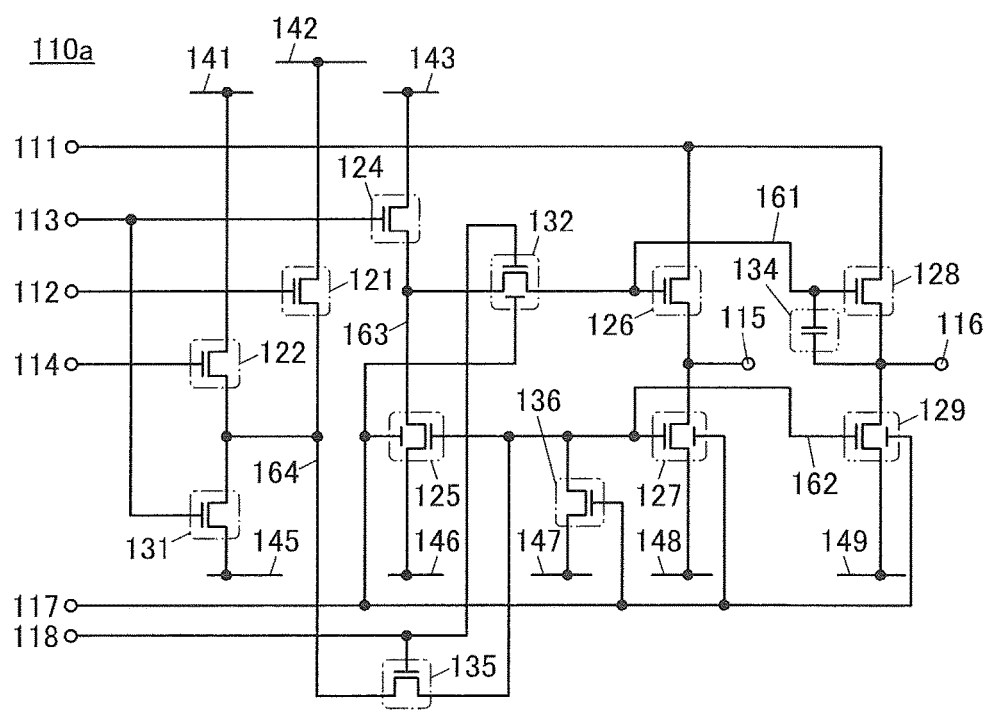

As in a pulse output circuit 110a illustrated in the circuit diagram of FIG. 2B, one of the source and the drain of the transistor 121 may be electrically connected to a wiring 142 and one of the source and the drain of the transistor 124 may be electrically connected to a wiring 143. The other of the source and the drain of the transistor 125 may be electrically connected to a wiring 146, the other of the source and the drain of the transistor 136 may be electrically connected to a wiring 147, the other of the source and the drain of the transistor 127 may be electrically connected to a wiring 148, and the other of the source and the drain of the transistor 129 may be electrically connected to a wiring 149.

The wirings 141 to 143 may be supplied with the same potential or different potentials. The wirings 145 to 149 may be supplied with the same potential or different potentials.

Modification Example 2

Figure 3A:
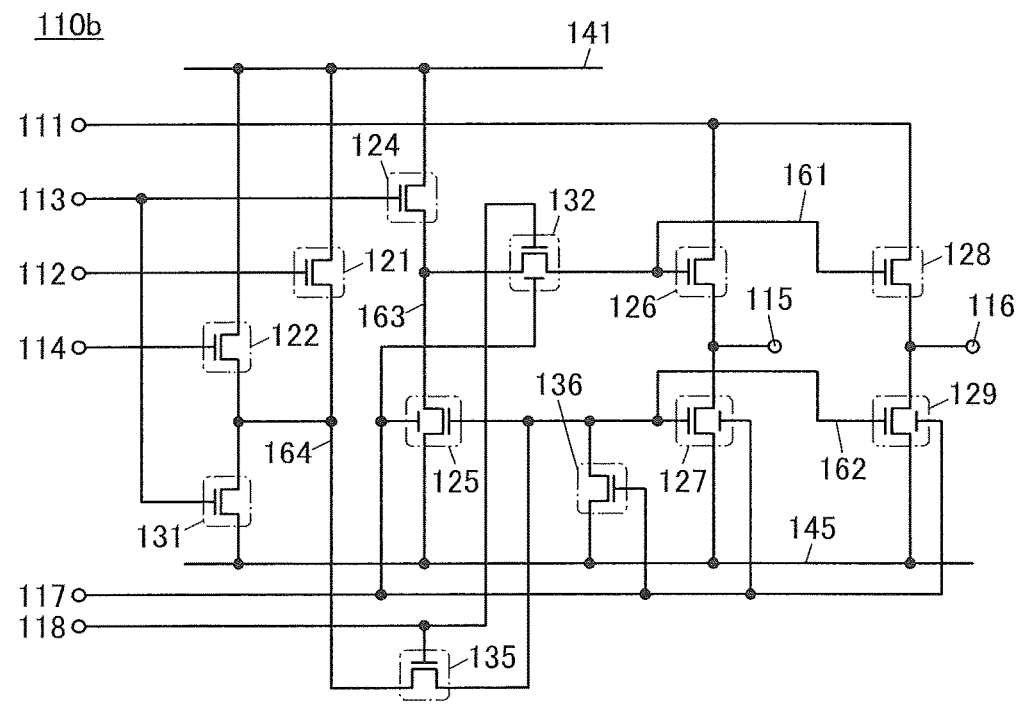
FIGS. 3A and 3B each illustrate an example of a pulse output circuit.

In the case where parasitic capacitance between the gate and the source of the transistor 128 is sufficiently high, for example, the case where gate capacitance of the transistor 128 is sufficiently high, the capacitor 134 is not necessarily provided as in a pulse output circuit 110b in the circuit diagram of FIG. 3A.

When the capacitor 134 is not provided, the area occupied by the pulse output circuit can be reduced. Thus, the degree of integration of the pulse output circuit of one embodiment of the present invention can be increased. Accordingly, the degree of integration of the semiconductor device of one embodiment of the present invention can be increased. The productivity of pulse output circuits of one embodiment of the present invention can be increased. Accordingly, the productivity of semiconductor devices of one embodiment of the present invention can be increased.

Modification Example 3

Figure 3B:
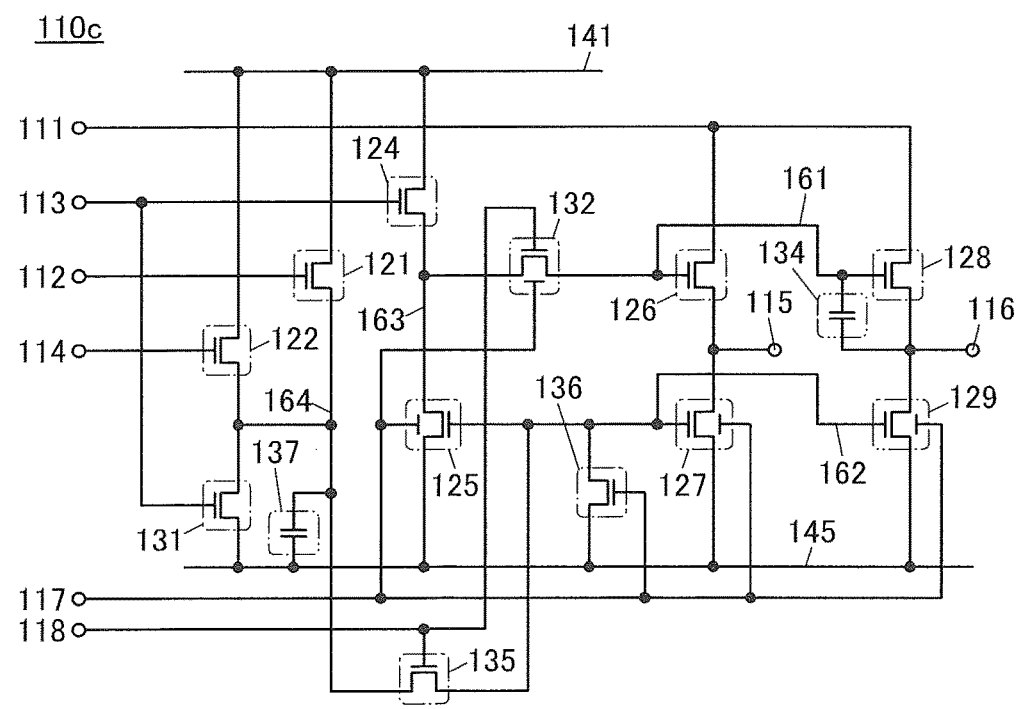

As in a pulse output circuit 110c illustrated in the circuit diagram of FIG. 3B, a capacitor 137 may be provided between the node 164 and the wiring 145. Specifically, one electrode of the capacitor 137 is electrically connected to the node 164, and the other electrode of the capacitor 137 is electrically connected to the wiring 145. Note that the other electrode of the capacitor 137 may be connected to a predetermined wiring through which a predetermined potential is supplied.

By providing the capacitor 137, the potential of the node 164 can be retained stably even when the node 164 is in a floating state. Thus, a pulse output circuit of one embodiment of the present invention can be operated stably. A semiconductor device of one embodiment of the present invention can be operated stably.

Modification Example 4

Figure 4A:
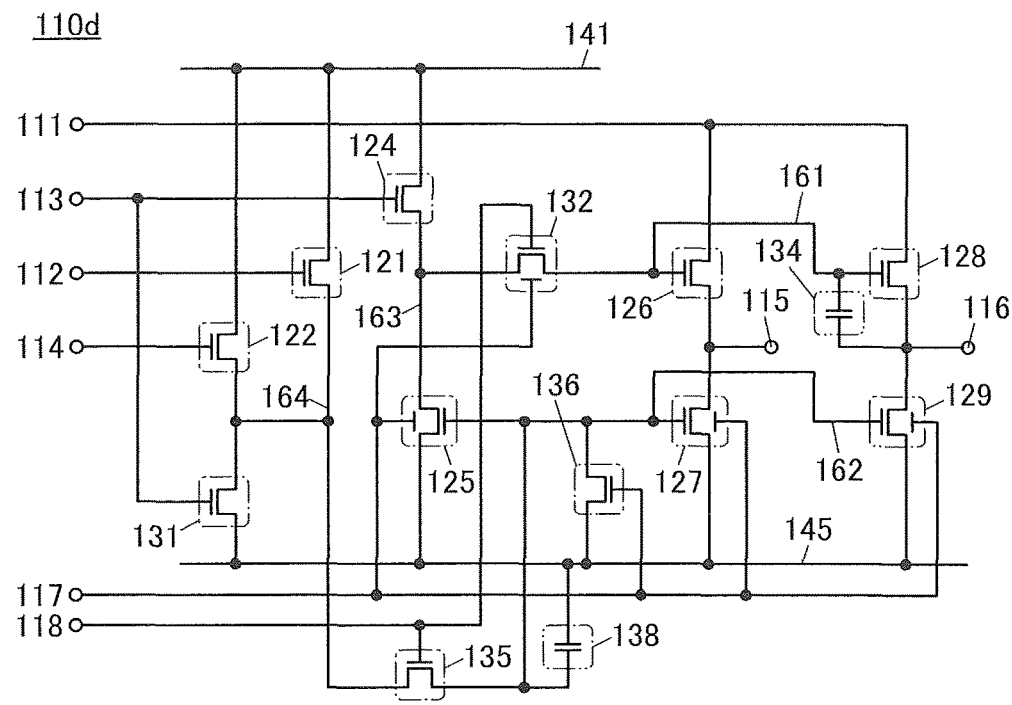
FIGS. 4A and 4B each illustrate an example of a pulse output circuit.

As in a pulse output circuit 110d illustrated in the circuit diagram of FIG. 4A, a capacitor 138 may be provided between the node 162 and the wiring 145. Specifically, one electrode of the capacitor 138 is electrically connected to the node 162 and the other electrode of the capacitor 138 is electrically connected to the wiring 145. Note that the other electrode of the capacitor 138 may be connected to a predetermined wiring through which a predetermined potential is supplied.

By providing the capacitor 138, the potential of the node 162 can be retained stably even when the node 162 is in a floating state. Thus, a pulse output circuit of one embodiment of the present invention can be operated stably. A semiconductor device of one embodiment of the present invention can be operated stably.

Modification Example 5

Figure 4B:
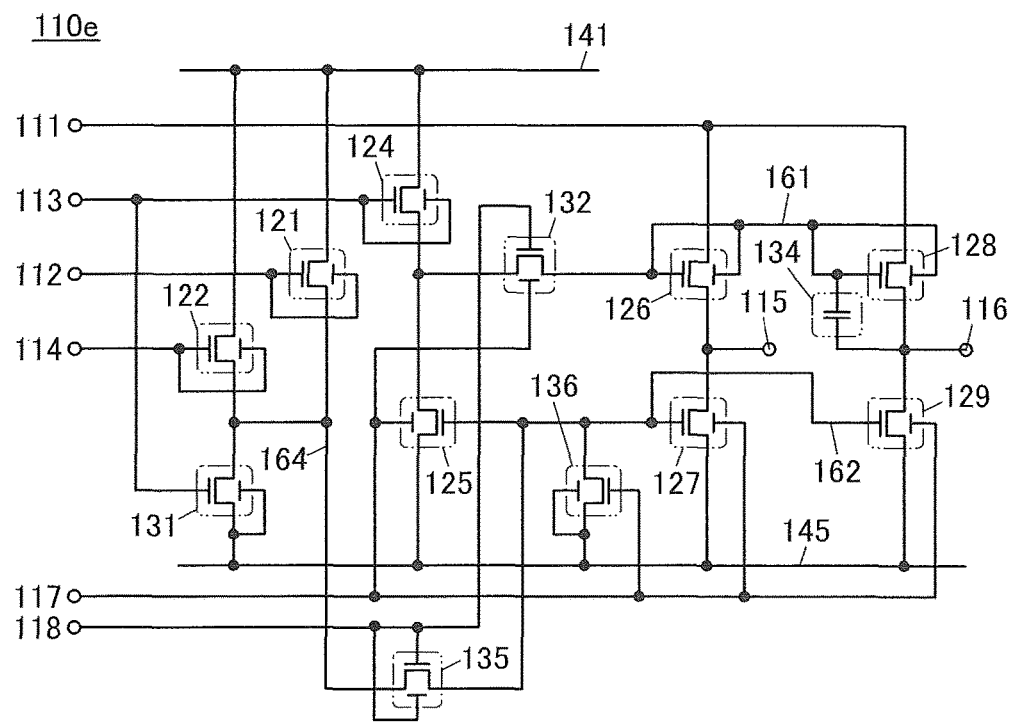

As in a pulse output circuit 110e illustrated in the circuit diagram of FIG. 4B, a transistor including a back gate may be used as each of the transistors 121, 122, 124, 126, 128, 131, 135, and 136.

In the pulse output circuit 110e illustrated in FIG. 4B, a first gate and a second gate of each of the transistors 121, 122, 124, 126, 128, and 135 are electrically connected to each other. Furthermore, one of a first gate and a second gate of the transistor 131 is electrically connected to the terminal 113, and the other of the first gate and the second gate of the transistor 131 is electrically connected to the wiring 145. Note that the first gate and the second gate may be electrically connected to each other instead of connecting the other of the first gate and the second gate of the transistor 131 to the wiring 145. Moreover, one of a first gate and a second gate of the transistor 136 is electrically connected to the terminal 117 and the other of the first gate and the second gate of the transistor 136 is electrically connected to the wiring 145. Note that the other of the first gate and the second gate of the transistor 136 is not necessarily connected to the wiring 145, and the first gate and the second gate may be electrically connected to each other.

The use of a transistor including a back gate enables the area occupied by the pulse output circuit to be reduced; thus, the degree of integration of the pulse output circuit of one embodiment of the present invention can be increased. Accordingly, the degree of integration of the semiconductor device of one embodiment of the present invention can be increased. The productivity of pulse output circuits of one embodiment of the present invention can be increased. Accordingly, the productivity of semiconductor devices of one embodiment of the present invention can be increased. The reliability of the pulse output circuit can be increased. Thus, the reliability of the semiconductor device of one embodiment of the present invention can be increased.

Modification Example 6

Figure 5A:
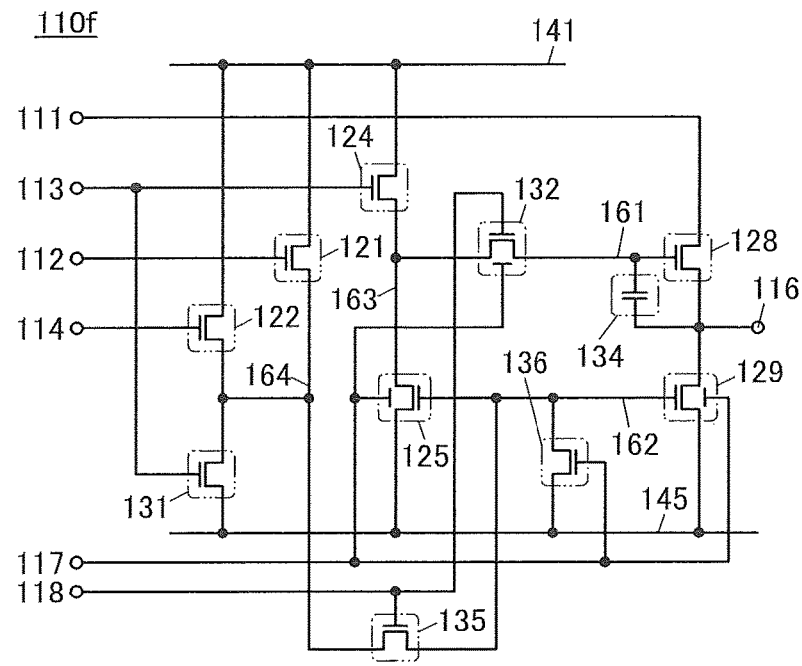
FIGS. 5A and 5B are diagrams showing an example of a shift register and FIGS. 5C and 5D are diagrams showing examples of pulse output circuits.
Figure 5B:
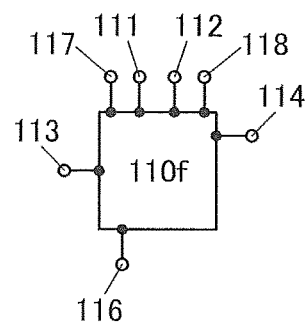
Figure 5C:
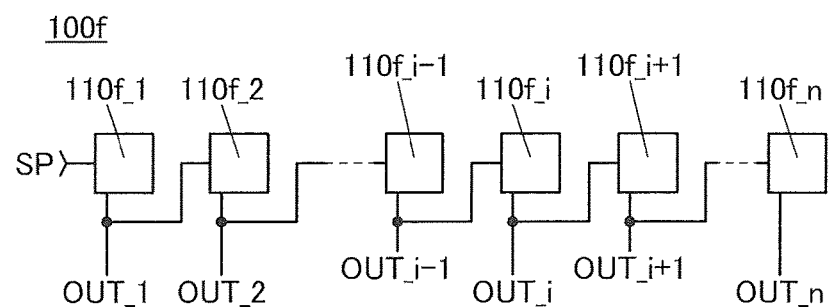
Figure 5D:
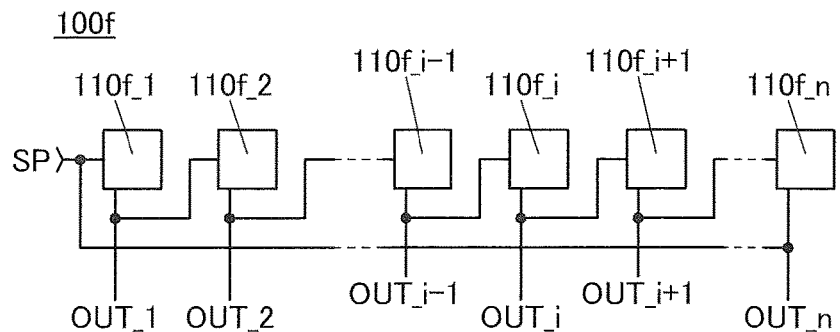

As in a pulse output circuit 110f illustrated in the circuit diagram of FIG. 5A, the transistor 126, the transistor 127, and the terminal 115 are not necessarily provided. FIG. 5B is a block diagram of the pulse output circuit 110f. FIG. 5C is a block diagram of the shift register 100f including the pulse output circuit 110f. As illustrated in FIG. 5D, the terminal 116 (terminal 116_n) in the n-th stage may be electrically connected to the terminal 113 (terminal 113_1) in the first stage.

Since the pulse output circuit 110f does not include the terminal 115, in the shift register 100f, the potential output to the terminal 116 of the pulse output circuit 110f in the i−1-th stage is input to the terminal 113 of the pulse output circuit 110f in the i-th stage. The potential output to the terminal 116 of the pulse output circuit 110f in the i-th stage is input to the terminal 113 of the pulse output circuit 110f in the i+1-th stage.

When the transistor 126, the transistor 127, and the terminal 115 are not provided, the area occupied by the pulse output circuit can be reduced; thus, the degree of integration of the pulse output circuit of one embodiment of the present invention can be increased. The productivity of pulse output circuits of one embodiment of the present invention can be increased. Accordingly, the degree of integration of the semiconductor device of one embodiment of the present invention can be increased. The productivity of semiconductor devices of one embodiment of the present invention can be increased.

Modification Example 7

As illustrated in a pulse output circuit 110g in the circuit diagram of FIG. 6A, a transistor 123 and a terminal 119 may be provided in the pulse output circuit 110. In the pulse output circuit 110g, one of a source and a drain of the transistor 123 is electrically connected to the wiring 141, the other of the source and the drain of the transistor 123 is electrically connected to the node 164, and a gate of the transistor 123 is electrically connected to the terminal 119. FIG. 6B1 is a block diagram of the pulse output circuit 110g. FIG. 6C is a block diagram of the shift register 100g including the pulse output circuit 110g.

In the shift register 100g, the terminal 115 of the pulse output circuit 110g in an i-th stage is electrically connected to the terminal 119 of the pulse output circuit 110g in an i−1-th stage. The terminal 115 of the pulse output circuit 110g in the n-th stage is electrically connected to the terminal 119 of the pulse output circuit 110g in the n−1-th stage.

In a stage which is next to the pulse output circuit 110g in the n-th stage, a pulse output circuit 110g_D is provided, and the terminal 115 of the pulse output circuit 110g_D is electrically connected to the terminal 119 (terminal 119_n) of the pulse output circuit 110g in the n-th stage. FIG. 6B2 is a block diagram of the pulse output circuit 110g_D. The pulse output circuit 110g_D is a dummy circuit for supplying a signal to the terminal 119_n. Therefore, the pulse output circuit 110g_D does not necessarily include the terminal 116 and the terminal 119.

By providing the transistor 123, the electric charge supply capability to the nodes 162 and 164 is increased, and the potentials of the nodes 162 and 164 are more stable. Thus, the semiconductor device of one embodiment of the present invention can be operated at high speed. The reliability of the semiconductor device of one embodiment of the present invention can be increased.

<Operation of Shift Register 100>

Figure 8:
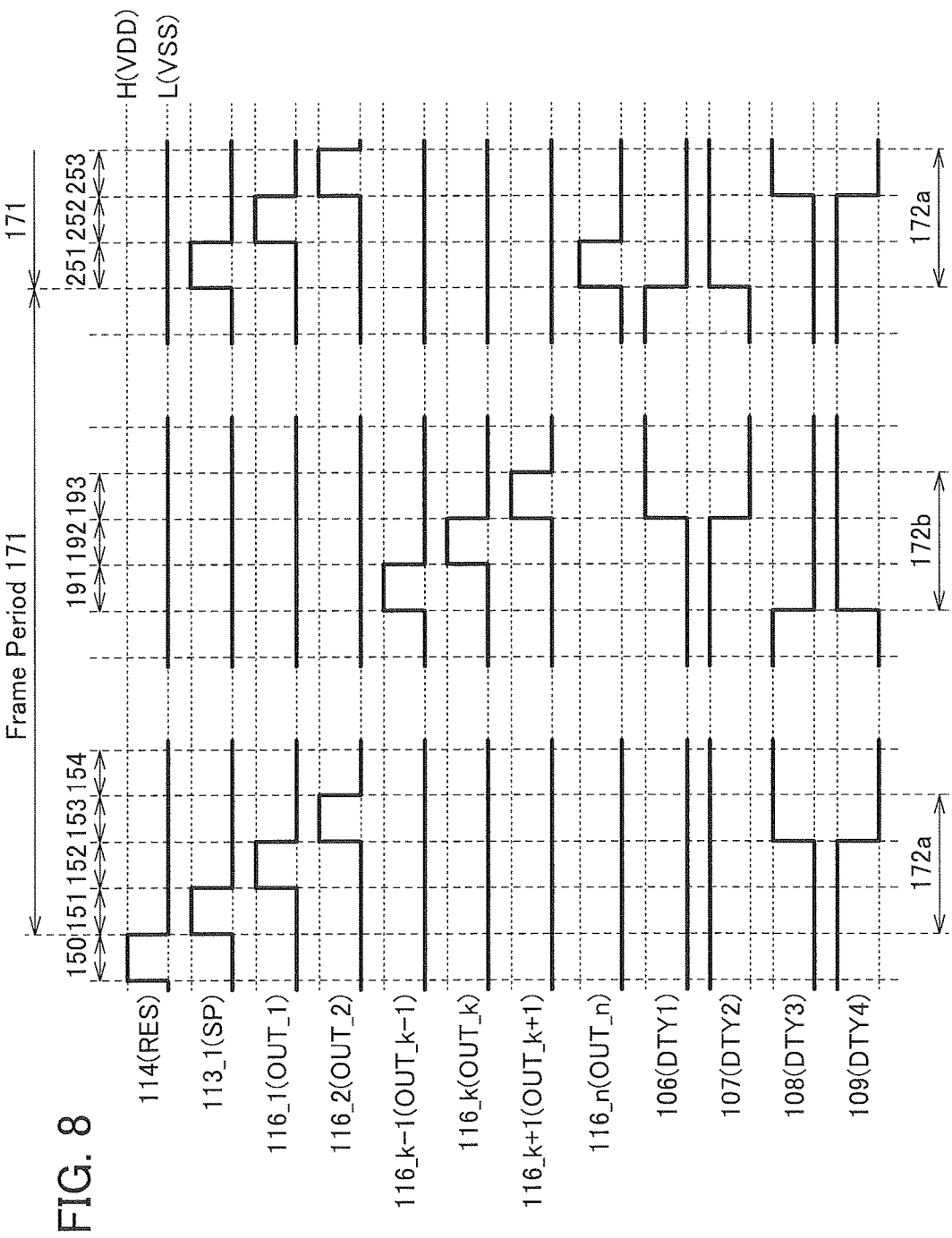
FIG. 8 is a timing chart illustrating operation of a shift register.

Next, operation of the shift register 100 illustrated in FIG. 1A is described with reference to FIG. 7 and FIG. 8. FIG. 7 and FIG. 8 are timing charts showing the operation of the shift register 100 and show sequential output of the output signal OUT at the H potential to the terminals 116_1 to 116_4 from the operation start of the shift register 100.

First, the reset signal RES is supplied to the wiring 105 (period 150). Next, the start signal SP is supplied to the terminal 113_1 of the pulse output circuit 110_1 (period 151). Next, the H potential is output from the terminals 115_1 and 116_1 in synchronization with the clock signal CLK1 (period 152). The potential output from the terminal 115 is the same as the potential output from the terminal 116; therefore, the potential change in the terminal 115 is not shown in FIG. 7. The output of the terminal 115_1 is input to the terminal 113_2. Next, the H potential is output from the terminal 116_2 in synchronization with the clock signal CLK2 (period 153). The output of the terminal 115_2 is input to the terminal 113_3. Next, the H potential is output from the terminal 116_3 in synchronization with the clock signal CLK3. The output of the terminal 115_3 is input to the terminal 113_4 (period 154). Next, the H potential is output from the terminal 116_4 in synchronization with the clock signal CLK4. The output of the terminal 115_4 is input to the terminal 113_5 (period 155). Next, the H potential is output from the terminal 116_5 in synchronization with the clock signal CLK1. The output of the terminal 115_5 is input to the terminal 113_6 (period 156). In this manner, the H potential is sequentially output from the terminals 116 in the first to n-th stages.

After that, when the start signal SP is supplied to the terminal 113_1 again, the operation is repeated. A period from the input of the start signal SP to the next input of the start signal SP is referred to as a frame period 171. As illustrated in FIG. 1C and FIG. 5D, when the terminal 115_n and/or the terminal 116_n are/is electrically connected to the terminal 113_1, the output of the terminal 115_n or the terminal 116_n serves as the start signal SP, and the above operation can be repeated.

In a period 191, the H potential is output from the terminal 116_k−1, the signal DTY3 becomes the L potential, and the signal DTY4 becomes the H potential. In a period 192, the H potential is output from the terminal 116_k. In a period 193, the H potential is output from the terminal 116_k+1, the signal DTY1 becomes the H potential, and the signal DTY2 becomes the L potential. The periods 191 to 193 are collectively referred to as a switching period 172b. As described later, the periods 151 to 153 and the periods 251 to 253 are collectively referred to as switching periods 172a.

When the first frame period 171 is terminated, the start signal SP (H potential) is input to the terminal 113_1, and the second frame period 171 is started. In the second frame period 171, in the period 251, the start signal SP is supplied to the terminal 113_1, the H potential is output from the terminal 116_n, the signal DTY1 becomes the L potential, and the signal DTY2 becomes the H potential. In the period 252, the H potential is output from the terminal 116_1. In the period 253, the H potential is output from the terminal 1162, the signal DTY3 becomes the H potential, and the signal DTY4 becomes the L potential.

When k=1 is satisfied, a k−1-th stage means an n-th stage, and when k=n is satisfied, a k+1-th stage means a first stage. The periods 251 to 253 correspond to the periods 151 to 153. That is, the periods 251 to 253 are also a switching period. Similarly, the periods 151 to 153 are also a switching period. The periods 251 to 253 and the periods 151 to 153 are collectively referred to as switching periods 172a.

[Operation of Pulse Output Circuit 110: Pulse Output Circuit 910_1]

Figure 9:
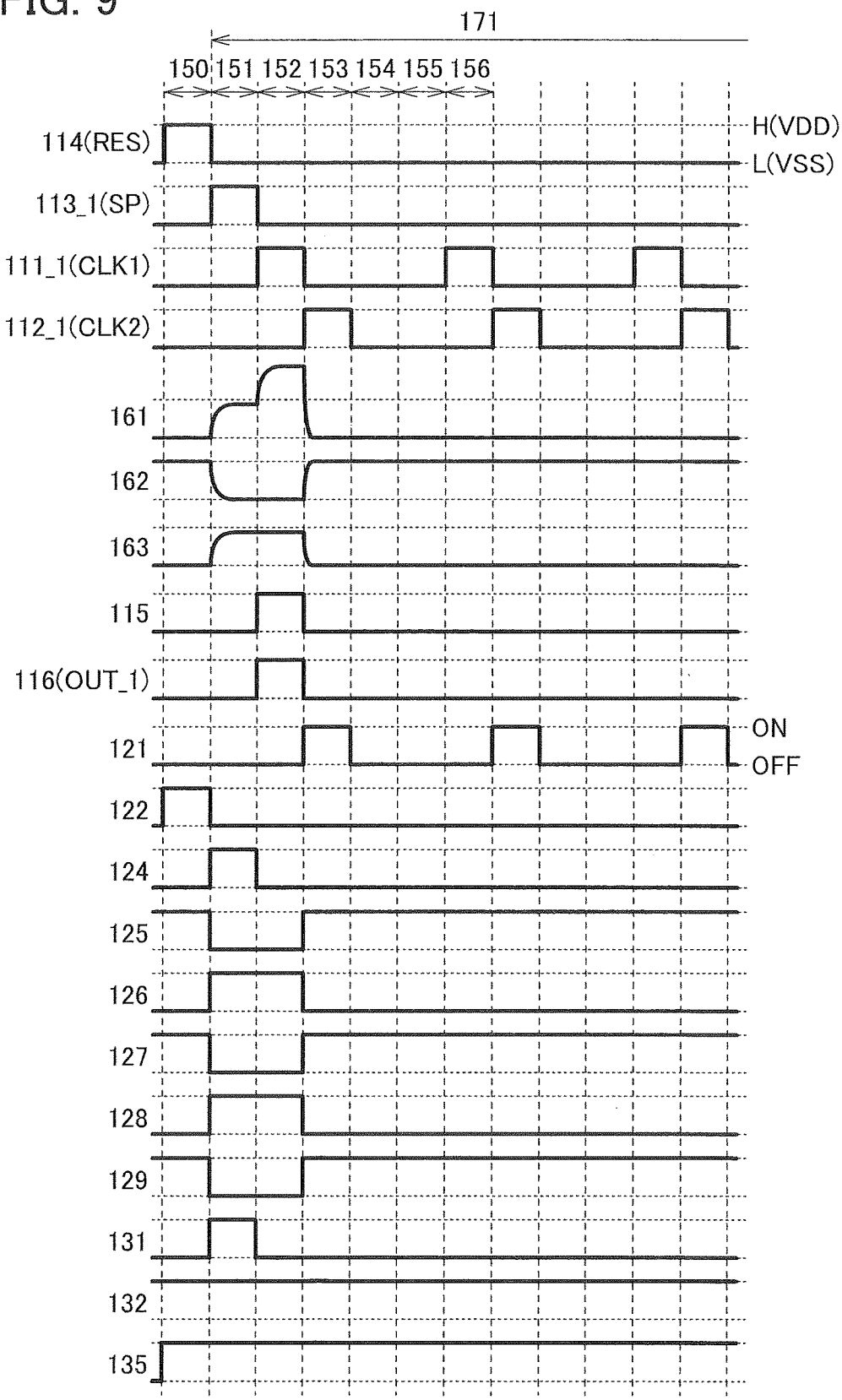
FIG. 9 is a timing chart illustrating operation of a pulse output circuit.
Figure 10A:
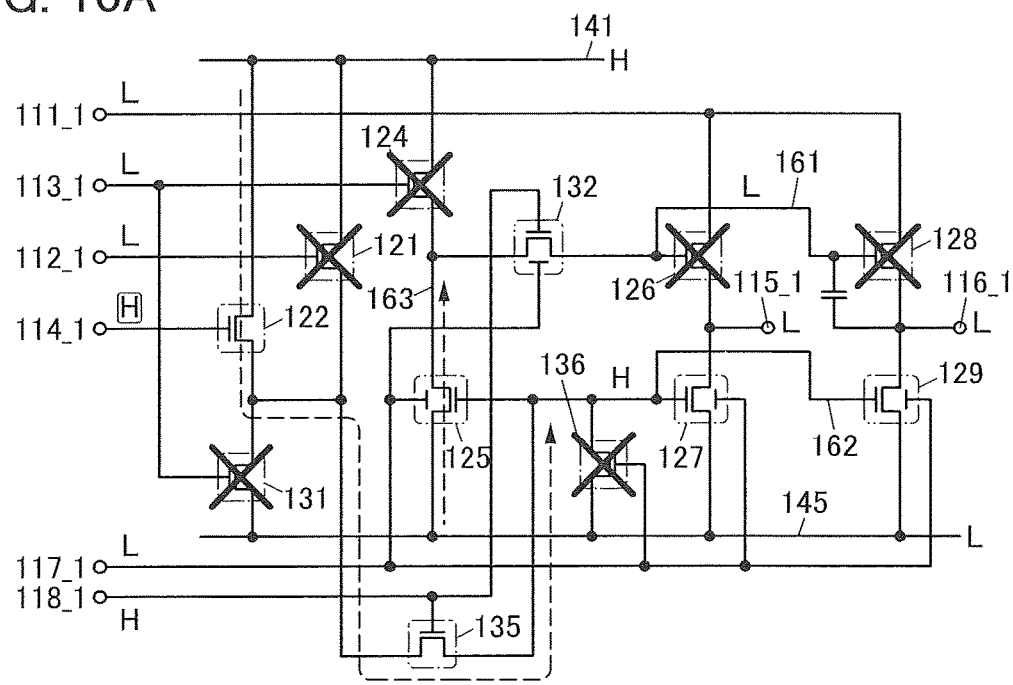
FIGS. 10A and 10B are circuit diagrams illustrating operation of a pulse output circuit.
Figure 10B:
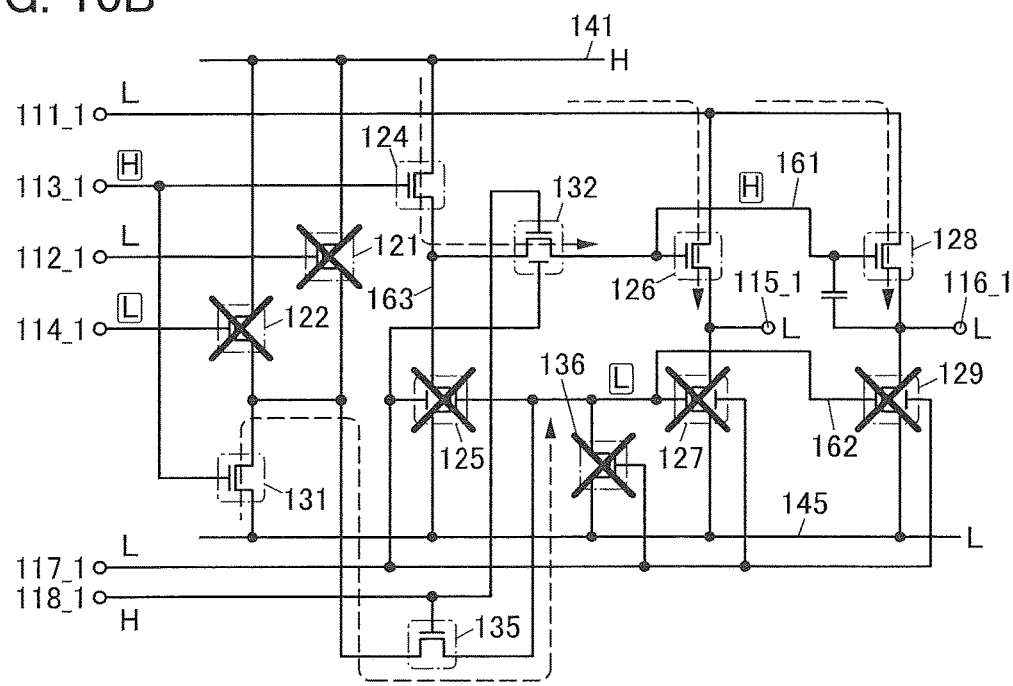
Figure 11A:
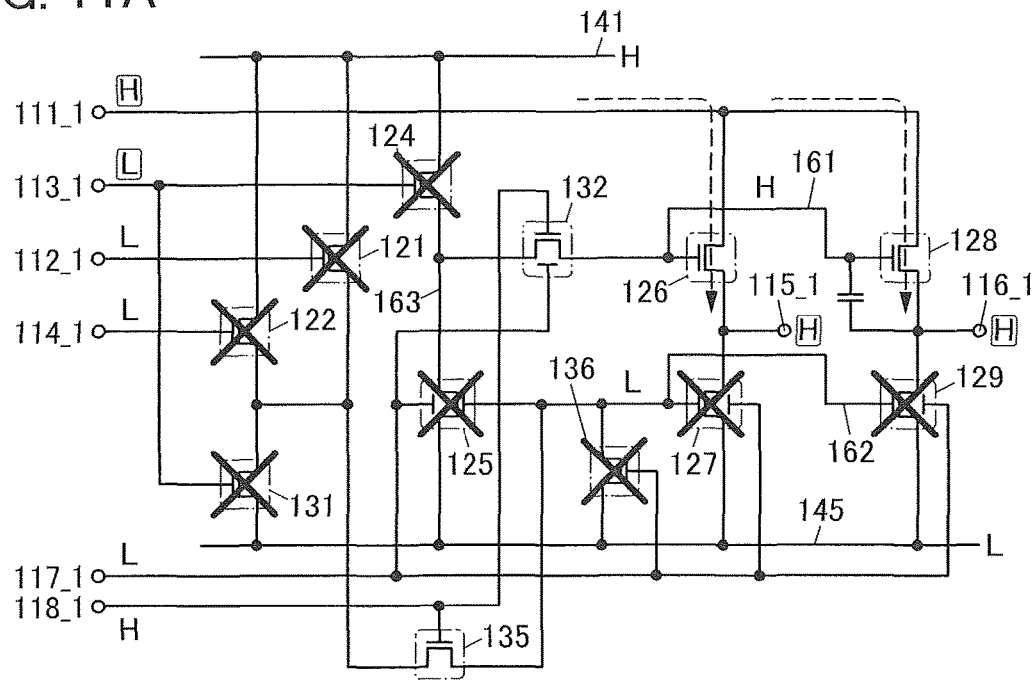
FIGS. 11A and 11B are circuit diagrams illustrating operation of a pulse output circuit.
Figure 11B:
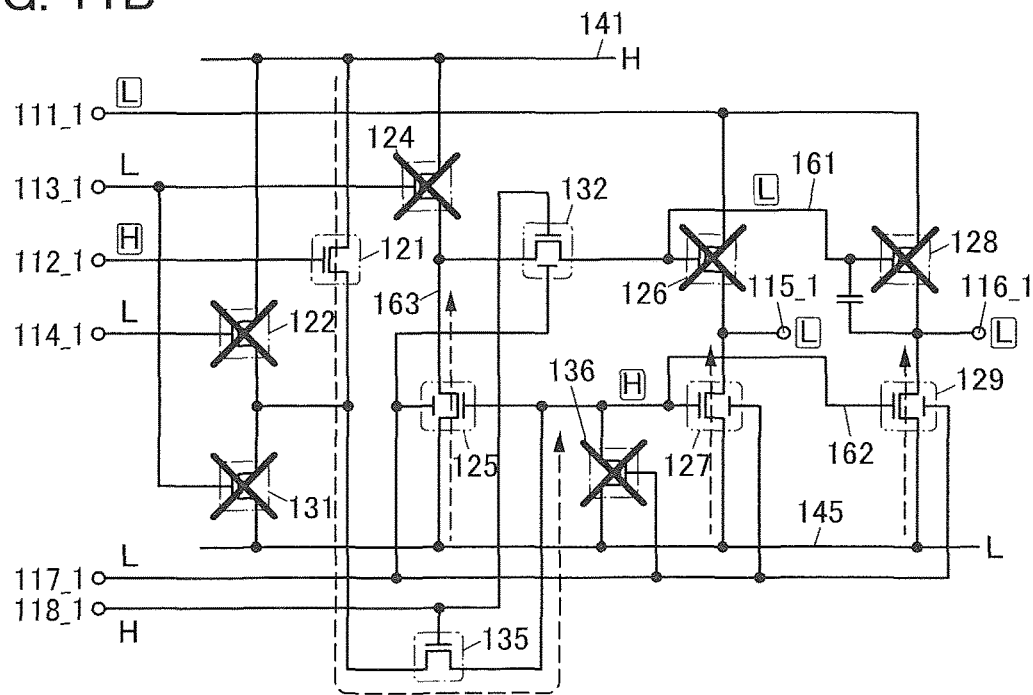
Figure 12A:
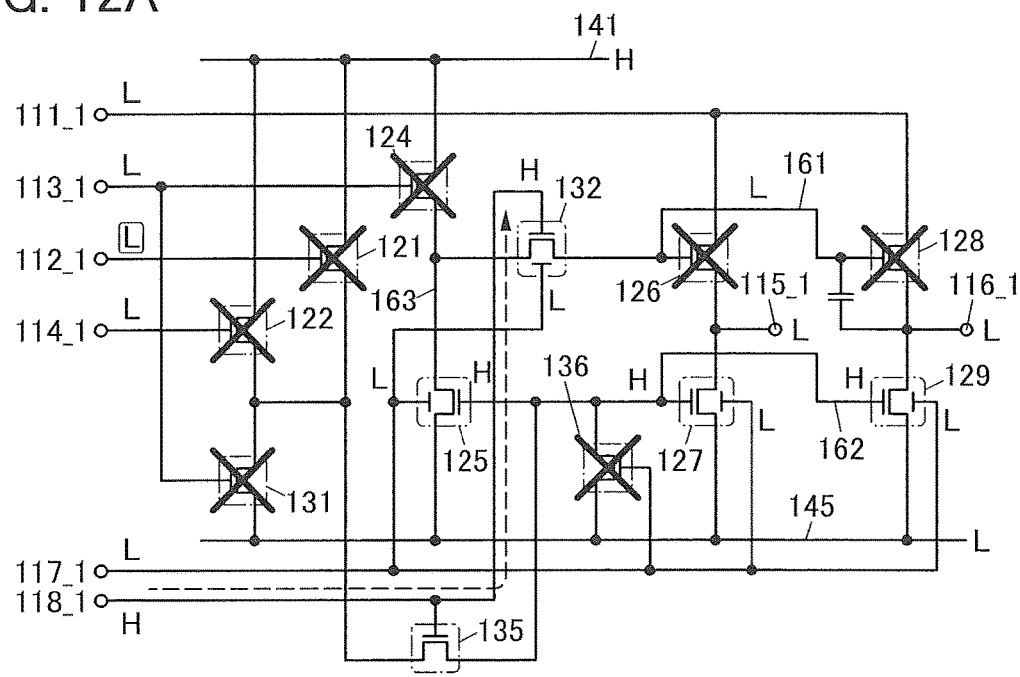
FIGS. 12A and 12B are circuit diagrams illustrating operation of a pulse output circuit.
Figure 12B:
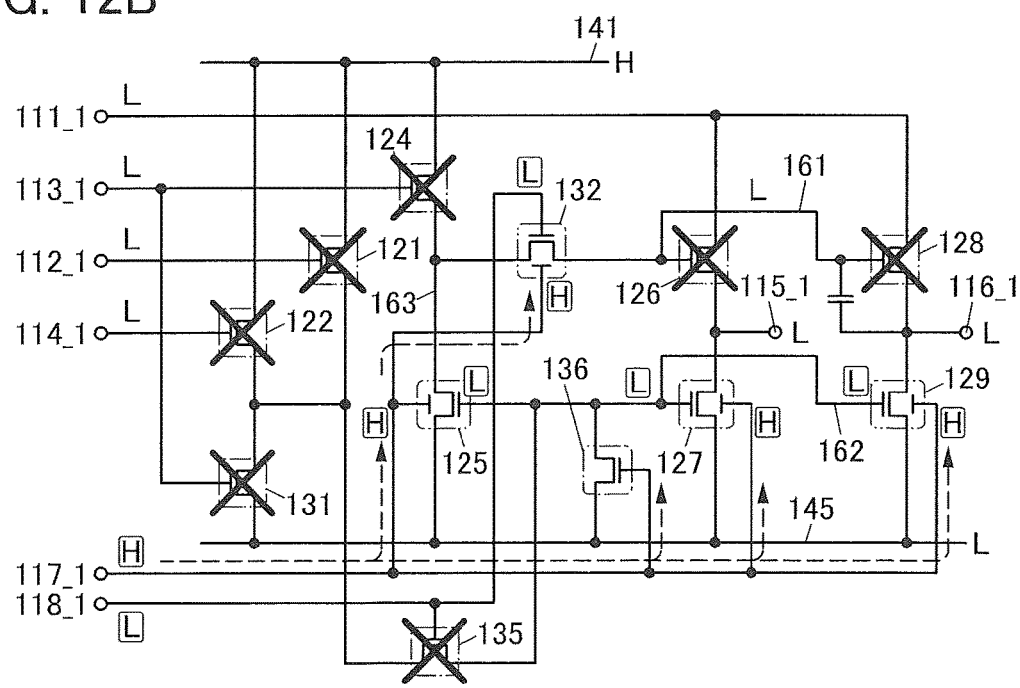

Next, the operation of the pulse output circuit 110 included in the shift register 100 is described with reference to FIG. 9, FIGS. 10A and 10B, FIGS. 11A and 11B, and FIGS. 12A and 12B. FIG. 9 is a timing chart showing the operation of the pulse output circuit 110_1 in the first stage. FIGS. 10A and 10B, FIGS. 11A and 11B, and FIGS. 12A and 12B are circuit diagrams showing the operation of the pulse output circuit 110_1.

FIG. 9 shows potential changes in the terminals 111 to 116 and the nodes 161 to 163. FIG. 9 further shows the on/off states of the transistor 121, the transistor 122, the transistors 124 to 129, the transistor 131, the transistor 132, and the transistor 135. During the operation of the shift register 100, the wirings 141 and 145 are supplied with the H potential and the L potential, respectively.

[Period 150 (See FIG. 10A)]

After power supply to the shift register 100 is started, the reset signal RES is supplied to the terminals 114 of all of the pulse output circuits 110 through the wiring 105. In the period 150, the signals DTY1 and DTY3 are the L potentials and the signals DTY2 and DTY4 are the H potentials. The terminals 117 of all of the pulse output circuits 110 are supplied with the L potential, and the terminals 118 thereof are supplied with the H potential. Then, the transistors 122 and the transistors 135 of all of the pulse output circuits 110 are turned on, and the H potential (accurately, H potential−$V_{th}$) is supplied to all of the nodes 162. Furthermore, the transistors 125 in all of the pulse output circuits 110 are turned on, and the L potential is supplied to all of the nodes 161. Thus, all of the output signals OUT become the L potentials.

[Period 151 (See FIG. 10B)]

When the supply of the reset signal RES is stopped and the terminals 114 of all of the pulse output circuits 110 are set at the L potentials, the transistors 122 of all of the pulse output circuits 110 are turned off. When the start signal SP is supplied to the terminal 113_1, the transistors 124 and 131 are turned on. When the transistor 124 is turned on, the potentials of the nodes 161 and 163 become the H potentials (accurately, H potential−$V_{th}$), so that the transistors 126 and 128 are turned on. Since the L potential is supplied to the terminal 111, the outputs of the terminals 115 and 116 remain at the L potentials. When the transistor 131 is turned on, the potential of the node 162 becomes the L potential. Note that the terminals 113_i in the subsequent stages are supplied with the output signals of the terminals 115_i-1 in the preceding stages.

[Period 152 (See FIG. 11A)]

The L potential is supplied to the terminal 113, and the H potential (clock signal CLK1) is supplied to the terminal 111. When the L potential is supplied to the terminal 113, the transistor 124 is turned off, so that the nodes 161 and 163 each become a floating state. When the H potential is supplied to the terminal 111, the potentials of the terminals 115_1 and 116_1 are increased.

Since the node 161 and the terminal 116_1 are connected to each other via the capacitor 134, the potential of the node 161 is raised to 2×VDD-$V_{th}$ at the maximum by the bootstrap operation. Thus, the H potential is output from the terminals 115 and 116. Since the node 163 is electrically connected to the node 161 via the transistor 132, the potential of the node 163 remains at the H potential (accurately, H potential-$V_{th}$). The output of the terminal 115 is input to the terminal 113_2 of the pulse output circuit 110_2 in the subsequent stage.

In this specification and the like, a period from supply of the H potential to the terminal 113_i to output of the H potential from the terminal 115_i and/or the terminal 116_i is referred to as a selection period of the pulse output circuit 110_i. For example, the periods 151 and 152 are collectively referred to as a selection period of the pulse output circuit 110_1. A period other than the periods 151 and 152 is referred to as a non-selection period of the pulse output circuit 110_1.

[Period 153 (See FIG. 11B)]

The L potential is supplied to the terminal 111_1 and the H potential (clock signal CLK2) is supplied to the terminal 112_1. When the H potential is supplied to the terminal 112_1, the transistor 121 is turned on, so that the potential of the node 162 becomes the H potential (accurately, H potential-$V_{th}$). Then, the transistor 125 is turned on, the nodes 161 and 163 are each set at the L potential. The transistor 127 is turned on, so that the L potential is output from the terminal 115_1. The transistor 129 is turned on, so that the L potential is output from the terminal 116_1.

In the period 153, the signal DTY3 becomes the H potential and the signal DTY4 becomes the L potential.

[Period 154 (See FIG. 12A)]

The L potential is supplied to the terminal 112_1, so that the transistor 121 is turned off. In the pulse output circuit 110_1, the L potential is output from the terminals 115_1 and 116_1 until the H potential is supplied to the terminal 113_1 next, even if the H potential is supplied to the terminal 111.

By repeatedly performing the above operation in every pulse output circuit 110, the output signal OUT at the H level can be sequentially output from the terminals 116 in the first to n-th stages.

[Period 193]

Also after the period 154, the signals DTY1 and DTY4 are the L potentials and the signals DTY2 and DTY3 are the H potentials until the switching period 172b. Thus, the H potential is supplied to the first gate of each of the transistors 125, 127, 129, and 132, and the L potential is supplied to the second gate of each of them (see FIG. 12A).

In the switching period 172b, the signals DTY1 and DTY4 are the H potentials, and the signals DTY2 and DTY3 are the L potentials. Thus, the L potential is supplied to the first gate of each of the transistors 125, 127, 129, and 132, and the H potential is supplied to the second gate of each of them (see FIG. 12B). Even in the case where the potentials of the first gates and the potentials of the second gates are interchanged, the on states of the transistors remain; thus, the output of the terminal 116_1 is also maintained.

When a gate to which positive stress is applied in a non-selection period is switched using a transistor which includes a first gate and a second gate as each of the transistors 125, 127, 129, and 132, a decrease in the reliability of the shift register 100 which is caused by degradation of transistor characteristics can be reduced. In other words, the reliability of the semiconductor device of one embodiment of the present invention can be increased.

Figure 13A:
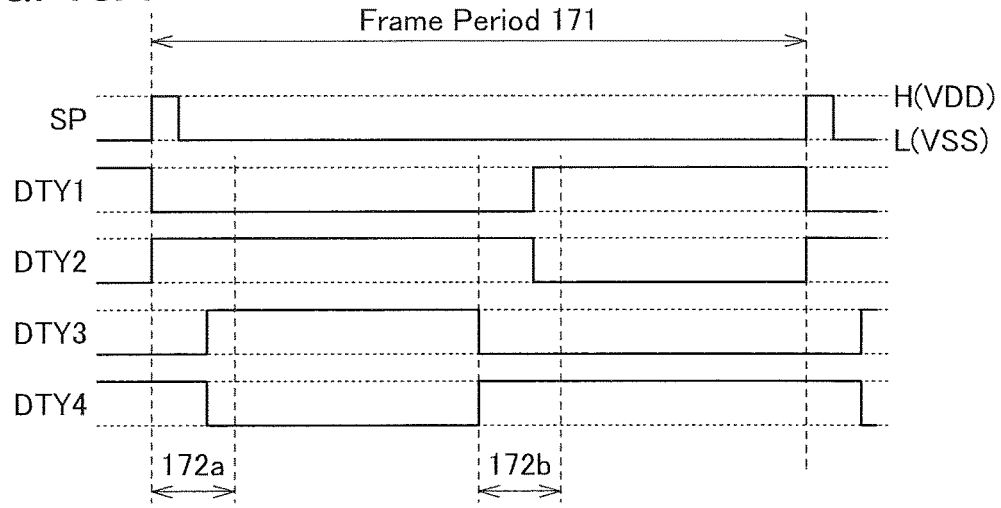
FIGS. 13A to 13C are timing charts illustrating operation of a shift register.
Figure 13B:
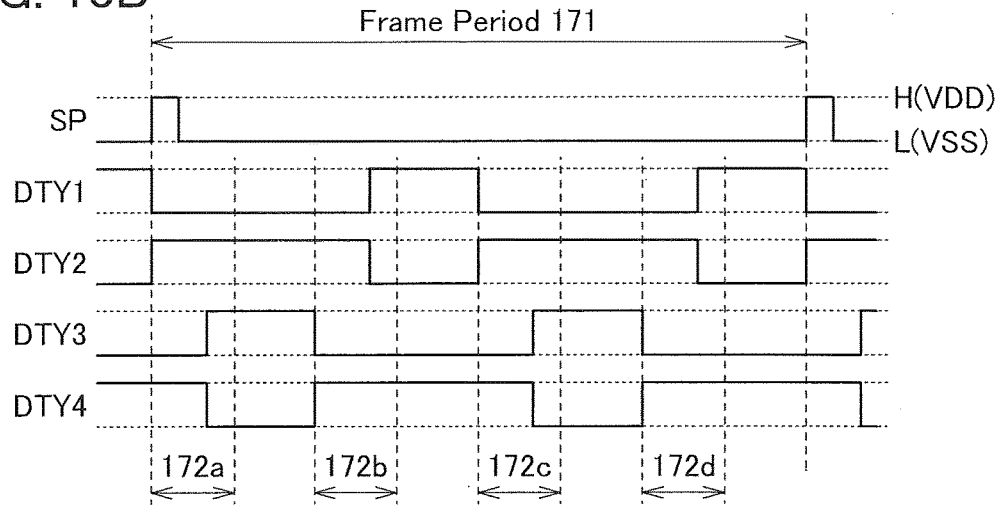
Figure 13C:
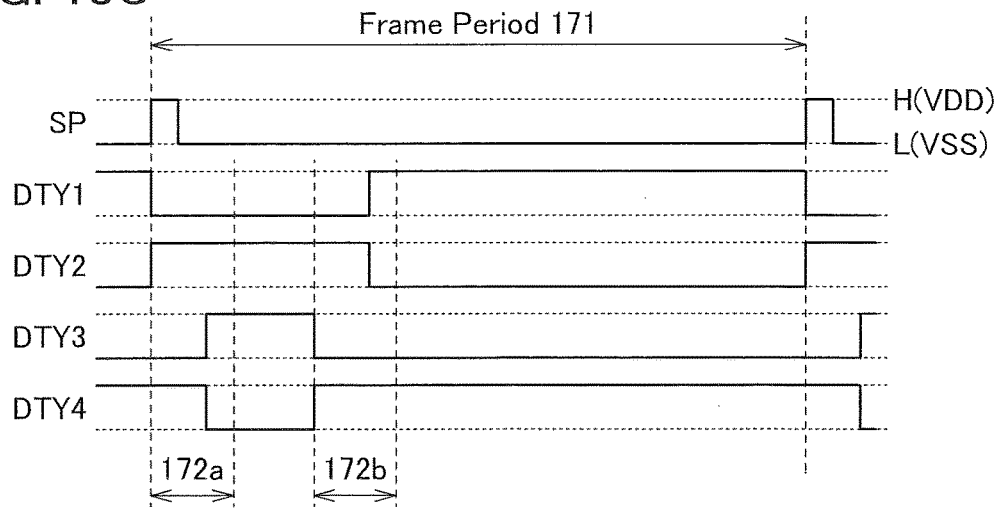

FIGS. 13A to 13C are timing charts of the start signal SP and the signals DTY1 to DTY4. In this embodiment, the case where two switching periods 172 (switching periods 172a and 172b) are provided per frame period 171 is described (see FIG. 13A). However, one embodiment of the present invention is not limited thereto, and two or more switching periods 172 may be provided per frame period 171. For example, four switching periods 172 (switching periods 172a to 172d) may be provided per frame period 171 (see FIG. 13B). The duty cycles of the signals DTY1 to DTY4 can be determined arbitrarily (see FIG. 13C). To increase the reliability of the semiconductor device of one embodiment of the present invention, the duty cycles of the signals DTY1 to DTY4 are preferably 30% to 70%, further preferably 40% to 60%, still further preferably 45% to 55%. In this specification and the like, the duty cycle refers to the percentage of a period of the H potential to one frame period of a specific signal.

This embodiment can be implemented in appropriate combination with any of the structures described in the other embodiments and the like.

Embodiment 2

In this embodiment, a structure example of a transistor that can be used for the pulse output circuit described in the above embodiment and a semiconductor device including the pulse output circuit will be described.

The pulse output circuit of one embodiment of the present invention can be fabricated by using a transistor with any of various structures, such as a bottom-gate transistor or a top-gate transistor. Therefore, a material for a semiconductor layer or the structure of a transistor can be easily changed depending on the existing production line.

[Bottom-Gate Transistor]

FIG. 20A1 is a cross-sectional view of a channel-protective transistor 410 that is a type of bottom-gate transistor. The transistor 410 includes an electrode 246 over a substrate 271 with an insulating layer 272 positioned therebetween. The transistor 410 includes a semiconductor layer 242 over the electrode 246 with an insulating layer 226 provided therebetween. The electrode 246 can function as a gate electrode. The insulating layer 226 can function as a gate insulating layer.

The transistor 410 includes an insulating layer 225 over a channel formation region in the semiconductor layer 242. The transistor 410 includes an electrode 244a and an electrode 244b which are partly in contact with the semiconductor layer 242 and over the insulating layer 226. Part of the electrode 244a and part of the electrode 244b are formed over the insulating layer 225.

The insulating layer 225 can function as a channel protective layer. With the insulating layer 225 provided over the channel formation region, the semiconductor layer 242 can be prevented from being exposed at the time of forming the electrodes 244*a* and 244*b*. Thus, the channel formation region in the semiconductor layer 242 can be prevented from being etched at the time of forming the electrodes 244*a* and 244*b*. According to one embodiment of the present invention, a transistor with favorable electrical characteristics can be provided.

The transistor 410 includes an insulating layer 228 over the electrode 244*a*, the electrode 244*b*, and the insulating layer 225 and further includes an insulating layer 229 over the insulating layer 228.

In the case where an oxide semiconductor is used for the semiconductor layer 242, a material that is capable of removing oxygen from part of the semiconductor layer 242 to generate oxygen vacancies is preferably used at least for regions of the electrodes 244*a* and 244*b* that are in contact with the semiconductor layer 242. The carrier concentration of the regions of the semiconductor layer 242 in which oxygen vacancies are generated is increased, so that the regions become n-type regions ($n^+$ layers). Accordingly, the regions can function as a source region and a drain region. Examples of the material which is capable of removing oxygen from the oxide semiconductor to generate oxygen vacancies include tungsten and titanium.

Formation of the source region and the drain region in the semiconductor layer 242 makes it possible to reduce contact resistance between the semiconductor layer 242 and each of the electrodes 244*a* and 244*b*. Accordingly, the electrical characteristics of the transistor, such as the field-effect mobility and the threshold voltage, can be favorable.

In the case where a semiconductor such as silicon is used for the semiconductor layer 242, a layer that functions as an n-type semiconductor or a p-type semiconductor is preferably provided between the semiconductor layer 242 and the electrode 244*a* and between the semiconductor layer 242 and the electrode 244*b*. The layer that functions as an n-type semiconductor or a p-type semiconductor can function as a source region or a drain region in a transistor.

The insulating layer 229 is preferably formed using a material that can prevent or reduce diffusion of impurities into the transistor from the outside. The formation of the insulating layer 229 may also be omitted.

When an oxide semiconductor is used for the semiconductor layer 242, heat treatment may be performed before and/or after the insulating layer 229 is formed. The heat treatment can fill oxygen vacancies in the semiconductor layer 242 by diffusing oxygen contained in the insulating layer 229 or other insulating layers into the semiconductor layer 242. Alternatively, the insulating layer 229 may be formed while the heat treatment is performed, so that oxygen vacancies in the semiconductor layer 242 can be filled.

A transistor 411 illustrated in FIG. 20A2 is different from the transistor 410 in that an electrode 223 that can function as a back gate is provided over the insulating layer 229. The electrode 223 can be formed using a material and a method similar to those of the electrode 246.

[Back Gate]

As described above, in general, a back gate is formed using a conductive layer and positioned so that the channel formation region of the semiconductor layer is located between the gate and the back gate. In addition, the back gate can function in a manner similar to that of the gate. The potential of the back gate may be the same as that of the gate electrode or may be a GND potential or a predetermined potential. By changing the potential of the back gate independently of the potential of the gate, the threshold voltage of the transistor can be changed.

The electrode 246 and the electrode 223 can each function as a gate. Thus, the insulating layers 226, 228, and 229 can each function as a gate insulating layer. The electrode 223 may also be provided between the insulating layers 228 and 229.

In the case where one of the electrode 246 and the electrode 223 is simply referred to as a "gate" or a "gate electrode", the other can be referred to as a "back gate" or a "back gate electrode". For example, in the transistor 411, in the case where the electrode 223 is referred to as a "gate electrode", the electrode 246 is referred to as a "back gate electrode". In the case where the electrode 223 is used as a "gate electrode", the transistor 411 can be regarded as a kind of top-gate transistor. Alternatively, one of the electrode 246 and the electrode 223 may be referred to as a "first gate" or a "first gate electrode", and the other may be referred to as a "second gate" or a "second gate electrode".

By providing the electrode 246 and the electrode 223 with the semiconductor layer 242 provided therebetween and setting the potentials of the electrode 246 and the electrode 223 to be the same, a region of the semiconductor layer 242 through which carriers flow is enlarged in the film thickness direction; thus, the number of transferred carriers is increased. As a result, the on-state current and the field-effect mobility of the transistor 411 are increased.

Therefore, the transistor 411 has large on-state current for the area occupied thereby. That is, the area occupied by the transistor 411 can be small for required on-state current. With one embodiment of the present invention, the area occupied by a transistor can be reduced. Therefore, a semiconductor device having a high degree of integration can be provided.

Furthermore, the gate and the back gate are formed using conductive layers and thus each have a function of preventing an electric field generated outside the transistor from influencing the semiconductor layer in which the channel is formed (in particular, an electric field blocking function against static electricity and the like). When the back gate is formed larger than the semiconductor layer such that the semiconductor layer is covered with the back gate, the electric field blocking function can be enhanced.

Since the electrode 246 (gate) and the electrode 223 (back gate) each have a function of blocking an electric field from the outside, electric charge of charged particles and the like generated on the insulating layer 272 side or above the electrode 223 do not influence the channel formation region in the semiconductor layer 242. Thus, degradation by a stress test (e.g., a negative gate bias temperature (−GBT) stress test in which negative charges are applied to a gate) can be reduced. Furthermore, a change in gate voltage (rising voltage) at which on-state current starts flowing at different drain voltages can be reduced. Note that this effect is obtained when the electrodes 246 and 223 have the same potential or different potentials.

The GBT stress test is one kind of acceleration test and can evaluate, in a short time, a change by long-term use (i.e., a change over time) in characteristics of a transistor. In particular, the amount of change in threshold voltage of the transistor between before and after the GBT stress test is an important indicator when examining the reliability of the transistor. As the change in the threshold voltage is smaller, the transistor has higher reliability.

By providing the electrodes 246 and 223 and setting the potentials of the electrodes 246 and 223 to be the same, the amount of change in threshold voltage is reduced. Accordingly, a variation in electrical characteristics among a plurality of transistors is also reduced.

The transistor including the back gate has a smaller change in threshold voltage by a positive GBT stress test in which positive electric charge is applied to a gate than a transistor including no back gate.

When the back gate is formed using a light-blocking conductive film, light can be prevented from entering the semiconductor layer from the back gate side. Therefore, photodegradation of the semiconductor layer can be prevented and deterioration in electrical characteristics of the transistor, such as a shift of the threshold voltage, can be prevented.

With one embodiment of the present invention, a transistor with high reliability can be provided. Moreover, a pulse output circuit, a semiconductor device, or the like with high reliability can be provided.

FIG. 20B1 is a cross-sectional view of a channel-protective transistor 420 that is a type of bottom-gate transistor. The transistor 420 has substantially the same structure as the transistor 410 but is different from the transistor 410 in that the insulating layer 225 having openings 231a and 231b covers the semiconductor layer 242. The openings 231a and 231b are formed by selectively removing part of the insulating layer 225 which overlaps with the semiconductor layer 242.

The semiconductor layer 242 is electrically connected to the electrode 244a in the opening 231a. The semiconductor layer 242 is electrically connected to the electrode 244b in the opening 231b. With the insulating layer 225, the semiconductor layer 242 can be prevented from being exposed at the time of forming the electrodes 244a and 244b. Thus, the semiconductor layer 242 can be prevented from being reduced in thickness at the time of forming the electrodes 244a and 244b. A region of the insulating layer 225 which overlaps with the channel formation region can function as a channel protective layer.

A transistor 421 illustrated in FIG. 20B2 is different from the transistor 420 in that the electrode 223 that can function as a back gate is provided over the insulating layer 229.

The distance between the electrodes 244a and 246 and the distance between the electrodes 244b and 246 in the transistors 420 and 421 are longer than those in the transistors 410 and 411. Thus, the parasitic capacitance generated between the electrodes 244a and 246 can be reduced. Furthermore, the parasitic capacitance generated between the electrodes 244b and 246 can be reduced. According to one embodiment of the present invention, a transistor with favorable electrical characteristics can be provided.

A transistor 425 illustrated in FIG. 20C1 is a channel-etched transistor that is a type of bottom-gate transistor. In the transistor 425, the insulating layer 225 is not provided and the electrodes 244a and 244b are formed to be in contact with the semiconductor layer 242. Thus, part of the semiconductor layer 242 that is exposed when the electrodes 244a and 244b are formed is etched in some cases. However, since the insulating layer 225 is not provided, the productivity of the transistor can be increased.

A transistor 426 illustrated in FIG. 20C2 is different from the transistor 425 in that the electrode 223 which can function as a back gate is provided over the insulating layer 229.

[Top-Gate Transistor]

FIG. 21A1 is a cross-sectional view of a transistor 430 that is a type of top-gate transistor. The transistor 430 includes the semiconductor layer 242 over the substrate 271 with the insulating layer 272 therebetween, the electrodes 244a and 244b that are over the semiconductor layer 242 and the insulating layer 272 and in contact with part of the semiconductor layer 242, the insulating layer 226 over the semiconductor layer 242 and the electrodes 244a and 244b, and the electrode 246 over the insulating layer 226.

Since the electrode 246 overlaps with neither the electrode 244a nor the electrode 244b in the transistor 430, the parasitic capacitance generated between the electrodes 246 and 244a and the parasitic capacitance generated between the electrodes 246 and 244b can be reduced. After the formation of the electrode 246, an impurity 255 is introduced into the semiconductor layer 242 using the electrode 246 as a mask, so that an impurity region can be formed in the semiconductor layer 242 in a self-aligned manner (see FIG. 21A3). According to one embodiment of the present invention, a transistor with favorable electrical characteristics can be provided.

The introduction of the impurity 255 can be performed with an ion implantation apparatus, an ion doping apparatus, or a plasma treatment apparatus.

As the impurity 255, for example, at least one element of a Group 13 element, a Group 15 element, and the like can be used. In the case where an oxide semiconductor is used for the semiconductor layer 242, it is possible to use at least one kind of element of a rare gas and hydrogen as the impurity 255.

A transistor 431 illustrated in FIG. 21A2 is different from the transistor 430 in that the electrode 223 and the insulating layer 227 are included. The transistor 431 includes the electrode 223 formed over the insulating layer 272 and the insulating layer 227 formed over the electrode 223. The electrode 223 can function as a back gate. Thus, the insulating layer 227 can function as a gate insulating layer. The insulating layer 227 can be formed using a material and a method similar to those of the insulating layer 226.

The transistor 431 as well as the transistor 411 has large on-state current for the area occupied thereby. That is, the area occupied by the transistor 431 can be small for required on-state current. With one embodiment of the present invention, the area occupied by a transistor can be reduced. Therefore, with one embodiment of the present invention, a semiconductor device having a high degree of integration can be provided.

A transistor 440 shown in FIG. 21B1 as an example is a type of top-gate transistor. The transistor 440 is different from the transistor 430 in that the semiconductor layer 242 is formed after the formation of the electrodes 244a and 244b. A transistor 441 illustrated in FIG. 21B2 is different from the transistor 440 in that the electrode 223 and the insulating layer 227 are included. Thus, in the transistors 440 and 441, part of the semiconductor layer 242 is formed over the electrode 244a and another part of the semiconductor layer 242 is formed over the electrode 244b.

The transistor 441 as well as the transistor 411 has a high on-state current for its area. That is, the area occupied by the transistor 441 can be small for required on-state current. With one embodiment of the present invention, the area occupied by a transistor can be reduced. Therefore, a semiconductor device having a high degree of integration can be provided.

A transistor 442 illustrated in FIG. 22A1 as an example is a type of top-gate transistor. The transistor 442 has the electrodes 244a and 244b over the insulating layer 229. The electrodes 244a and 244b are electrically connected to the semiconductor layer 242 through openings formed in the insulating layers 228 and 229.

Part of the insulating layer 226 that does not overlap with the electrode 246 is removed. The insulating layer 226 included in the transistor 442 is partly extended across the ends of the electrode 246.

The impurity 255 is added to the semiconductor layer 242 using the electrode 246 and the insulating layer 226 as masks, so that an impurity region can be formed in the semiconductor layer 242 in a self-aligned manner (see FIG. 22A3).

At this time, the impurity 255 is not added to the semiconductor layer 242 in a region overlapping with the electrode 246, and the impurity 255 is added to the semiconductor layer 242 in a region that does not overlap with the electrode 246. The semiconductor layer 242 in a region into which the impurity 255 is introduced through the insulating layer 226 has a lower impurity concentration than the semiconductor layer 242 in a region into which the impurity 255 is introduced without through the insulating layer 226. Thus, a lightly doped drain (LDD) region is formed in the semiconductor layer 242 in a region adjacent to the electrode 246 when seen from the above.

A transistor 443 illustrated in FIG. 22A2 is different from the transistor 442 in that the transistor 443 includes the electrode 223 under the semiconductor layer 242. The electrode 223 and the semiconductor layer 242 overlap with each other with the insulating layer 272 positioned therebetween. The electrode 223 can function as a back gate electrode.

As in a transistor 444 illustrated in FIG. 22B1 and a transistor 445 illustrated in FIG. 22B2, the insulating layer 226 in a region that does not overlap with the electrode 246 may be wholly removed. Alternatively, as in a transistor 446 illustrated in FIG. 22C1 and a transistor 447 illustrated in FIG. 22C2, the insulating layer 226 except for the openings may be left without being removed.

In the transistors 444 to 447, after the formation of the electrode 246, the impurity 255 is added to the semiconductor layer 242 using the electrode 246 as a mask, so that an impurity region can be formed in the semiconductor layer 242 in a self-aligned manner.

[S-Channel Transistor]

FIGS. 23A to 23C illustrate an example of a structure of a transistor including an oxide semiconductor for the semiconductor layer 242. FIG. 23A is a top view of a transistor 451. FIG. 23B is a cross-sectional view (in the channel length direction) of a portion along the dashed-dotted line L1-L2 in FIG. 23A. FIG. 23C is a cross-sectional view (in the channel width direction) of a portion along the dashdotted line W1-W2 in FIG. 23A.

The transistor 451 includes the semiconductor layer 242, the insulating layer 226, the insulating layer 272, an insulating layer 282, an insulating layer 274, an electrode 224, an electrode 243, the electrode 244a, and the electrode 244b. The electrode 243 can function as a gate, and the electrode 224 can function as a back gate. The insulating layer 226, the insulating layer 272, the insulating layer 282, and the insulating layer 274 each can function as a gate insulating layer. The electrode 244a can function as one of a source electrode and a drain electrode. The electrode 244b can function as the other of the source electrode and the drain electrode.

An insulating layer 275 is provided over the substrate 271, and the electrode 224 and an insulating layer 273 are provided over the insulating layer 275. Over the electrode 224 and the insulating layer 273, the insulating layer 274 is provided. Over the insulating layer 274, the insulating layer 282 is provided, and over the insulating layer 282, the insulating layer 272 is provided.

A semiconductor layer 242a is provided over a projection formed in the insulating layer 272, and a semiconductor layer 242b is provided over the semiconductor layer 242a. The electrode 244a and the electrode 244b are provided over the semiconductor layer 242b. A region in the semiconductor layer 242b which overlaps with the electrode 244a can function as one of a source and a drain of the transistor 451. A region in the semiconductor layer 242b which overlaps with the electrode 244b can function as the other of the source and the drain of the transistor 451.

In addition, a semiconductor layer 242c is provided to be in contact with part of the semiconductor layer 242b. The insulating layer 226 is provided over the semiconductor layer 242c, and the electrode 243 is provided over the insulating layer 226.

The transistor 451 has a structure in which a top surface and a side surface of the semiconductor layer 242b and a side surface of the semiconductor layer 242a are covered with the semiconductor layer 242c in the portion along W1-W2. With the semiconductor layer 242b provided on the projection of the insulating layer 272, the side surface of the semiconductor layer 242b can be covered with the electrode 243. Thus, the transistor 451 has a structure in which semiconductor layer 242b can be electrically surrounded by electric field of the electrode 243. In this way, the structure of a transistor in which the semiconductor layer in which the channel is formed is electrically surrounded by the electric field of the conductive film is called a surrounded channel (s-channel) structure. A transistor having an s-channel structure is referred to as an s-channel transistor.

In the s-channel structure, a channel can be formed in the whole (bulk) of the semiconductor layer 242b. In the s-channel structure, the drain current of the transistor is increased, so that a larger amount of on-state current can be obtained. Furthermore, the entire channel formation region of the semiconductor layer 242b can be depleted by the electric field of the electrode 243. Accordingly, off-state current of the transistor with an s-channel structure can be further reduced.

When the projection of the insulating layer 272 is increased in height, and the channel width is shortened, the effects of the s-channel structure for increasing the on-state current and reducing the off-state current can be enhanced. Part of the semiconductor layer 242a exposed in the formation of the semiconductor layer 242b may be removed. In this case, the side surfaces of the semiconductor layer 242a and the semiconductor layer 242b may be aligned to each other.

The insulating layer 228 is provided over the transistor 451 and the insulating layer 229 is provided over the insulating layer 228. An electrode 225a, an electrode 225b, and an electrode 225c are provided over the insulating layer 229. The electrode 225a is electrically connected to the electrode 244a via a contact plug through an opening in the insulating layer 229 and the insulating layer 228. The electrode 225b is electrically connected to the electrode 244b via a contact plug through an opening in the insulating layer 229 and the insulating layer 228. The electrode 225c is electrically connected to the electrode 243 via a contact plug through an opening in the insulating layer 229 and the insulating layer 228.

Note that when the insulating layer 282 is formed using hafnium oxide, aluminum oxide, tantalum oxide, aluminum silicate, or the like, the insulating layer 282 can function as a charge trap layer. The threshold voltage of the transistor can be changed by injecting electrons into the insulating layer 282. For example, the injection of electrons into the insulating layer 282 can be performed with use of the tunnel effect. By applying a positive voltage to the electrode 224, tunnel electrons can be injected into the insulating layer 282.

[Energy Band Structure (1) of Semiconductor Layer 242]

Figure 31A:
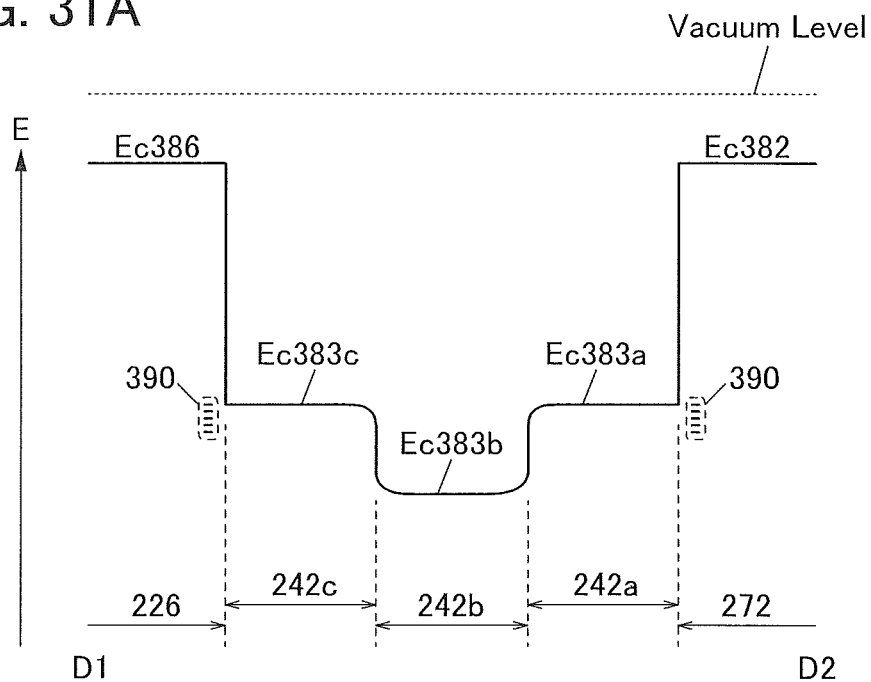
FIGS. 31A and 31B show energy band structures.

The function and effect of the semiconductor layer 242 that is a stacked layer including the semiconductor layers 242a, 242b, and 242c are described with an energy band structure diagrams shown in FIG. 31A. FIG. 31A illustrates the energy band structure of a portion along the dashed-dotted line D1-D2 in FIG. 23B. In other words, FIG. 31A illustrates the energy band structure of a channel formation region of the transistor 451.

In FIG. 31A, Ec382, Ec383a, Ec383b, Ec383c, and Ec386 indicate the energy of the conduction band minimum of the insulating layer 272, that of the semiconductor layer 242a, that of the semiconductor layer 242b, that of the semiconductor layer 242c, and that of the insulating layer 226, respectively.

Here, an electron affinity corresponds to a value obtained by subtracting a band gap from a difference in energy between the vacuum level and the valence band maximum (the difference is also referred to as "ionization potential"). Note that the band gap can be measured using a spectroscopic ellipsometer (UT-300 manufactured by HORIBA JOBIN YVON S.A.S.). The energy difference between the vacuum level and the valence band maximum can be measured using an ultraviolet photoelectron spectroscopy (UPS) device (VersaProbe manufactured by ULVAC-PHI, Inc.).

In the case of an In—Ga—Zn oxide formed using a target whose atomic ratio is In:Ga:Zn=1:3:2, the band gap is about 3.5 eV, and the electron affinity is about 4.5 eV. In the case of an In—Ga—Zn oxide formed using a target whose atomic ratio is In:Ga:Zn=1:3:4, the band gap is about 3.4 eV, and the electron affinity is about 4.5 eV. In the case of an In—Ga—Zn oxide formed using a target whose atomic ratio is In:Ga:Zn=1:3:6, the band gap is about 3.3 eV, and the electron affinity is about 4.5 eV. In the case of an In—Ga—Zn oxide formed using a target whose atomic ratio is In:Ga:Zn=1:6:2, the band gap is about 3.9 eV, and the electron affinity is about 4.3 eV. In the case of an In—Ga—Zn oxide formed using a target whose atomic ratio is In:Ga:Zn=1:6:8, the band gap is about 3.5 eV, and the electron affinity is about 4.4 eV. In the case of an In—Ga—Zn oxide formed using a target whose atomic ratio is In:Ga:Zn=1:6:10, the band gap is about 3.5 eV, and the electron affinity is about 4.5 eV. In the case of an In—Ga—Zn oxide formed using a target whose atomic ratio is In:Ga:Zn=1:1:1, the band gap is about 3.2 eV, and the electron affinity is about 4.7 eV. In the case of an In—Ga—Zn oxide formed using a target whose atomic ratio is In:Ga:Zn=3:1:2, the band gap is about 2.8 eV, and the electron affinity is about 5.0 eV.

Since the insulating layer 272 and the insulating layer 226 are insulators, Ec382 and Ec386 are closer to the vacuum level (have a smaller electron affinity) than Ec383a, Ec383b, and Ec383c.

Further, Ec383a is closer to the vacuum level than Ec383b is. Specifically, Ec383a is preferably located closer to the vacuum level than Ec383b by greater than or equal to 0.07 eV and less than or equal to 1.3 eV, further preferably greater than or equal to 0.1 eV and less than or equal to 0.7 eV, still further preferably greater than or equal to 0.15 eV and less than or equal to 0.4 eV.

Further, Ec383c is closer to the vacuum level than Ec383b is. Specifically, Ec383c is preferably located closer to the vacuum level than Ec383b by greater than or equal to 0.07 eV and less than or equal to 1.3 eV, further preferably greater than or equal to 0.1 eV and less than or equal to 0.7 eV, still further preferably greater than or equal to 0.15 eV and less than or equal to 0.4 eV.

Here, a mixed region of the semiconductor layer 242a and the semiconductor layer 242b exists between the semiconductor layer 242a and the semiconductor layer 242b in some cases. In addition, a mixed region of the semiconductor layer 242b and the semiconductor layer 242c exists between the semiconductor layer 242b and the semiconductor layer 242c in some cases. The mixed region has a low density of interface states. For that reason, the stack including the semiconductor layers 242a, 242b, and 242c has a band structure where energy at each interface and in the vicinity of the interface is changed continuously (continuous junction).

In this state, electrons move mainly in the semiconductor layer 242b, not in the semiconductor layers 242a and 242c. Thus, when the interface state density at the interface between the semiconductor layer 242a and the semiconductor layer 242b and the interface state density at the interface between the semiconductor layer 242b and the semiconductor layer 242c are decreased, electron movement in the semiconductor layer 242b is less likely to be inhibited and the on-state current of the transistor 451 can be increased.

Note that although trap states 390 due to impurities or defects might be formed in the vicinity of the interface between the semiconductor layer 242a and the insulating layer 272 and in the vicinity of the interface between the semiconductor layer 242c and the insulating layer 226, the semiconductor layer 242b can be apart from the trap states owing to the existence of the semiconductor layer 242a and the semiconductor layer 242c.

In the case where the transistor 451 has an s-channel structure, a channel is formed in the whole of the semiconductor layer 242b seen in the portion along W1-W2. Therefore, as the thickness of the semiconductor layer 242b is increased, the size of the channel region is increased. In other words, as the thickness of the semiconductor layer 242b is increased, the on-state current of the transistor 451 can be increased. For example, the semiconductor layer 242b has a region with a thickness greater than or equal to 10 nm, preferably greater than or equal to 40 nm, further preferably greater than or equal to 60 nm, still further preferably greater than or equal to 100 nm. Note that the semiconductor layer 242b has a region with a thickness of, for example, less than or equal to 300 nm, preferably less than or equal to 200 nm, or further preferably less than or equal to 150 nm because the productivity of the semiconductor device including the transistor 451 might be decreased. In some cases, when the channel formation region is reduced in size, the electrical characteristics of the transistor with a smaller thickness of the semiconductor layer 242b are higher than those of the transistor with a larger thickness of the semiconductor layer 242b. Therefore, the semiconductor layer 242b may have a thickness less than 10 nm.

Moreover, the thickness of the semiconductor layer 242c is preferably as small as possible to increase the on-state current of the transistor 451. For example, the semiconductor layer 242c may have a region with a thickness less than 10 nm, preferably less than or equal to 5 nm, further preferably less than or equal to 3 nm. Meanwhile, the semiconductor layer 242c has a function of blocking entry of elements other than oxygen (such as hydrogen and silicon) included in the adjacent insulator into the semiconductor layer 242*b* where a channel is formed. For this reason, it is preferable that the semiconductor layer 242*c* have a certain thickness. The semiconductor layer 242*c* may have a region with a thickness greater than or equal to 0.3 nm, preferably greater than or equal to 1 nm, further preferably greater than or equal to 2 nm, for example.

To improve the reliability, preferably, the thickness of the semiconductor layer 242*a* is large and the thickness of the semiconductor layer 242*c* is small. For example, the semiconductor layer 242*a* may have a region with a thickness greater than or equal to 10 nm, preferably greater than or equal to 20 nm, further preferably greater than or equal to 40 nm, still further preferably greater than or equal to 60 nm. When the thickness of the semiconductor layer 242*a* is made large, a distance from an interface between the adjacent insulator and the semiconductor layer 242*a* to the semiconductor layer 242*b* in which a channel is formed can be large. Since the productivity of the semiconductor device including the transistor 451 might be decreased, the semiconductor layer 242*a* has a region with a thickness, for example, less than or equal to 200 nm, preferably less than or equal to 120 nm, or further preferably less than or equal to 80 nm.

Note that silicon contained in the oxide semiconductor might serve as a carrier trap or a carrier generation source. Therefore, the silicon concentration in the semiconductor layer 242*b* is preferably as low as possible. For example, a region with the silicon concentration lower than $1 \times 10^{19}$ atoms/cm$^3$, preferably lower than $5 \times 10^{18}$ atoms/cm$^3$, further preferably lower than $2 \times 10^{18}$ atoms/cm$^3$ which is measured by secondary ion mass spectrometry (SIMS) is provided between the semiconductor layer 242*b* and the semiconductor layer 242*a*. A region with the silicon concentration of lower than $1 \times 10^{19}$ atoms/cm$^3$, preferably lower than $5 \times 10^{18}$ atoms/cm$^3$, further preferably lower than $2 \times 10^{18}$ atoms/cm$^3$ which is measured by SIMS is provided between the semiconductor layer 242*b* and the semiconductor layer 242*c*.

It is preferable to reduce the concentrations of hydrogen in the semiconductor layer 242*a* and the semiconductor layer 242*c* in order to reduce the concentration of hydrogen in the semiconductor layer 242*b*. The semiconductor layer 242*a* and the semiconductor layer 242*c* each have a region in which the concentration of hydrogen measured by SIMS is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$.

Note that when copper enters the oxide semiconductor, an electron trap might be generated. The electron trap might shift the threshold voltage of the transistor in the positive direction. Therefore, the concentration of copper on the surface of or in the semiconductor layer 242*b* is preferably as low as possible. For example, the semiconductor layer 242*b* preferably has a region in which the concentration of copper is lower than or equal to $1 \times 10^{19}$ atoms/cm$^3$, lower than or equal to $5 \times 10^{18}$ atoms/cm$^3$, or lower than or equal to $1 \times 10^{18}$ atoms/cm$^3$.

The above three-layer structure is an example. For example, a two-layer structure without either one of the semiconductor layer 242*a* and the semiconductor layer 242*c* may be employed. A four-layer structure in which any one of the semiconductors described as examples of the semiconductor layer 242*a*, the semiconductor layer 242*b*, and the semiconductor layer 242*c* is provided below or over the semiconductor layer 242*a* or below or over the semiconductor layer 242*c* may be employed. A g-layer structure (g is an integer of 5 or more) may be included in which any one of the semiconductors described as examples of the semiconductor layers 242*a*, 242*b*, and 242*c* is provided at two or more of the following positions: over the semiconductor layer 242*a*, below the semiconductor layer 242*a*, over the semiconductor layer 242*c*, and below the semiconductor layer 242*c* may be employed.

In particular, in the transistor 451 described in this embodiment, an upper surface and a side surface of the semiconductor layer 242*b* are in contact with the semiconductor layer 242*c*, and a bottom surface of the semiconductor layer 242*b* is in contact with the semiconductor layer 242*a*. In this manner, the semiconductor layer 242*b* is surrounded by the semiconductor layer 242*a* and the semiconductor layer 242*c*, whereby the influence of the trap state can be further reduced.

Each of the band gaps of the semiconductor layer 242*a* and the semiconductor layer 242*c* is preferably larger than that of the semiconductor layer 242*b*.

With one embodiment of the present invention, a transistor with a small variation in electrical characteristics can be provided. Accordingly, a semiconductor device with a small variation in electrical characteristics can be provided. With one embodiment of the present invention, a transistor with high reliability can be provided. Accordingly, a semiconductor device with high reliability can be provided.

An oxide semiconductor has a band gap of 2 eV or more; therefore, a transistor including an oxide semiconductor in a semiconductor layer in which a channel is formed (the transistor is also referred to as "OS transistor") has an extremely small off-state current. Specifically, the off-state current per micrometer in channel width at room temperature (25° C.) and at a source-drain voltage of 3.5 V can be lower than $1 \times 10^{-20}$ A, lower than $1 \times 10^{-22}$ A, or lower than $1 \times 10^{-24}$ A. That is, the on/off ratio of the transistor can be greater than or equal to 20 digits and less than or equal to 150 digits. An OS transistor has high withstand voltage between its source and drain. With use of the OS transistor, a semiconductor device with high output voltage and high withstand voltage can be achieved.

With one embodiment of the present invention, a transistor with small power consumption can be provided. Accordingly, a semiconductor device with small power consumption can be provided.

Figure 24C:
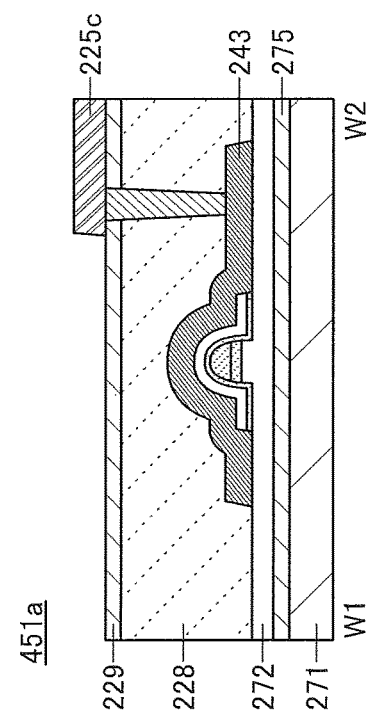
FIGS. 24A to 24C illustrate an example of a transistor.
Figure 24A:
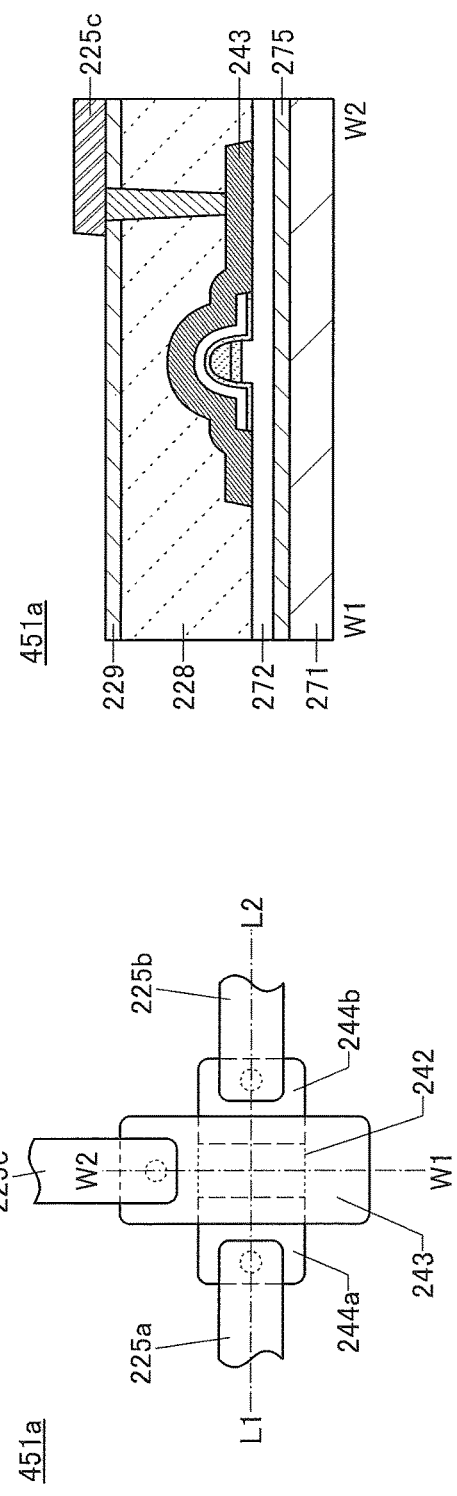
Figure 24B:
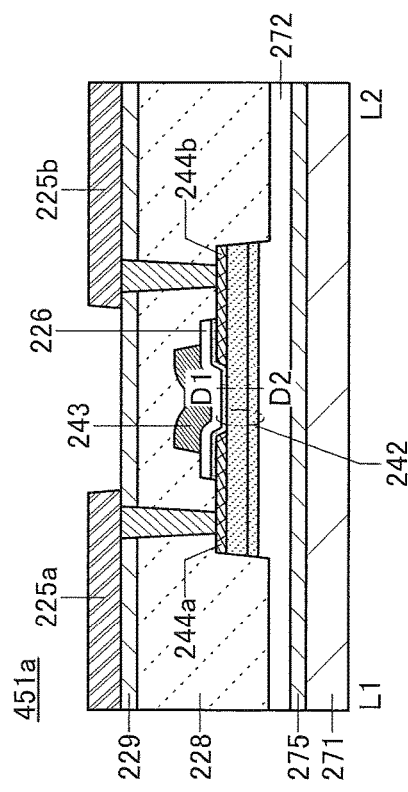

The electrode 224 that can function as a back gate is not necessary provided, depending on the purpose. FIG. 24A is a top view of a transistor 451*a*. FIG. 24B is a cross-sectional view of a portion indicated by the dashed-dotted line L1-L2 in FIG. 24A. FIG. 24C is a cross-sectional view of a portion indicated by the dashed-dotted line W1-W2 in FIG. 24A. The transistor 451*a* has a structure in which the electrode 224, the insulating layer 273, the insulating layer 274, and the insulating layer 282 are removed from the transistor 451. The productivity of the transistor can be improved by omission of the electrode and the insulating layers. Thus, the productivity of the semiconductor device can be improved.

FIGS. 25A to 25C illustrate another example of an s-channel transistor. FIG. 25A is a top view of a transistor 452. FIG. 25B and FIG. 25C are cross-sectional views of portions indicated by the dashed-dotted line L1-L2 and the dashed-dotted line W1-W2 in FIG. 25A.

Although the transistor 452 has a structure similar to that of the transistor 451, there is a different point in that the electrode 244*a* and the electrode 244*b* are in contact with the side surfaces of the semiconductor layer 242*a* and the semiconductor layer 242*b*. As the insulating layer 228 covering the transistor 452, an insulating layer with a flat surface such as that in the transistor 451 may be used. In addition, the electrode 225a, the electrode 225b, and the electrode 225c may be provided over the insulating layer 229.

Figure 26A:
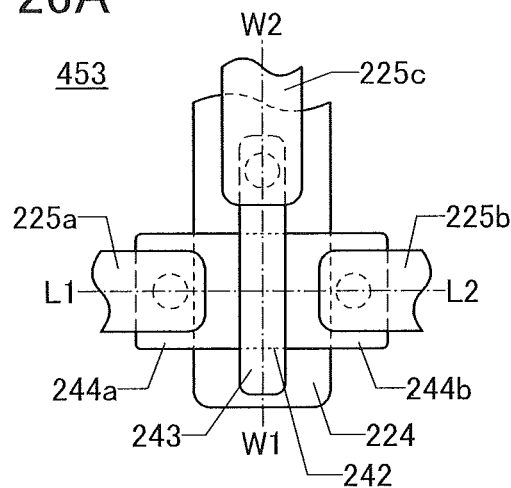
FIGS. 26A and 26B illustrate an example of a transistor.
Figure 26B:
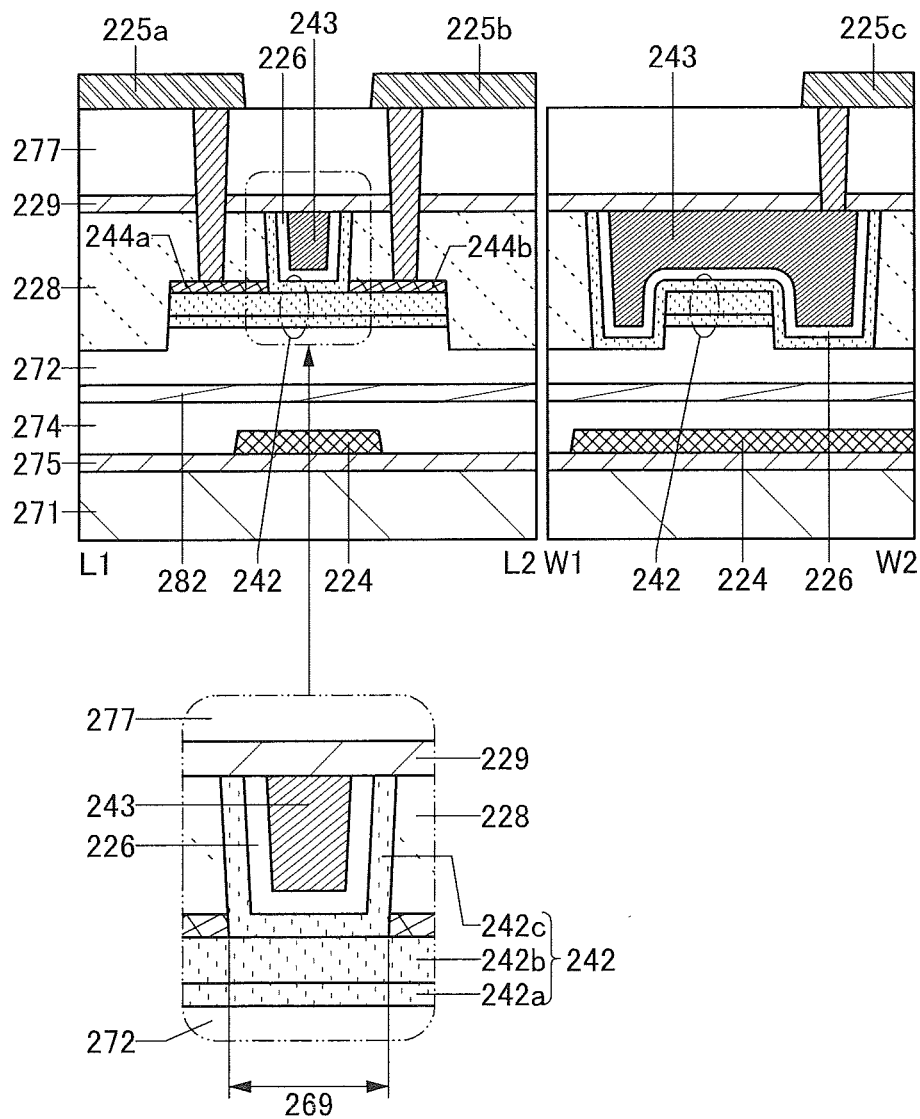

FIGS. 26A and 26B illustrate another example of an s-channel transistor. FIG. 26A is a top view of a transistor 453. FIG. 26B is a cross-sectional view of portions indicated by the dashed-dotted line L1-L2 and the dashed-dotted line W1-W2 in FIG. 26A. As in the transistor 451, the transistor 453 includes the semiconductor layer 242a and the semiconductor layer 242b over the projection of the insulating layer 272. The electrode 244a and the electrode 244b are provided over the semiconductor layer 242b. A region of the semiconductor layer 242b which overlaps with the electrode 244a can function as one of a source and a drain of the transistor 453. A region of the semiconductor layer 242b which overlaps with the electrode 244b can function as the other of the source and the drain of the transistor 453. Thus, a region 269 of the semiconductor layer 242b which is located between the electrode 244a and the electrode 244b can function as a channel formation region.

In the transistor 453, an opening is provided in a region overlapping with the region 269 by removing part of the insulating layer 228, and the semiconductor layer 242c is provided along a side and bottom surfaces of the opening. In the opening, the insulating layer 226 is provided along the side and bottom surfaces of the opening with the semiconductor layer 242c located therebetween. In addition, in the opening, the electrode 243 is provided along the side and bottom surfaces of the opening with the semiconductor layer 242c and the insulating layer 226 located therebetween.

Note that the opening is wider than the semiconductor layer 242a and the semiconductor layer 242b in the cross section in the channel width direction. Thus, in the region 269, side surfaces of the semiconductor layer 242a and the semiconductor layer 242b are covered with the semiconductor layer 242c.

The insulating layer 229 is provided over the insulating layer 228 and an insulating layer 277 is provided over the insulating layer 229. The electrode 225a, the electrode 225b, and the electrode 225c are provided over the insulating layer 277. The electrode 225a is electrically connected to the electrode 244a via a contact plug in an opening formed by removing part of the insulating layers 277, 229, and 228. The electrode 225b is electrically connected to the electrode 244b via a contact plug in an opening formed by removing part of the insulating layers 277, 229, and 228. The electrode 225c is electrically connected to the electrode 243 via a contact plug in an opening formed by removing part of the insulating layers 277 and 229.

Figure 27A:
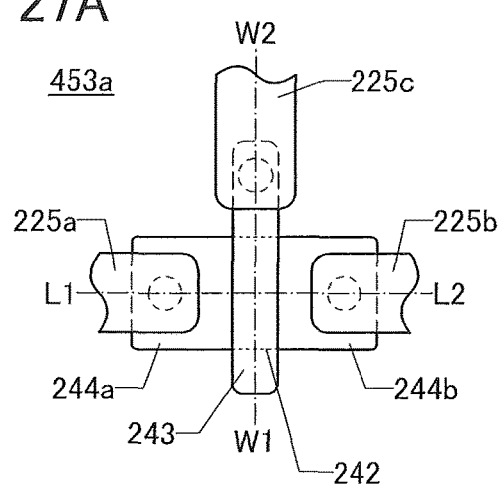
FIGS. 27A and 27B illustrate an example of a transistor.
Figure 27B:
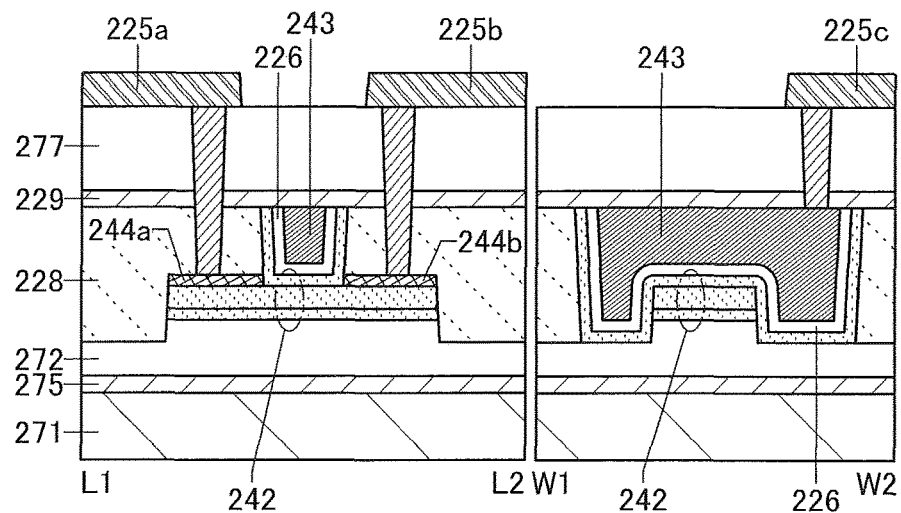

The electrode 224 that can function as a back gate is not necessarily provided, depending on the purpose. FIG. 27A is a top view of a transistor 453a. FIG. 27B is a cross-sectional view of portions indicated by the dashed-dotted line L1-L2 and the dashed-dotted line W1-W2 in FIG. 27A. The transistor 453a has a structure in which the electrode 224, the insulating layer 274, and the insulating layer 282 are removed from the transistor 453. The productivity of the transistor can be improved by omission of the electrode and the insulating layers. Accordingly, the productivity of the semiconductor device can be improved.

Figure 28A:
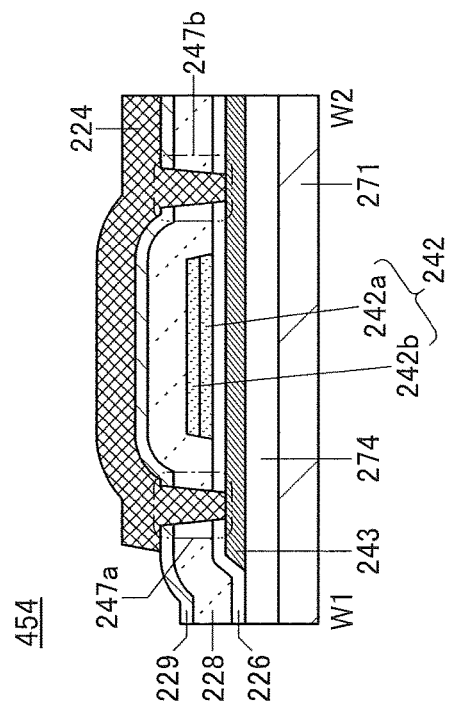
FIGS. 28A to 28C illustrate an example of a transistor.
Figure 28C:
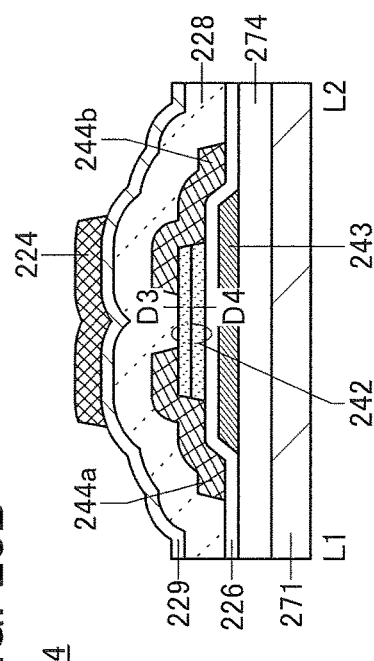
Figure 28B:
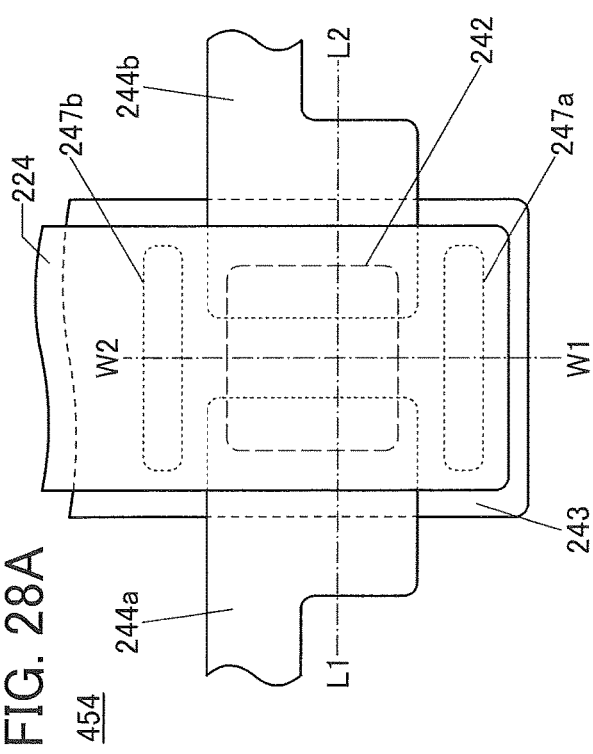

FIGS. 28A to 28C illustrate another example of an s-channel transistor. FIG. 28A is a top view of a transistor 454. FIG. 28B is a cross-sectional view of a portion indicated by the dashed-dotted line L1-L2 in FIG. 28A. FIG. 28C is a cross-sectional view of a portion indicated by the dashed-dotted line W1-W2 in FIG. 28A.

The transistor 454 is a kind of bottom-gate transistor having a back-gate electrode. In the transistor 454, the electrode 243 is formed over the insulating layer 274, and the insulating layer 226 is provided to cover the electrode 243. The semiconductor layer 242 is formed in a region that is over the insulating layer 226 and overlaps with the electrode 243. The semiconductor layer 242 in the transistor 454 has a stacked structure of the semiconductor layer 242a and the semiconductor layer 242b.

The electrode 244a and the electrode 244b are formed so as to be partly in contact with the semiconductor layer 242 and be over the insulating layer 226. The insulating layer 228 is formed so as to be partly in contact with the semiconductor layer 242 and be over the electrode 244a and the electrode 244b. The insulating layer 229 is formed over the insulating layer 228. The electrode 224 is formed in a region that is over the insulating layer 229 and overlaps with the semiconductor layer 242.

The electrode 224 provided over the insulating layer 229 is electrically connected to the electrode 243 in an opening 247a and an opening 247b provided in the insulating layer 229, the insulating layer 228, and the insulating layer 226. Accordingly, the same potential is supplied to the electrodes 224 and 243. Furthermore, either or both of the openings 247a and 247b may be omitted. In the case where neither the opening 247a nor the opening 247b is provided, different potentials can be supplied to the electrode 224 and the electrode 243.

<Energy Band Structure (2) of Semiconductor Layer 242>

Figure 31B:
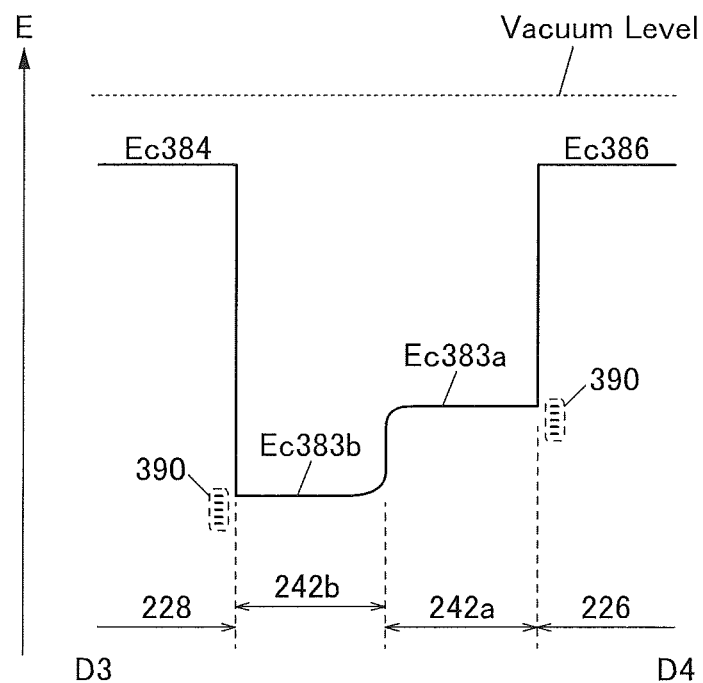

FIG. 31B is an energy band structure diagram showing a portion along the dashed-dotted line D3-D4 in FIG. 28B. FIG. 31B shows the energy band structure of a channel formation region of the transistor 454.

In FIG. 31B, Ec384 represents the energy of the conduction band minimum of the insulating layer 228. The semiconductor layer 242 is formed using two layers, the semiconductor layers 242a and 242b; thus, the transistor can be manufactured with improved productivity. Since the semiconductor layer 242c is not provided, the transistor including the two semiconductor layers is easily affected by the trap states 390 but can have higher field-effect mobility than a transistor including one semiconductor layer as the semiconductor layer 242.

Figure 29C:
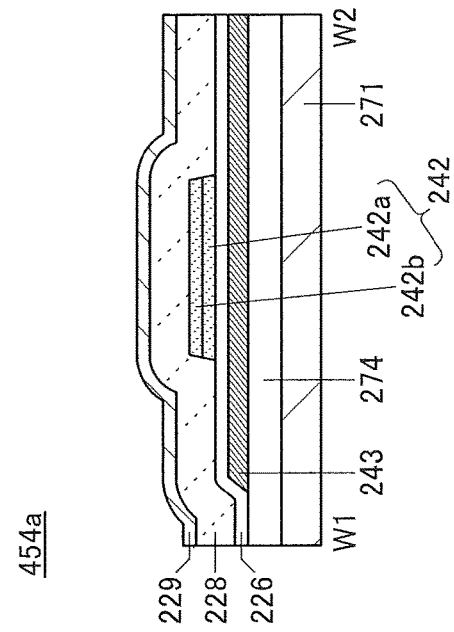
FIGS. 29A to 29C illustrate an example of a transistor.
Figure 29A:
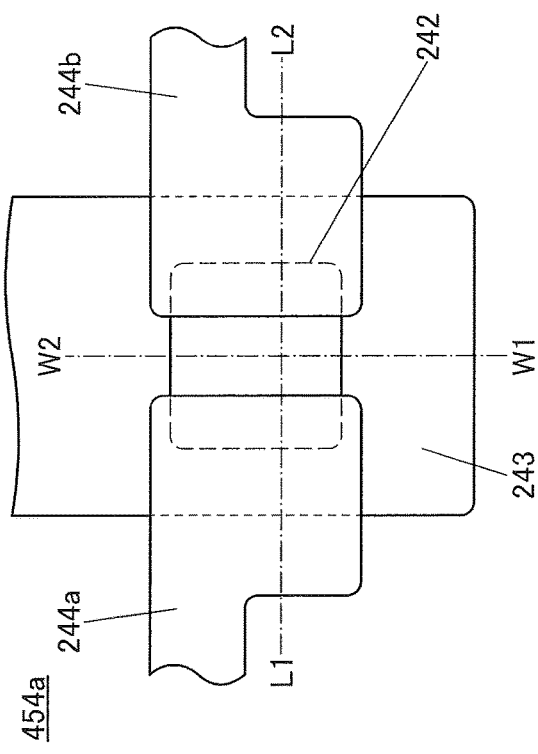
Figure 29B:
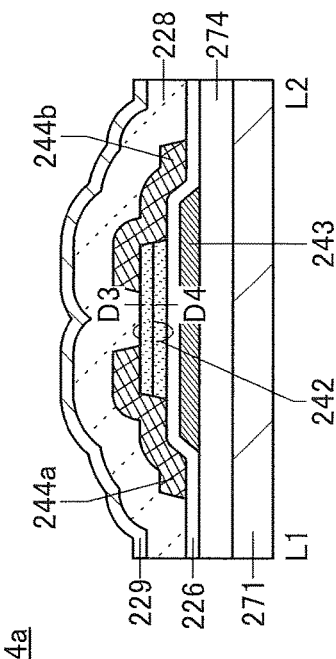

The electrode 224 that can function as a back gate is not necessary provided, depending on the purpose. FIG. 29A is a top view of a transistor 454a. FIG. 29B and FIG. 29C are cross-sectional views of portions indicated by the dashed-dotted line L1-L2 and the dashed-dotted line W1-W2 in FIG. 29A. The transistor 454a has a structure in which the electrode 224, the opening 247a, and the opening 247b are removed from the transistor 454. The productivity of the transistor can be improved by omission of the electrode and the openings. Accordingly, the productivity of the semiconductor device can be improved.

Figure 30A:
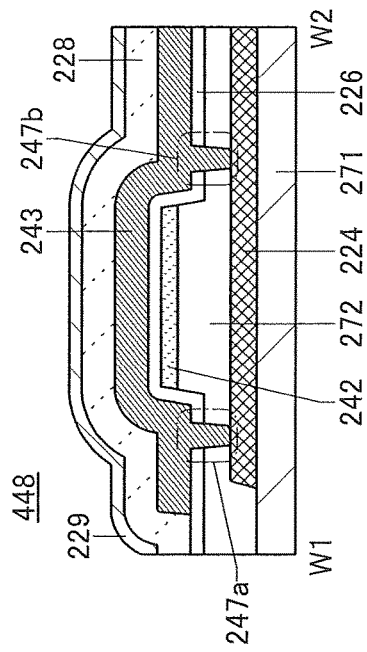
FIGS. 30A to 30C illustrate an example of a transistor.
Figure 30B:
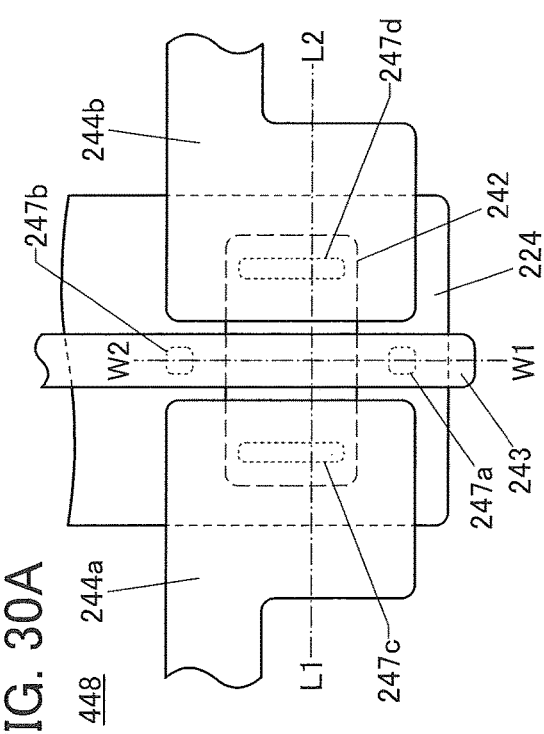
Figure 30C:
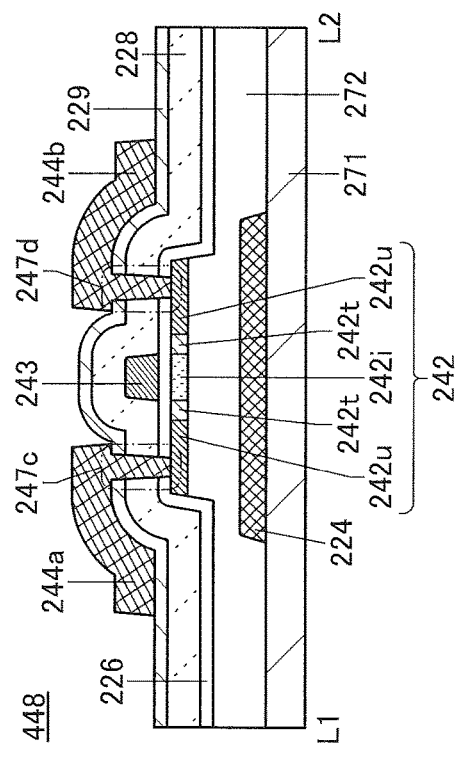

FIGS. 30A to 30C illustrate an example of a transistor with an s-channel structure. A transistor 448 in FIGS. 30A to 30C has almost the same structure as the transistor 447. The transistor 448 is a kind of top-gate transistor having a back gate. FIG. 30A is a top view of the transistor 448. FIG. 30B is a cross-sectional view of a portion indicated by the dashed-dotted line L1-L2 in FIG. 30A. FIG. 30C is a cross-sectional view of a portion indicated by the dashed-dotted line W1-W2 in FIG. 30A.

FIGS. 30A to 30C illustrate an example in which an inorganic semiconductor layer such as a silicon layer is used as the semiconductor layer 242 in the transistor 448. In FIGS. 30A to 30C, the electrode 224 is provided over the substrate 271, and the insulating layer 272 is provided over the electrode 224. In addition, the semiconductor layer 242 is formed over a projection of the insulating layer 272.

The semiconductor layer 242 includes a semiconductor layer 242i, two semiconductor layers 242t, and two semiconductor layers 242u. The semiconductor layer 242i is sandwiched between the two semiconductor layers 242t. The semiconductor layer 242i and the two semiconductor layers 242t are sandwiched between the two semiconductor layers 242u. The electrode 243 is provided in a region overlapping with the semiconductor layer 242i.

A channel is formed in the semiconductor layer 242i when the transistor 448 is on. Therefore, the semiconductor layer 242i serves as a channel formation region. The semiconductor layers 242t serve as low concentration impurity regions (i.e., LDD regions). The semiconductor layers 242u serve as high concentration impurity regions. Note that one or both of the two semiconductor layers 242t are not necessarily provided. One of the two semiconductor layers 242u serves as a source region, and the other semiconductor layer 242u serves as a drain region.

The electrode 244a provided over the insulating layer 229 is electrically connected to one of the semiconductor layers 242u in an opening 247c formed in the insulating layers 226, 228, and 229. The electrode 244b provided over the insulating layer 229 is electrically connected to the other of the semiconductor layers 242u in an opening 247d formed in the insulating layers 226, 228, and, 229.

The electrode 243 provided over the insulating layer 226 is electrically connected to the electrode 224 in the opening 247a and the opening 247b formed in the insulating layers 226 and 272. Accordingly, the same potential is supplied to the electrodes 243 and 224. Furthermore, either or both of the openings 247a and 247b may be omitted. In the case where neither the opening 247a nor the opening 247b is provided, different potentials can be applied to the electrode 243 and the electrode 224.

<Film Formation Method>

The conductive layer such as the electrode, the insulating layer, and the semiconductor layer in this specification and the like can be formed by a chemical vapor deposition (CVD) method, an evaporation method, a sputtering method, or the like. The CVD method generally includes a plasma enhanced CVD (PECVD) method using plasma, a thermal CVD (TCVD) method using heat, and the like. In addition, there is an atmospheric pressure CVD (APCVD) for performing deposition under an atmospheric pressure. The CVD method can be further classified into a metal CVD (MCVD) method, a metal organic CVD (MOCVD) method, and the like according to a source gas to be used.

Furthermore, the evaporation method can be typically classified into a resistance heating evaporation method, an electron beam evaporation method, a molecular beam epitaxy (MBE) method, a pulsed laser deposition (PLD) method, an ion beam assisted deposition (IAD) method, an atomic layer deposition (ALD) method, and the like.

By using the PECVD method, a high-quality film can be formed at a relatively low temperature. By using a deposition method that does not use plasma for deposition, such as the MOCVD method or the evaporation method, a film can be formed with few defects because damage is not easily caused on a surface on which the film is deposited.

A sputtering method is generally classified into a DC sputtering method, a magnetron sputtering method, an RF sputtering method, an ion beam sputtering method, an electron cyclotron resonance (ECR) sputtering method, a facing-target sputtering method, and the like.

In the facing-target sputtering method, plasma is confined between the targets; thus, plasma damage to a substrate can be reduced. Furthermore, step coverage can be improved because an incident angle of a sputtered particle to the substrate can be made smaller depending on the inclination of the target.

Different from a film formation method whereby particles released from a target are deposited, a CVD method and an ALD method are film formation methods whereby a film is formed by a reaction at a surface of an object of the treatment. Thus, a CVD method and an ALD method enable favorable step coverage almost regardless of the shape of an object. In particular, an ALD method enables excellent step coverage and excellent thickness uniformity and can be favorably used for covering a surface of an opening with a high aspect ratio, for example. On the other hand, an ALD method has a relatively low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by a CVD method or an ALD method, a film with a certain composition can be formed depending on a flow rate ratio of the source gases. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the film formation can be reduced because time taken for transfer and pressure adjustment is skipped. Thus, transistors or semiconductor devices can be manufactured with improved productivity.

<Substrate>

There is no great limitation on a material used for the substrate 271. The material may be determined in accordance with the required characteristics; for example, whether it has light-transmitting property or not or heat resistance that can endure heat treatment or not is taken into consideration for the determination. For example, a glass substrate of barium borosilicate glass, aluminoborosilicate glass, or the like, a ceramic substrate, a quartz substrate, or a sapphire substrate can be used. Alternatively, a semiconductor substrate, a flexible substrate, an attachment film, a base film, or the like may be used as the substrate 271.

As the semiconductor substrate, a single material semiconductor substrate of silicon, germanium, or the like or a compound semiconductor substrate of silicon carbide, silicon germanium, gallium arsenide, indium phosphide, zinc oxide, or gallium oxide, or the like is used, for example. The semiconductor substrate may be a single-crystal semiconductor substrate or a polycrystalline semiconductor substrate.

As materials of the flexible substrate, the attachment film, and the base film, the following materials can be used: polyethylene terephthalate (PET), polyethylene naphthalate (PEN), polyether sulfone (PES), polytetrafluoroethylene (PTFE), polypropylene, polyester, polyvinyl fluoride, polyvinyl chloride, polyolefin, polyamide (e.g., nylon or aramid), polyimide, polycarbonate, aramid, an epoxy resin, an acrylic resin, and the like.

The flexible substrate used as the substrate 271 preferably has a lower coefficient of linear expansion because a lower coefficient of linear expansion suppresses deformation due to an environment. The flexible substrate used as the substrate 271 is formed using, for example, a material whose coefficient of linear expansion is lower than or equal to $1\times10^{-3}$/K, lower than or equal to $5\times10^{-5}$/K, or lower than or equal to $1\times10^{-5}$/K. In particular, aramid is preferably used for the flexible substrate because of its low coefficient of linear expansion.

[Insulating Layer]

Each of the insulating layer 272, the insulating layer 273, the insulating layer 274, the insulating layer 275, the insulating layer 282, the insulating layer 228, the insulating layer 226, the insulating layer 229, and the insulating layer 277 can be formed with a single layer or a stack of layers of one or more materials selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, aluminum silicate, and the like. Alternatively, a material in which two or more materials selected from an oxide material, a nitride material, an oxynitride material, and a nitride oxide material are mixed may be used.

Note that in this specification, a nitride oxide refers to a compound that includes more nitrogen than oxygen. An oxynitride refers to a compound that includes more oxygen than nitrogen. The content of each element can be measured by Rutherford backscattering spectrometry (RBS), for example.

It is particularly preferable that the insulating layer 275 and the insulating layer 229 be formed using an insulating material that is relatively impermeable to impurities. The insulating layers 275 and 229 may each be formed to have, for example, a single-layer structure or a stacked-layer structure including an insulating material containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Examples of such an insulating material that is relatively impermeable to impurities include aluminum oxide, aluminum nitride, aluminum oxynitride, aluminum nitride oxide, gallium oxide, germanium oxide, yttrium oxide, zirconium oxide, lanthanum oxide, neodymium oxide, hafnium oxide, tantalum oxide, and silicon nitride. The insulating layer 273 or 229 may be formed using indium tin zinc oxide (In—Sn—Zn oxide) having an excellent insulating property or the like.

When the insulating material that is relatively impermeable to impurities is used for the insulating layer 275, impurity diffusion from the substrate 271 side can be suppressed, and the reliability of the transistor can be improved. When the insulating material that is relatively impermeable to impurities is used for the insulating layer 229, impurity diffusion from the insulating layer 229 side can be suppressed, and the reliability of the transistor can be improved.

A plurality of insulating layers formed using any of the above-described materials may be stacked as each of the insulating layer 272, the insulating layer 273, the insulating layer 274, the insulating layer 282, the insulating layer 228, the insulating layer 226, the insulating layer 229, and the insulating layer 277. The formation method of the insulating layers 272, 273, 274, 282, 228, 226, 229, and 277 is not particularly limited, and a sputtering method, a CVD method, an MBE method, a PLD method, an ALD method, a spin coating method, or the like can be used.

For example, in the case where aluminum oxide is formed by a thermal CVD method, two kinds of gases, e.g., $H_2O$ as an oxidizer and a source gas which is obtained by vaporizing a solvent and liquid containing an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

When an oxide semiconductor is used for the semiconductor layer 242, the hydrogen concentration in the insulating layers is preferably lowered in order to prevent an increase in the hydrogen concentration in the semiconductor layer 242. It is particularly preferable to lower the hydrogen concentration of the insulating layer in contact with the semiconductor layer 242. Specifically, the hydrogen concentration in the insulating layer, which is measured by SIMS, is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$.

The concentration measured by SIMS analysis may include a variation within a range of $\pm40\%$.

When an oxide semiconductor is used for the semiconductor layer 242, the insulating layers are preferably formed with insulating layers from which oxygen is released by heating (also referred to as an "insulating layer containing excess oxygen"). It is particularly preferable that an insulating layer in contact with the semiconductor layer 242 be an insulating layer containing excess oxygen. For example, it is preferable to use an insulating layer in which the amount of released oxygen converted into oxygen atoms is $1.0\times10^{18}$ atoms/cm$^3$ or more, $1.0\times10^{19}$ atoms/cm$^3$ or more, or $1.0\times10^{20}$ atoms/cm$^3$ or more, in thermal desorption spectroscopy (TDS) analysis performed under such a condition that a surface of the insulating layer is heated at a temperature higher than or equal to 100° C. and lower than or equal to 700° C., preferably higher than or equal to 100° C. and lower than or equal to 500° C.

The insulating layer containing excess oxygen can be formed by performing treatment for adding oxygen to an insulating layer. The treatment for adding oxygen can be performed by heat treatment under an oxygen atmosphere or performed with an ion implantation apparatus, an ion doping apparatus, or a plasma treatment apparatus. As a gas for adding oxygen, an oxygen gas of $^{16}O_2$, $^{18}O_2$, or the like, a nitrous oxide gas, an ozone gas, or the like can be used. In this specification, the treatment for adding oxygen is also referred to as "oxygen doping treatment".

The formation of an insulating layer by a sputtering method in an atmosphere including oxygen allows introduction of oxygen into the insulating layer.

Generally, a capacitor has such a structure that a dielectric is sandwiched between two electrodes that face each other, and as the thickness of the dielectric is smaller (as the distance between the two facing electrodes is shorter) or as the dielectric constant of the dielectric is higher, the capacitance becomes higher. However, if the thickness of the dielectric is reduced in order to increase the capacitance of the capacitor, because of a tunnel effect or the like, current unintentionally flowing between the two electrodes (hereinafter also referred to as "leakage current") tends to increase and the withstand voltage of the capacitor tends to be lower.

A portion where a gate electrode, a gate insulating layer, and a semiconductor layer of a transistor overlap with each other functions as the capacitor (hereinafter also referred to as "gate capacitor"). A channel is formed in a region in the semiconductor layer, which overlaps with the gate electrode with the gate insulating layer provided therebetween. That is, the gate electrode and the channel formation region function as two electrodes of the capacitor. Furthermore, the gate insulating layer functions as a dielectric of the capacitor. Although it is preferable that the capacitance of the gate capacitor be as high as possible, a reduction in the thickness of the gate insulating layer for the purpose of increasing the capacitance increases the probability of occurrence of an increase in the leakage current or a reduction in the withstand voltage.

In the case where a high-k material such as hafnium silicate ($HfSi_3O$), ($x>0$, $y>0$)), hafnium silicate to which nitrogen is added ($HfSi_xO_yN_z$ ($x>0$, $y>0$, $z>0$)), hafnium aluminate to which nitrogen is added ($HfAl_xO_yN_z$ ($x>0$, $y>0$, $z>0$)), hafnium oxide, or yttrium oxide is used as the dielectric, even if the thickness of the dielectric is made thick, sufficient capacitance of the capacitor can be ensured.

For example, in the case where a high-k material with a high dielectric constant is used as the dielectric, even when the dielectric is made thick, a capacitance equivalent to that in the case of using silicon oxide as the dielectric can be obtained. This enables a reduction in leakage current between the two electrodes of the capacitor. The dielectric may have a stacked-layer structure of the high-k material and another insulating material.

The insulating layer 228 has a flat surface. As the insulating layer 228, an organic material having heat resistance, such as polyimide, an acrylic-based resin, a benzocyclobutene-based resin, polyamide, or an epoxy-based resin, can be used as well as the above-mentioned insulating materials. Other than such organic materials, it is possible to use a low-dielectric constant material (a low-k material), a siloxane-based resin, phosphosilicate glass (PSG), borophosphosilicate glass (BPSG), or the like. Note that a plurality of insulating layers formed of these materials may be stacked to form the insulating layer 228.

Note that the siloxane-based resin corresponds to a resin including an Si—O—Si bond formed using a siloxane-based material as a starting material. The siloxane-based resin may include, as a substituent, an organic group (e.g., an alkyl group or an aryl group) or a fluoro group. The organic group may include a fluoro group.

There is no particular limitation on the method for forming the insulating layer 228, and any of the following methods that depend on a material thereof can be used: a sputtering method; an SOG method; spin coating; dipping; spray coating; a droplet discharging method (e.g., an ink-jet method); a printing method (e.g., screen printing, or offset printing); or the like.

The sample surface may be subjected to CMP treatment. The CMP treatment can reduce unevenness of the surface, whereby coverage with an insulating layer or a conductive layer to be formed later can be increased.

<Semiconductor Layer>

A single-crystal semiconductor, a polycrystalline semiconductor, a microcrystalline semiconductor, an amorphous semiconductor, or the like may be used for the semiconductor layer 242. As a semiconductor material, silicon, germanium, or the like can be used. Alternatively, a compound semiconductor of silicon germanium, silicon carbide, gallium arsenide, an oxide semiconductor, a nitride semiconductor, or the like, an organic semiconductor, or the like may be used.

In the case of using an organic semiconductor for the semiconductor layer 242, a low molecular organic material having an aromatic ring, a π-electron conjugated conductive polymer, or the like can be used. For example, rubrene, tetracene, pentacene, perylenediimide, tetracyanoquinodimethane, polythiophene, polyacetylene, or polyparaphenylene vinylene can be used.

As described above, the band gap of an oxide semiconductor is 2 eV or wider; thus, when the oxide semiconductor is used for the semiconductor layer 242, a transistor with an extremely low off-state current can be provided. An OS transistor has high withstand voltage between its source and drain. Thus, a transistor with high reliability can be provided. Furthermore, a transistor with high output voltage and high withstand voltage can be provided. Furthermore, a semiconductor device or the like with high reliability can be provided. Furthermore, a semiconductor device with high output voltage and high withstand voltage can be provided.

In this embodiment, the case where an oxide semiconductor is used for the semiconductor layer 242 is described. For the oxide semiconductor used for the semiconductor layer 242, an oxide semiconductor containing, for example, indium (In) is preferably used. An oxide semiconductor can have a high carrier mobility (electron mobility) by containing indium, for example. An oxide semiconductor preferably contains an element M.

The element M is preferably aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum, tungsten, magnesium, and the like. Note that two or more of the above elements may be used in combination as the element M. The element M is an element having a high bonding energy with oxygen, for example. The element M increases the energy gap of the oxide semiconductor, for example. Furthermore, the oxide semiconductor preferably contains zinc. When the oxide semiconductor contains zinc, the oxide semiconductor is easily crystallized in some cases.

Note that the oxide semiconductor used for the semiconductor layer 242 is not limited to the oxide containing indium. The oxide semiconductor may be, for example, an oxide semiconductor which does not contain indium and contains zinc, an oxide semiconductor which does not contain indium and contains gallium, or an oxide semiconductor which does not contain indium and contains tin, e.g., a zinc tin oxide, a gallium tin oxide, or gallium oxide.

For example, in the case where an $InGaZnO_X$ ($X>0$) film is formed by a thermal CVD method as the semiconductor layer 242, trimethylindium ($In(CH_3)_3$), trimethylgallium ($Ga(CH_3)_3$), and dimethylzinc ($Zn(CH_3)_2$) are used. Without limitation to the above combination, triethylgallium ($Ga(C_2H_5)_3$) can be used instead of trimethylgallium, and diethylzinc ($Zn(C_2H_5)_2$) can be used instead of dimethylzinc.

For example, in the case where an $InGaZnO_X$ film ($X>0$) is formed as the semiconductor layer 242 by an ALD method, an $In(CH_3)_3$ gas and an $O_3$ gas are sequentially introduced a plurality of times to form an $InO_2$ layer, subsequently a $Ga(CH_3)_3$ gas and an $O_3$ gas are sequentially introduced a plurality of times to form a GaO layer, and then a $Zn(CH_3)_2$ gas and an $O_3$ gas are sequentially introduced a plurality of times to form a ZnO layer. Note that the order of these layers is not limited to this example. A mixed compound layer such as an $InGaO_2$ layer, an $InZnO_2$ layer, a GaInO layer, a ZnInO layer, or a GaZnO layer may be formed by using these gases. Note that although an $H_2O$ gas which is obtained by bubbling water with an inert gas such as Ar may be used instead of an $O_3$ gas, it is preferable to use an $O_3$ gas, which does not contain H. Furthermore, instead of an $In(CH_3)_3$ gas, an $In(C_2H_5)_3$ gas or tris(acetylacetonato) indium may be used. Note that tris(acetylacetonato)indium is also referred to as In(acac)$_3$. In addition, instead of a Ga(CH$_3$)$_3$ gas, a Ga(C$_2$H$_5$)$_3$ gas or tris(acetylacetonato)gallium may be used. Note that tris(acetylacetonato)gallium is also referred to as Ga(acac)$_3$. Furthermore, a Zn(CH$_3$)$_2$ gas or zinc acetate may be used. However, the deposition gas is not limited to these.

In the case where the oxide semiconductor is formed by a sputtering method, a target containing indium is preferably used in order to reduce the number of particles. In addition, if an oxide target having a high atomic ratio of the element M is used, the conductivity of the target may be decreased. Particularly in the case where a target containing indium is used, the conductivity of the target can be increased and DC discharge or AC discharge is facilitated; thus, deposition over a large substrate can be easily performed. Thus, semiconductor devices can be manufactured with improved productivity.

As described above, in the case where the oxide semiconductor is formed by a sputtering method, the atomic ratio of In to M and Zn contained in the target may be 3:1:1, 3:1:2, 3:1:4, 1:1:0.5, 1:1:1, 1:1:2, 1:4:4, 5:1:7, 4:2:4.1, or a ratio close to these ratios, for example.

When the oxide semiconductor is formed by a sputtering method, an oxide semiconductor having an atomic ratio different from the atomic ratio of the target may be deposited. Especially for zinc, the atomic ratio of zinc in the deposited film is smaller than the atomic ratio of the target in some cases. Specifically, the film has an atomic ratio of zinc of 40 atomic % to 90 atomic % of the atomic ratio of zinc in the target.

Each of the semiconductor layer 242a, the semiconductor layer 242b, and the semiconductor layer 242c is preferably formed using a material containing either In or Ga or both of them. Typical examples are an In—Ga oxide (an oxide containing In and Ga), an In—Zn oxide (an oxide containing In and Zn), and an In-M-Zn oxide (an oxide containing In, an element M, and Zn: the element M is one or more kinds of elements selected from Al, Ti, Ga, Y, Zr, La, Ce, Nd, and Hf and has a higher strength of bonding with oxygen than In has).

The semiconductor layer 242a and the semiconductor layer 242c are preferably formed using a material containing one or more kinds of metal elements contained in the semiconductor layer 242b. With the use of such a material, interface states at interfaces between the semiconductor layer 242a and the semiconductor layer 242b and between the semiconductor layer 242c and the semiconductor layer 242b are less likely to be generated. Accordingly, carriers are not likely to be scattered or captured at the interfaces, which results in an improvement in field-effect mobility of the transistor. Furthermore, threshold-voltage variation of the transistor can be reduced. Thus, a semiconductor device having favorable electrical characteristics can be obtained.

In the case where the semiconductor layer 242b is an In-M-Zn oxide and the semiconductor layers 242a and 242c are each an In-M-Zn oxide, the semiconductor layers 242a and 242c each have the atomic ratio where In:M:Zn=$x_1$:$y_1$:$z_1$, and the semiconductor layer 242b has an atomic ratio where In:M:Zn=$x_2$:$y_2$:$z_2$, for example. In that case, the compositions of the semiconductor layers 242a, 242c, and 242b can be determined so that $y_1/x_1$ is larger than $y_2/x_2$. It is preferable that the compositions of the semiconductor layer 242a, the semiconductor layer 242c, and the semiconductor layer 242b are determined so that $y_1/x_1$ is 1.5 times or more as large as $y_2/x_2$. It is further preferable that the compositions of the semiconductor layer 242a, the semiconductor layer 242c, and the semiconductor layer 242b are determined so that $y_1/x_1$ is twice or more as large as $y_2/x_2$. It is still further preferable that the compositions of the semiconductor layer 242a, the semiconductor layer 242c, and the semiconductor layer 242b are determined so that $y_1/x_1$ is three times or more as large as $y_2/x_2$. It is preferred that $y_1$ be larger than or equal to $x_1$ because the transistor can have stable electrical characteristics. However, when $y_1$ is three times or more as large as $x_1$, the field-effect mobility of the transistor is reduced; accordingly, $y_1$ is preferably smaller than three times $x_1$. When the semiconductor layer 242a and the semiconductor layer 242c have the above compositions, the semiconductor layer 242a and the semiconductor layer 242c can each be a layer in which oxygen vacancies are less likely to be generated than in the semiconductor layer 242b.

In the case where the semiconductor layers 242a and 242c are each an In-M-Zn oxide and the summation of In and the element M is assumed to be 100 atomic %, the atomic percentages of In and an element M are preferably as follows: the percentage of In is lower than 50 atomic % and the percentage of M is higher than or equal to 50 atomic %. The percentages of In and M are more preferably as follows: the percentage of In is lower than 25 atomic % and the percentage of M is higher than or equal to 75 atomic %. In the case where the semiconductor layer 242b is an In-M-Zn oxide and the summation of In and M is assumed to be 100 atomic %, the atomic percentages of In and the element M are preferably more than or equal to 25 atomic % and less than 75 atomic %, respectively, further preferably more than or equal to 34 atomic % and less than 66 atomic %, respectively.

For example, an In—Ga—Zn oxide which is formed using a target having an atomic ratio of In:Ga:Zn=1:3:2, 1:3:4, 1:3:6, 1:4:5, 1:6:4, 1:9:6, or the atomic ratio close to these ratios, an In—Ga oxide which is formed using a target having an atomic ratio of In:Ga=1:9, or gallium oxide can be used for each of the semiconductor layer 242a and the semiconductor layer 242c containing In or Ga. Furthermore, an In—Ga—Zn oxide which is formed using a target having an atomic ratio of In:Ga:Zn=3:1:2, 1:1:1, 5:5:6, 5:1:7, 4:2:4.1, or an atomic ratio close to these ratios can be used for the semiconductor layer 242b. Note that the atomic ratio of each of the semiconductor layer 242a, the semiconductor layer 242b, and the semiconductor layer 242c may vary within a range of ±20% of any of the above-described atomic ratios as an error.

In order to give stable electrical characteristics to the OS transistor, it is preferable that impurities and oxygen vacancies in the oxide semiconductor layer be reduced to highly purify the oxide semiconductor layer so that the semiconductor layer 242 can be regarded as an intrinsic or substantially intrinsic oxide semiconductor layer. Furthermore, it is preferable that at least the channel formation region of the semiconductor layer 242 can be regarded as an intrinsic or substantially intrinsic oxide semiconductor layer.

It is preferable that impurities and oxygen vacancies in the semiconductor layer 242b be reduced to obtain a highly purified oxide semiconductor layer; accordingly, the semiconductor layer 242b can be regarded as an intrinsic or substantially intrinsic oxide semiconductor layer. Furthermore, it is preferable that at least the channel formation region of the semiconductor layer 242b be regarded as an intrinsic or substantially intrinsic oxide semiconductor layer.

Note that the substantially intrinsic oxide semiconductor layer refers to an oxide semiconductor layer in which the carrier density is higher than or equal to $1 \times 10^{-9}/\text{cm}^3$ and lower than $8\times10^{11}/cm^3$, preferably lower than $1\times10^{11}/cm^3$, further preferably lower than $1\times10^{10}/cm^3$.

When an oxide semiconductor layer is used as the semiconductor layer 242, the layer preferably includes c-axis aligned crystalline oxide semiconductor (CAAC-OS). A CAAC-OS is an oxide semiconductor having a plurality of c-axis aligned crystal parts.

In the oxide semiconductor layer used as the semiconductor layer 242, a region where CAAC is not formed preferably accounts for less than 20% of the whole oxide semiconductor layer.

The CAAC-OS has dielectric anisotropy. Specifically, the CAAC-OS has a larger dielectric constant in the c-axis direction than in the a-axis direction and the b-axis direction. In a transistor in which a CAAC-OS is used for a semiconductor layer where a channel is formed and a gate electrode is positioned in the c-axis direction, the dielectric constant in the c-axis direction is large; thus, the electric field generated from the gate electrode easily reaches the entire CAAC-OS. The subthreshold swing value (S value) can be made small. In addition, in the transistor in which a CAAC-OS is used for the semiconductor layer, an increase in S value due to miniaturization is less likely to occur.

Moreover, since the dielectric constant in the a-axis direction and the b-axis direction of a CAAC-OS is small, an influence of the electric field generated between a source and a drain is reduced. Thus, a channel length modulation effect, a short-channel effect, or the like is less likely to occur, whereby the reliability of the transistor can be increased:

Here, the channel length modulation effect is a phenomenon in which, when the drain voltage is higher than the threshold voltage, a depletion layer expands from the drain side, so that the effective channel length is decreased. The short-channel effect is a phenomenon in which a channel length is reduced, so that a deterioration in electrical characteristics such as a decrease in threshold voltage is caused. The more a transistor is miniaturized, the more deterioration in electrical characteristics caused by the phenomena is likely to occur.

Note that after the oxide semiconductor layer is formed, oxygen doping treatment may be performed. In order to further decrease impurities such as water or hydrogen in the oxide semiconductor layer to highly purify the oxide semiconductor layer, heat treatment is preferably performed.

For example, the oxide semiconductor layer is subjected to heat treatment in a reduced-pressure atmosphere, an inert gas atmosphere of nitrogen, a rare gas, or the like, an oxidation atmosphere, or an ultra dry air atmosphere (the moisture amount is 20 ppm (−55° C. by conversion into a dew point) or less, preferably 1 ppm or less, further preferably 10 ppb or less, in the case where the measurement is performed by a dew point meter in a cavity ring down laser spectroscopy (CRDS) system). Note that the oxidation atmosphere refers to an atmosphere including an oxidation gas such as oxygen, ozone, or nitrogen oxide at 10 ppm or higher. The inert gas atmosphere refers to an atmosphere including the oxidation gas at lower than 10 ppm and is filled with nitrogen or a rare gas.

By the heat treatment, at the same time as the release of the impurities, oxygen contained in the insulating layer 226 is diffused to the oxide semiconductor layer and oxygen vacancies in the oxide semiconductor layer can be reduced. Note that the heat treatment may be performed in such a manner that heat treatment is performed in an inert gas atmosphere, and then another heat treatment is performed in an atmosphere containing an oxidation gas at 10 ppm or more, 1% or more, or 10% or more in order to compensate for desorbed oxygen. The heat treatment may be performed at any time after the oxide semiconductor layer is formed.

There is no particular limitation on a heat treatment apparatus used for the heat treatment, and the apparatus may be provided with a device for heating an object to be processed by heat conduction or heat radiation from a heating element such as a resistance heating element. For example, an electric furnace, or a rapid thermal annealing (RTA) apparatus such as a lamp rapid thermal annealing (LRTA) apparatus or a gas rapid thermal annealing (GRTA) apparatus can be used. The LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for heat treatment using a high-temperature gas.

The heat treatment may be performed at a temperature higher than or equal to 250° C. and lower than or equal to 650° C., preferably higher than or equal to 300° C. and lower than or equal to 500° C. The treatment time is shorter than or equal to 24 hours. Heat treatment for over 24 hours is not preferable because the productivity is reduced.

<Electrode>

As a conductive material for forming each of the electrode 243, the electrode 224, the electrode 244a, the electrode 244b, the electrode 225a, and the electrode 225b, a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, and the like can be used. Alternatively, a semiconductor having a high electric conductivity typified by polycrystalline silicon including an impurity element such as phosphorus, or silicide such as nickel silicide may be used. A plurality of stacked conductive layers formed with these materials may be used as the electrode.

The conductive material for forming the electrodes 243, 224, 244a, 244b, 225a, and 225b can also be formed using a conductive material containing oxygen, such as indium tin oxide (ITO), indium oxide containing tungsten oxide, indium zinc oxide containing tungsten oxide, indium oxide containing titanium oxide, indium tin oxide containing titanium oxide, indium zinc oxide, or indium tin oxide to which silicon is added, or a conductive material containing nitrogen, such as titanium nitride or tantalum nitride. It is also possible to use a stacked-layer structure formed using a material containing the above metal element and a conductive material containing oxygen. It is also possible to use a stacked-layer structure formed using a material containing the above metal element and a conductive material containing nitrogen. It is also possible to use a stacked-layer structure formed using a material containing the above metal element, a conductive material containing oxygen, and a conductive material containing nitrogen. There is no particular limitation on the formation method of the conductive material, and any of a variety of formation methods such as an evaporation method, a CVD method, and a sputtering method can be employed.

<Contact Plug>

As the contact plug, a conductive material with high embeddability such as tungsten or polysilicon can be used. A side surface and a bottom surface of the material may be covered with a barrier layer (a diffusion prevention layer) of a titanium layer, a titanium nitride layer, or a stacked layer of these layers. In this case, the barrier layer is regarded as part of the contact plug in some cases.

This embodiment can be implemented in appropriate combination with any of the structures described in the other embodiments.

Embodiment 3

Figure 32A:
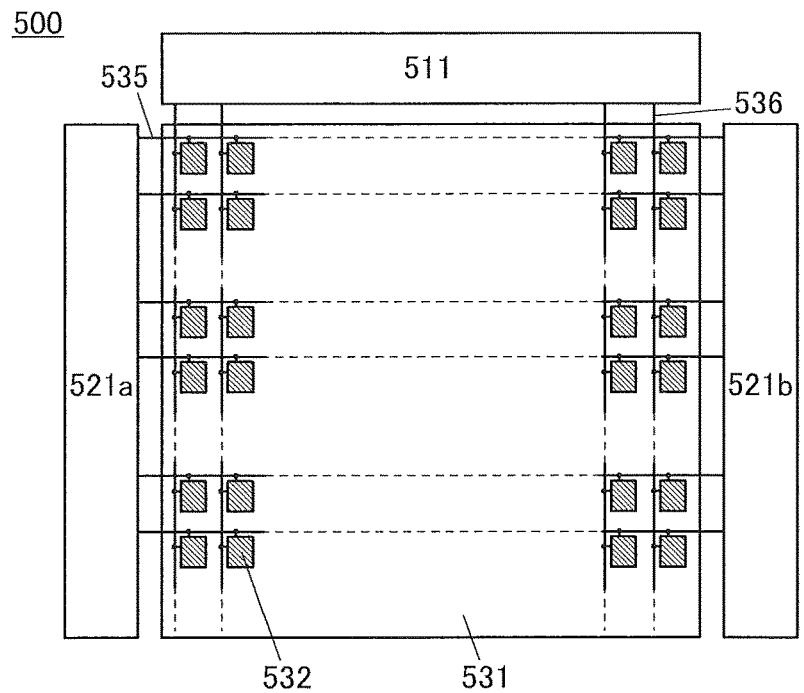
FIGS. 32A to 32C illustrate examples of display devices.

The shift registers disclosed in the above embodiment can be used for a driver circuit of a display device. This embodiment describes examples where the shift registers disclosed in the above embodiments are used in display devices, with reference to drawings. FIG. 32A is a block diagram illustrating a structure example of a display device 500.

The display device 500 in FIG. 32A includes driver circuits 511, 521a, and 521b, and a display region 531. Note that the driver circuits 511, 521a, and 521b are collectively referred to as a driver circuit or a peripheral driver circuit in some cases.

The driver circuits 521a and 521b can function as, for example, scan line driver circuits. The driver circuit 511 can function as, for example, a signal line driver circuit. Note that one of the driver circuits 521a and 521b may be omitted. Alternatively, some sort of circuit facing the driver circuit 511 with the display region 531 provided therebetween may be provided.

The display device 500 illustrated as an example in FIG. 32A includes p wirings 535 which are arranged substantially parallel to each other and whose potentials are controlled by the driver circuit 521a and/or the driver circuit 521b, and q wirings 536 which are arranged substantially parallel to each other and whose potentials are controlled by the driver circuit 511. The display region 531 includes a plurality of pixels 532 arranged in a matrix. The pixel 532 includes a pixel circuit 534 and a display element.

When every three pixels 532 function as one pixel, full-color display can be provided. The three pixels 532 each control the transmittance, reflectance, amount of emitted light, or the like of red light, green light, or blue light. The light colors controlled by the three pixels 532 are not limited to the combination of red, green, and blue, and may be yellow, cyan, and magenta.

A pixel 532 that controls white light may be added to the pixels controlling red light, green light, and blue light so that the four pixels 532 will collectively serve as one pixel. The addition of the pixel 532 controlling white light can heighten the luminance of the display region. When the number of the pixels 532 functioning as one pixel is increased to use red, green, blue, yellow, cyan, and magenta in appropriate combination, the range of color reproduction can be widened.

Using the pixels arranged in a matrix of 1920×1080, the display device 500 can display an image with "full high definition" (also referred to as "2K resolution", "2K1K", "2K", and the like). Using the pixels arranged in a matrix of 3840×2160, the display device 500 can display an image with "ultra high definition" (also referred to as "4K resolution", "4K2K", "4K", and the like). Using the pixels arranged in a matrix of 7680×4320, the display device 500 can display an image with "super high definition" (also referred to as "8K resolution", "8K4K", "8K", and the like). Using a larger number of pixels, the display device 500 can display an image with 16K or 32K resolution.

A wiring 535_g on the g-th row (g is a natural number larger than or equal to 1 and smaller than or equal to p) is electrically connected to q pixels 532 on the g-th row among the plurality of pixels 532 arranged in p rows and q columns (p and q are each a natural number of 1 or more) in the display region 531. A wiring 536_h on the h-th column (h is a natural number larger than or equal to 1 and smaller than or equal to q) is electrically connected to p pixels 532 on the h-th column among the plurality of pixels 532 arranged in p rows and q columns.

[Display Element]

The display device 500 can employ various modes and include various display elements. Examples of the display element include a display medium whose contrast, luminance, reflectance, transmittance, or the like is changed by electrical or magnetic effect, such as an electroluminescence (EL) element (e.g., an organic EL element, an inorganic EL element, or an EL element including organic and inorganic materials,), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a display element using micro electro mechanical systems (MEMS), a digital micromirror device (DMD), a digital micro shutter (DMS), MIRASOL (registered trademark), an interferometric modulation (IMOD) element, a MEMS shutter display element, an optical-interference-type MEMS display element, an electrowetting element, a piezoelectric ceramic display, or a display element using a carbon nanotube. Alternatively, quantum dots may be used as the display element.

Note that examples of display devices having EL elements include an EL display. Examples of display devices including electron emitters are a field emission display (FED) and an SED-type flat panel display (SED: surface-conduction electron-emitter display). Examples of display devices including quantum dots include a quantum dot display. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, Electronic Liquid Powder (registered trademark), or electrophoretic elements include electronic paper. For example, the display device may be a plasma display panel (PDP).

In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor film thereover, such as an n-type GaN semiconductor layer including crystals. Furthermore, a p-type GaN semiconductor layer including crystals or the like can be provided thereover, and thus the LED can be formed. Note that an AlN layer may be provided between the n-type GaN semiconductor layer including crystals and graphene or graphite. The GaN semiconductor layers included in the LED may be formed by MOCVD. Note that when the graphene is provided, the GaN semiconductor layers included in the LED can also be formed by a sputtering method.

FIGS. 32B and 32C and FIGS. 33A and 33B illustrate circuit structure examples that can be used for the pixel 532.

[Example of Pixel Circuit for Light-Emitting Display Device]

Figure 32B:
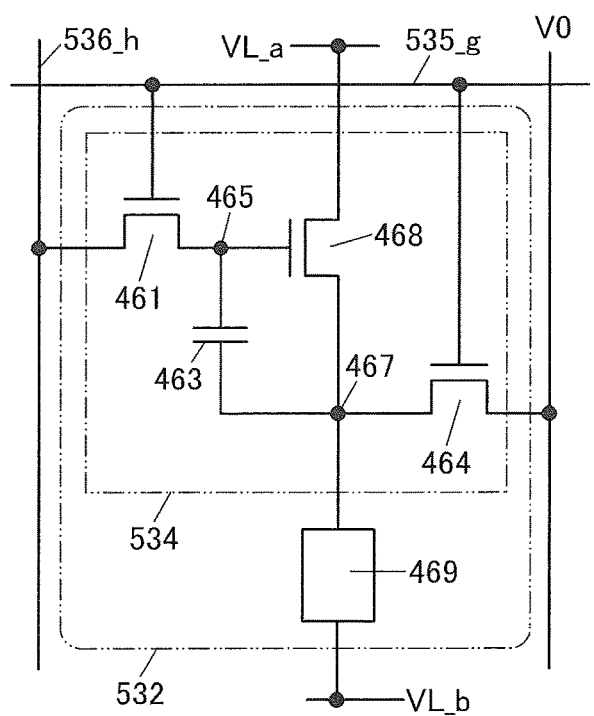

The pixel circuit 534 in FIG. 32B includes transistors 461, 468, and 464, and a capacitor 463. The pixel circuit 534 in FIG. 32B is electrically connected to a light-emitting element 469 that can function as a display element.

One of a source electrode and a drain electrode of the transistor 461 is electrically connected to the wiring 536_h. A gate electrode of the transistor 461 is electrically connected to the wiring 535_g. The wiring 536_h supplies a video signal.

The transistor 461 has a function of controlling writing of a video signal to a node 465.

One of a pair of electrodes of the capacitor 463 is electrically connected to the node 465, and the other is electrically connected to a node 467. The other of the source electrode and the drain electrode of the transistor 461 is electrically connected to the node 465.

The capacitor 463 has a function as a storage capacitor for storing data written to the node 465.

One of a source electrode and a drain electrode of the transistor 468 is electrically connected to a potential supply line VL_a, and the other of the source electrode and the drain electrode of the transistor 468 is electrically connected to the node 467. A gate electrode of the transistor 468 is electrically connected to the node 465.

One of a source electrode and a drain electrode of the transistor 464 is electrically connected to a potential supply line V0, and the other of the source electrode and the drain electrode of the transistor 464 is electrically connected to the node 467. A gate electrode of the transistor 464 is electrically connected to the wiring 535_g.

One of an anode and a cathode of the light-emitting element 469 is electrically connected to a potential supply line VL_b, and the other is electrically connected to the node 467.

As the light-emitting element 469, an organic electroluminescence element (also referred to as an organic EL element) or the like can be used, for example. Note that the light-emitting element 469 is not limited thereto and may be an inorganic EL element containing an inorganic material, for example.

A high power supply potential $V_{DD}$ is supplied to one of the potential supply line VL_a and the potential supply line VL_b, and a low power supply potential $V_{SS}$ is supplied to the other, for example.

In the display device 500 including the pixel circuits 534 in FIG. 32B, the pixels 532 are sequentially selected row by row by the driver circuit 521a and/or the driver circuit 521b, so that the transistors 461 and 464 are turned on and a video signal is written to the node 465.

The pixel 532 in which the data has been written to the node 465 is brought into a holding state when the transistors 461 and 464 are turned off. The amount of current flowing between the source electrode and the drain electrode of the transistor 468 is controlled in accordance with the potential of the data written to the node 465. The light-emitting element 469 emits light with a luminance corresponding to the amount of flowing current. This operation is sequentially performed row by row; thus, an image is displayed.

Figure 33A:
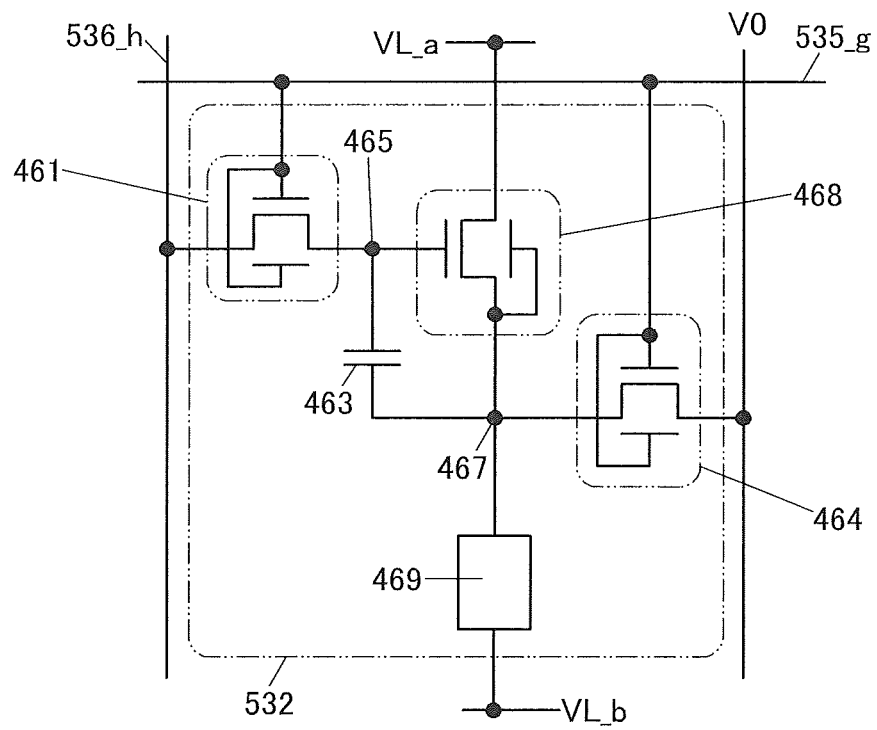
FIGS. 33A and 33B illustrate examples of display devices.

As shown in FIG. 33A, the transistors 461, 464, and 468 may be transistors with back gates. In each of the transistors 461 and 464 in FIG. 33A, the gate is electrically connected to the back gate. Thus, the gate and the back gate always have the same potential. The back gate of the transistor 468 is electrically connected to the node 467. Therefore, the back gate always has the same potential as the node 467.

[Example of Pixel Circuit for Liquid Crystal Display Device]

Figure 32C:
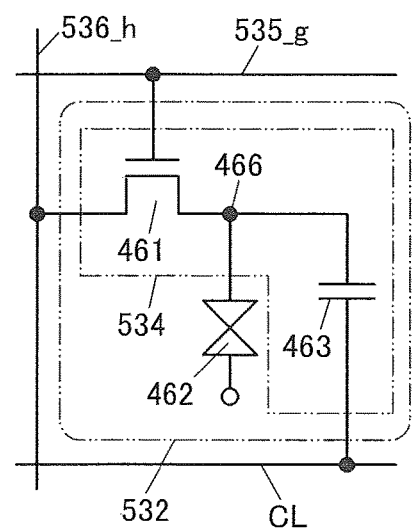

The pixel circuit 534 in FIG. 32C includes the transistor 461 and the capacitor 463. The pixel circuit 534 in FIG. 32C is electrically connected to a liquid crystal element 462 that can function as a display element.

The potential of one of a pair of electrodes of the liquid crystal element 462 is set as appropriate according to the specifications of the pixel circuit 534. For example, one of the pair of electrodes of the liquid crystal element 462 may be supplied with a common potential, or may have the same potential as a capacitor line CL. Further, the potential applied to one of the pair of electrodes of the liquid crystal element 462 may be different among the pixels 532. The other of the pair of electrodes of the liquid crystal element 462 is electrically connected to a node 466. The alignment state of the liquid crystal element 462 depends on data written to the node 466.

As a driving method of the display device including the liquid crystal element 462, any of the following modes can be used, for example: a twisted nematic (TN) mode, a super-twisted nematic (STN) mode, a vertical alignment (VA) mode, an axially symmetric aligned micro-cell (ASM) mode, an optically compensated birefringence (OCB) mode, a ferroelectric liquid crystal (FLC) mode, an antiferroelectric liquid crystal (AFLC) mode, a multi-domain vertical alignment (MVA) mode, a patterned vertical alignment (PVA) mode, an in-plane-switching (IPS) mode, a fringe field switching (FFS) mode, a transverse bend alignment (TBA) mode, and the like. Other examples of the driving method of the display device include an electrically controlled birefringence (ECB) mode, a polymer dispersed liquid crystal (PDLC) mode, a polymer network liquid crystal (PNLC) mode, and a guest-host mode. Note that one embodiment of the present invention is not limited thereto, and various liquid crystal elements and driving methods can be used.

In the case where a liquid crystal element is used as the display element, thermotropic liquid crystal, low-molecular liquid crystal, high-molecular liquid crystal, polymer-dispersed liquid crystal, ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which 5 wt. % or more of a chiral material is mixed is preferably used for a liquid crystal layer in order to improve the temperature range. The liquid crystal composition that includes the liquid crystal exhibiting a blue phase and a chiral material has a short response time of 1 msec or less, and has optical isotropy, which makes the alignment process unnecessary and the viewing angle dependence small. An alignment film does not need to be provided and rubbing treatment is thus not necessary; accordingly, electrostatic discharge damage caused by the rubbing treatment can be prevented and defects and damage of the liquid crystal display device in the manufacturing process can be reduced. Thus, productivity of the liquid crystal display device can be improved.

Furthermore, it is possible to use a method called domain multiplication or multi-domain design, in which a pixel is divided into some regions (subpixels) and molecules are aligned in different directions in their respective regions.

The specific resistivity of the liquid crystal material is greater than or equal to $1\times10^9$ Ω·cm, preferably greater than or equal to $1\times10^{11}$ Ω·cm, still preferably greater than or equal to $1\times10^{12}$ Ω·cm. Note that the specific resistance in this specification is measured at 20° C.

In the pixel circuit 534 on the g-th row and the h-th column, one of the source electrode and the drain electrode of the transistor 461 is electrically connected to the wiring 536_h, and the other of the source electrode and the drain electrode of the transistor 461 is electrically connected to the node 466. The gate electrode of the transistor 461 is electrically connected to the wiring 535_g. The wiring 536_h supplies a video signal. The transistor 461 has a function of controlling writing of a video signal to the node 466.

One of a pair of electrodes of the capacitor 463 is electrically connected to a wiring to which a particular potential is supplied (hereinafter referred to as a capacitor line CL), and the other is electrically connected to the node 466. The potential of the capacitor line CL is set in accordance with the specifications of the pixel circuit 534 as appropriate. The capacitor 463 has a function as a storage capacitor for storing data written to the node 466.

For example, in the display device 500 including the pixel circuit 534 in FIG. 32C, the pixel circuits 534 are sequentially selected row by row by the driver circuit 521a and/or the driver circuit 521b, so that the transistors 461 are turned on and a video signal is written to the node 466.

The pixel circuit 534 in which the video signal has been written to the node 466 is brought into a holding state when the transistor 461 is turned off. This operation is sequentially performed row by row; thus, an image can be displayed on the display region 531.

Figure 33B:
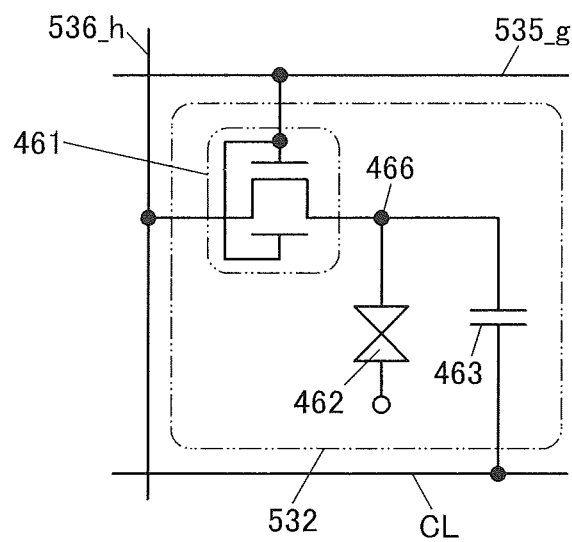

As shown in FIG. 33B, the transistor 461 may be a transistor with a back gate. In the transistor 461 in FIG. 33B, the gate is electrically connected to the back gate. Thus, the gate and the back gate always have the same potential.

[Structure Example of Peripheral Circuit]

Figure 34A:
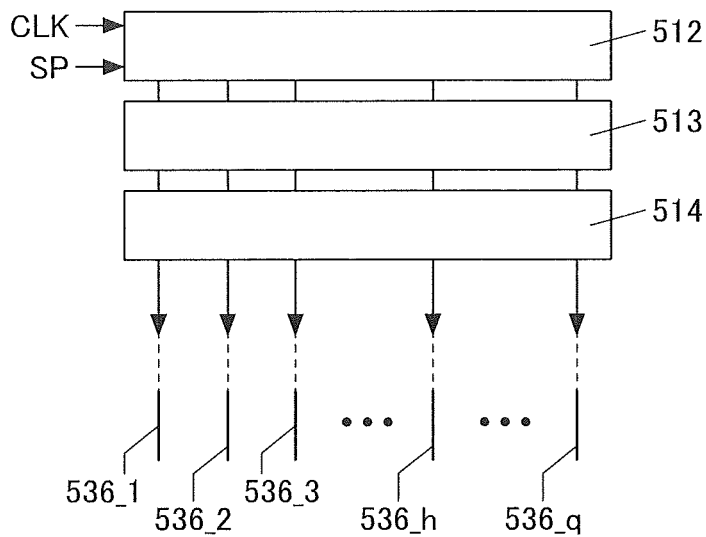
FIGS. 34A and 34B each illustrate a structure example of a driver circuit.
Figure 34B:
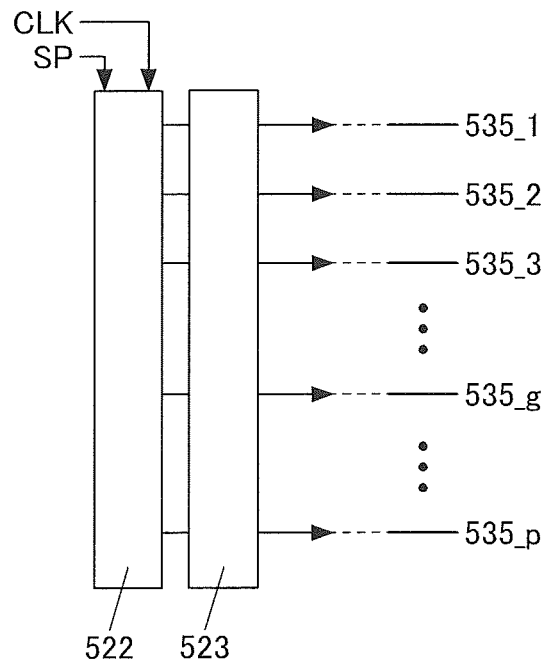

FIG. 34A shows a structure example of the driver circuit 511. The driver circuit 511 includes a shift register 512, a latch circuit 513, and a buffer 514. FIG. 34B shows a structure example of the driver circuit 521a. The driver circuit 521a includes a shift register 522 and a buffer 523. The structure of the driver circuit 521b can be similar to that of the driver circuit 521a.

The start pulse SP, the clock signal CLK, and the like are input to the shift register 512 and the shift register 522. Any of the shift registers described in the above embodiment can be used as the shift register 512 and the shift register 522.

This embodiment can be implemented in appropriate combination with any of the structures described in the other embodiments and the like.

Embodiment 4

With use of any of the transistors described in the above embodiments, some or all of driver circuits which include transistors can be formed over a substrate where a pixel portion is formed, whereby a system-on-panel can be obtained. Structure examples of a display device to which any of the transistors described in the above embodiments can be used are described with reference to FIGS. 35A to 35C and FIGS. 36A and 36B.

[Liquid Crystal Display Device and EL Display Device]

Figure 35A:
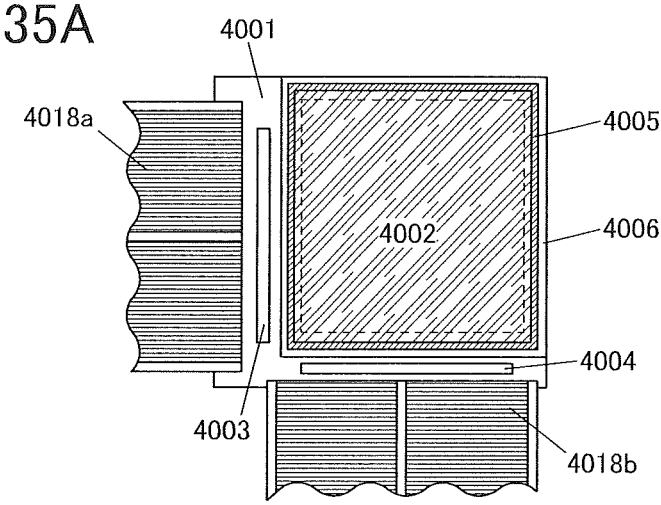
FIGS. 35A to 35C each illustrate an example of a display device.

A display device including a liquid crystal element and a display device including an EL element are described as examples of the display device. In FIG. 35A, a sealant 4005 is provided so as to surround a pixel portion 4002 provided over a first substrate 4001, and the pixel portion 4002 is sealed with a second substrate 4006. In FIG. 35A, a signal line driver circuit 4003 and a scan line driver circuit 4004 each are formed using a single crystal semiconductor or a polycrystalline semiconductor over another substrate, and mounted in a region different from the region surrounded by the sealant 4005 over the first substrate 4001. Various signals and potentials are supplied to the signal line driver circuit 4003, the scan line driver circuit 4004, and the pixel portion 4002 from flexible printed circuits (FPCs) 4018a and 4018b.

Figure 35B:
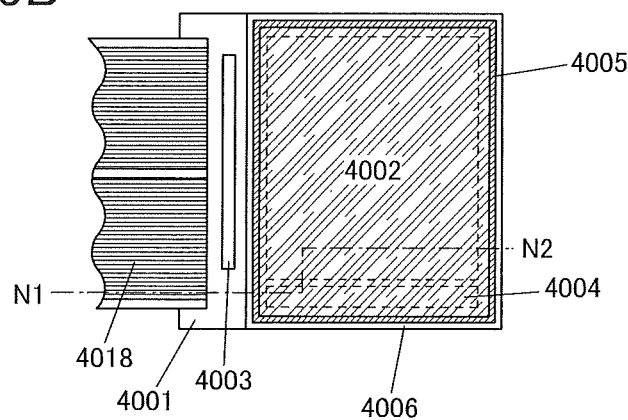
Figure 35C:
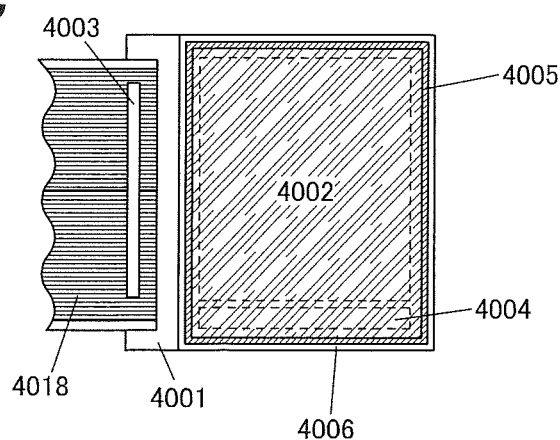

In FIGS. 35B and 35C, the sealant 4005 is provided so as to surround the pixel portion 4002 and the scan line driver circuit 4004 that are provided over the first substrate 4001. The second substrate 4006 is provided over the pixel portion 4002 and the scan line driver circuit 4004. Consequently, the pixel portion 4002 and the scan line driver circuit 4004 are sealed together with the display element, by the first substrate 4001, the sealant 4005, and the second substrate 4006. Furthermore, in FIGS. 35B and 35C, the signal line driver circuit 4003 that is formed using a single crystal semiconductor or a polycrystalline semiconductor over another substrate is mounted in a region that is different from the region surrounded by the sealant 4005 over the first substrate 4001. In FIGS. 35B and 35C, various signals and potentials are supplied to the signal line driver circuit 4003, the scan line driver circuit 4004, and the pixel portion 4002 through an FPC 4018.

Although FIGS. 35B and 35C each illustrate an example in which the signal line driver circuit 4003 is formed separately and mounted on the first substrate 4001, one embodiment of the present invention is not limited to this structure. The scan line driver circuit may be separately formed and then mounted, or only part of the signal line driver circuit or part of the scan line driver circuit may be separately formed and then mounted.

The connection method of a separately formed driver circuit is not particularly limited; wire bonding, a chip on glass (COG), a tape carrier package (TCP), a chip on film (COF), or the like can be used. FIG. 35A illustrates an example in which the signal line driver circuit 4003 and the scan line driver circuit 4004 are mounted by a COG. FIG. 35B illustrates an example in which the signal line driver circuit 4003 is mounted by a COG. FIG. 35C illustrates an example in which the signal line driver circuit 4003 is mounted by a TCP.

In some cases, the display device encompasses a panel in which a display element is sealed, and a module in which an IC or the like including a controller is mounted on the panel.

The pixel portion and the scan line driver circuit provided over the first substrate include a plurality of transistors and any of the transistors which are described in the above embodiments can be applied thereto.

Figure 36A:
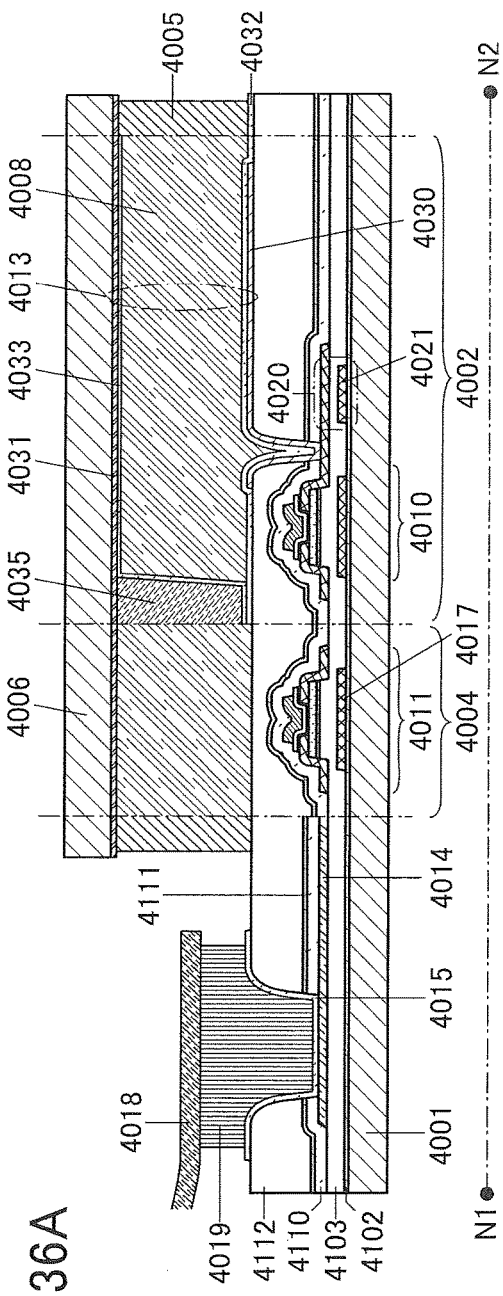
FIGS. 36A and 36B each illustrate an example of a display device.
Figure 36B:
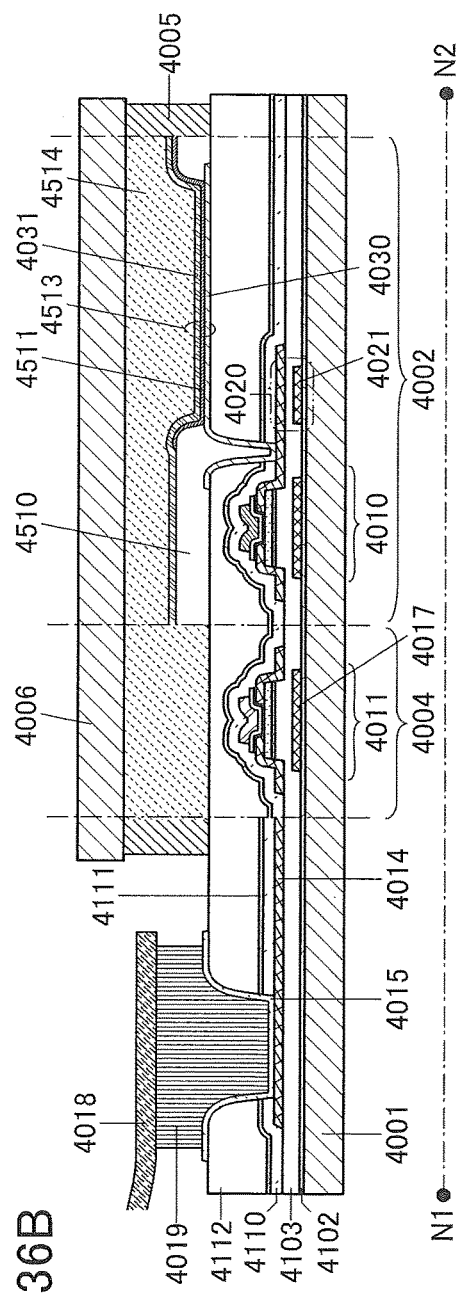

FIGS. 36A and 36B correspond to cross-sectional views taken along chain line N1-N2 in FIG. 35B. As shown in FIGS. 36A and 36B, the display device has an electrode 4015, and the electrode 4015 is electrically connected to a terminal included in the FPC 4018 through an anisotropic conductive layer 4019. The electrode 4015 is electrically connected to a wiring 4014 in an opening formed in insulating layers 4112, 4111, and 4110.

The electrode 4015 is formed using the same conductive layer as a first electrode layer 4030, and the wiring 4014 is formed using the same conductive layer as source and drain electrodes of transistors 4010 and 4011.

The pixel portion 4002 and the scan line driver circuit 4004 provided over the first substrate 4001 include a plurality of transistors. In FIGS. 36A and 36B, the transistor 4010 included in the pixel portion 4002 and the transistor 4011 included in the scan line driver circuit 4004 are shown as an example. The insulating layers 4112, 4111, and 4110 are provided over the transistors 4010 and 4011 in FIG. 36A, and a bank 4510 is further provided over the insulating layer 4112 in FIG. 36B.

The transistors 4010 and 4011 are provided over an insulating layer 4102. The transistors 4010 and 4011 each include an electrode 4017 over the insulating layer 4102. An insulating layer 4103 is formed over the electrode 4017. The electrode 4017 can serve as a back gate electrode.

Any of the transistors described in the above embodiments can be applied to the transistors 4010 and 4011. A change in the electrical characteristics of any of the transistors described in the above embodiments is suppressed and thus the transistors are electrically stable. Accordingly, the display devices of this embodiment illustrated in FIGS. 36A and 36B can be highly reliable display devices.

FIGS. 36A and 36B illustrate the case where a transistor having a structure similar to that of the transistor 452 described in the above embodiment is used as each of the transistors 4010 and 4011.

The display devices illustrated in FIGS. 36A and 36B each include a capacitor 4020. The capacitor 4020 includes a region where part of the source electrode or part of the drain electrode of the transistor 4010 overlaps with an electrode 4021 with the insulating layer 4103 interposed therebetween. The electrode 4021 is formed using the same conductive layer as the electrode 4017.

In general, the capacitance of a capacitor provided in a display device is set in consideration of leakage current or the like of transistors provided in a pixel portion so that charge can be held for a predetermined period. The capacitance of the capacitor may be set considering off-state current of the transistor or the like.

For example, when an OS transistor is used for a pixel portion of a liquid crystal display device, the capacitance of the capacitor can be one-third or smaller, furthermore, one-fifth or smaller of the capacitance of a liquid crystal. Using an OS transistor can omit the formation of a capacitor.

The transistor 4010 included in the pixel portion 4002 is electrically connected to the display element. An example of a liquid crystal display device using a liquid crystal element as a display element is illustrated in FIG. 36A. In FIG. 36A, a liquid crystal element 4013 that is the display element includes the first electrode layer 4030, a second electrode layer 4031, and a liquid crystal layer 4008. Note that an insulating layer 4032 and an insulating layer 4033 functioning as alignment films are provided so that the liquid crystal layer 4008 is provided therebetween. The second electrode layer 4031 is provided on the second substrate 4006 side, and the first electrode layer 4030 and the second electrode layer 4031 overlap with each other with the liquid crystal layer 4008 positioned therebetween.

A spacer 4035 is a columnar spacer obtained by selective etching of an insulating layer and is provided in order to control the distance between the first electrode layer 4030 and the second electrode layer 4031 (a cell gap). Alternatively, a spherical spacer may be used.

OS transistors are preferably used as the transistors 4010 and 4011. In the OS transistor, the current in an off state (the off-state current) can be made small. Accordingly, an electrical signal such as an image signal can be held for a longer period, and a writing interval can be set longer in an on state. Accordingly, frequency of refresh operation can be reduced, which leads to an effect of suppressing power consumption.

In the OS transistor, relatively high field-effect mobility can be obtained, whereby high-speed operation is possible. Consequently, when the above transistor is used in a driver circuit portion or a pixel portion of a display device, high-quality images can be obtained. Since the driver circuit portion and the pixel portion can be formed over one substrate with use of the above transistor, the number of components of the display device can be reduced.

In the display device, a black matrix (a light-blocking layer), an optical member (an optical substrate) such as a polarizing member, a retardation member, or an anti-reflection member, and the like may be provided as appropriate. For example, circular polarization may be employed by using a polarizing substrate and a retardation substrate. In addition, a backlight, a sidelight, or the like may be used as a light source.

As the display element included in the display device, a light-emitting element utilizing electroluminescence (also referred to as an "EL element") can be used. An EL element includes a layer containing a light-emitting compound (also referred to as an "EL layer") between a pair of electrodes. By generating a potential difference between the pair of electrodes that is greater than the threshold voltage of the EL element, holes are injected to the EL layer from the anode side and electrons are injected to the EL layer from the cathode side. The injected electrons and holes are recombined in the EL layer, so that a light-emitting substance contained in the EL layer emits light.

EL elements are classified depending on whether a light-emitting material is an organic compound or an inorganic compound. In general, the former is referred to as an organic EL element, and the latter is referred to as an inorganic EL element.

In an organic EL element, by voltage application, electrons are injected from one electrode to the EL layer and holes are injected from the other electrode to the EL layer. The carriers (i.e., electrons and holes) are recombined; thus, the light-emitting organic compound is excited. The light-emitting organic compound returns to a ground state from the excited state, thereby emitting light. Based on such a mechanism, such a light-emitting element is referred to as a current-excitation type light-emitting element.

In addition to the light-emitting compound, the EL layer may further include any of a substance with a high hole-injection property, a substance with a high hole-transport property, a hole-blocking material, a substance with a high electron-transport property, a substance with a high electron-injection property, a substance with a bipolar property (a substance with a high electron-transport property and a hole-transport property), and the like.

The EL layer can be formed by an evaporation method (including a vacuum evaporation method), a transfer method, a printing method, an inkjet method, a coating method, or the like.

Inorganic EL elements are classified as a dispersed inorganic EL element and a thin-film inorganic EL element depending on their element structures. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is given here using an organic EL element as a light-emitting element.

In order to extract light emitted from the light-emitting element, it is acceptable as long as at least one of a pair of electrodes is transparent. The light-emitting element can have a top emission structure in which light emission is extracted from the side opposite to the substrate; a bottom emission structure in which light emission is extracted from the substrate side; or a dual emission structure in which light emission is extracted from both the side opposite to the substrate and the substrate side.

FIG. 36B illustrates an example of a light-emitting display device (also referred to as an "EL display device") using a light-emitting element as a display element. A light-emitting element 4513 which is the display element is electrically connected to the transistor 4010 provided in the pixel portion 4002. The structure of the light-emitting element 4513 is the stacked-layer structure including the first electrode layer 4030, a light-emitting layer 4511, and the second electrode layer 4031; however, this embodiment is not limited to this structure. The structure of the light-emitting element 4513 can be changed as appropriate depending on a direction in which light is extracted from the light-emitting element 4513, or the like.

The bank 4510 is formed using an organic insulating material or an inorganic insulating material. It is particularly preferable that the bank 4510 be formed using a photosensitive resin material to have an opening over the first electrode layer 4030 so that a side surface of the opening slopes with continuous curvature.

The light-emitting layer 4511 may be formed using a single layer or a plurality of layers stacked.

A protective layer may be formed over the second electrode layer 4031 and the bank 4510 in order to prevent entry of oxygen, hydrogen, moisture, carbon dioxide, or the like into the light-emitting element 4513. For the protective layer, silicon nitride, silicon nitride oxide, aluminum oxide, aluminum nitride, aluminum oxynitride, aluminum nitride oxide, diamond like carbon (DLC), or the like can be used. In addition, in a space which is enclosed by the first substrate 4001, the second substrate 4006, and the sealant 4005, a filler 4514 is provided for sealing. It is preferable that, in this manner, the display device be packaged (sealed) with a protective film (such as a laminate film or an ultraviolet curable resin film) or a cover member with high air-tightness and little degasification so that the display device is not exposed to the outside air.

As the filler 4514, an ultraviolet curable resin or a thermosetting resin can be used as well as an inert gas such as nitrogen or argon; for example, polyvinyl chloride (PVC), an acrylic resin, polyimide, an epoxy resin, a silicone resin, polyvinyl butyral (PVB), ethylene vinyl acetate (EVA), or the like can be used. A drying agent may be contained in the filler 4514.

A glass material such as a glass frit, or a resin that is curable at room temperature such as a two-component-mixture-type resin, a light curable resin, a thermosetting resin, and the like can be used for the sealant 4005. A drying agent may be contained in, the sealant 4005.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Furthermore, the polarizing plate or the circularly polarizing plate may be provided with an anti-reflection film. For example, anti-glare treatment by which reflected light can be diffused by projections and depressions on the surface so as to reduce the glare can be performed.

When the light-emitting element has a microcavity structure, light with high color purity can be extracted. Furthermore, when a microcavity structure and a color filter are used in combination, the glare can be reduced and the visibility of a display image can be increased.

The first electrode layer and the second electrode layer (also called a pixel electrode layer, a common electrode layer, a counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

The first electrode layer 4030 and the second electrode layer 4031 each can also be formed using one or more kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride thereof.

A conductive composition containing a conductive high molecule (also called a conductive polymer) can be used for the first electrode layer 4030 and the second electrode layer 4031. As the conductive high molecule, a so-called 7c-electron conjugated conductive high molecule can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is easily broken due to static electricity or the like, a protection circuit for protecting the driver circuit is preferably provided. The protection circuit is preferably formed using a nonlinear element.

With use of any of the shift registers described in the above embodiments, a highly reliable display device can be provided. With use of any of the transistors described in the above embodiments, a highly reliable display device can be provided. With use of any of the transistors described in the above embodiments, a display device that has a high resolution, a large size, and high display quality can be provided. Furthermore, a display device with low power consumption can be provided.

[Example of Display Module]

A display module is described as an example of a semiconductor device using any of the above-described shift registers or transistors. In a display module 6000 in FIG. 37, a touch sensor 6004 connected to an FPC 6003, a display panel 6006 connected to an FPC 6005, a backlight unit 6007, a frame 6009, a printed circuit board 6010, and a battery 6011 are provided between an upper cover 6001 and a lower cover 6002. Note that the backlight unit 6007, the battery 6011, the touch sensor 6004, and the like are not provided in some cases.

The semiconductor device of one embodiment of the present invention can be used for, for example, the touch sensor 6004, the display panel 6006, an integrated circuit mounted on the printed circuit board 6010, and the like. For example, the above-described display device can be used in the display panel 6006.

The shapes and sizes of the upper cover 6001 and the lower cover 6002 can be changed as appropriate in accordance with the sizes of the touch sensor 6004, the display panel 6006, and the like.

The touch sensor 6004 can be a resistive touch sensor or a capacitive touch sensor and may be formed to overlap with the display panel 6006. The display panel 6006 can have a touch sensor function. For example, an electrode for a touch sensor may be provided in each pixel of the display panel 6006 so that a capacitive touch panel function is added. Alternatively, a photosensor may be provided in each pixel of the display panel 6006 so that an optical touch sensor function is added.

The backlight unit 6007 includes a light source 6008. The light source 6008 may be provided at an end portion of the backlight unit 6007 and a light diffusing plate may be used. When a light-emitting display device or the like is used for the display panel 6006, the backlight unit 6007 can be omitted.

The frame 6009 protects the display panel 6006 and also functions as an electromagnetic shield for blocking electromagnetic waves generated from the printed circuit board 6010 side. The frame 6009 may function as a radiator plate.

The printed circuit board 6010 has a power supply circuit, a signal processing circuit for outputting a video signal and a clock signal, and the like. As a power source for supplying power to the power supply circuit, the battery 6011 or a commercial power source may be used. Note that the battery 6011 can be omitted in the case where a commercial power source is used as the power source.

The display module 6000 can be additionally provided with a member such as a polarizing plate, a retardation plate, or a prism sheet.

This embodiment can be implemented in appropriate combination with any of the structures described in the other embodiments and the like.

Embodiment 5

In this embodiment, examples of electronic devices including any of the semiconductor devices disclosed in this specification and the like are described.

Specific examples of semiconductor devices each using the semiconductor device of one embodiment of the present invention are as follows: display devices of televisions, monitors, and the like, lighting devices, desktop personal computers and laptop personal computers, word processors, image reproduction devices which reproduce still images and moving images stored in recording media such as digital versatile discs (DVDs), portable CD players, radios, tape recorders, headphone stereos, stereos, table clocks, wall clocks, cordless phone handsets, transceivers, car phones, mobile phones, portable information terminals, tablet terminals, portable game machines, stationary game machines such as pachinko machines, calculators, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electric power tools such as chain saws, smoke detectors, and medical equipment such as dialyzers. Other examples are as follows: industrial equipment such as guide lights, traffic lights, conveyor belts, elevators, escalators, industrial robots, power storage systems, and power storage devices for leveling the amount of power supply and smart grid. In addition, moving objects driven by fuel engines and electric motors using power from power storage units are also included in the category of electronic devices in some cases. Examples of the moving objects are electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircrafts, rockets, artificial satellites, space probes, planetary probes, and spacecrafts.

Figure 38A:
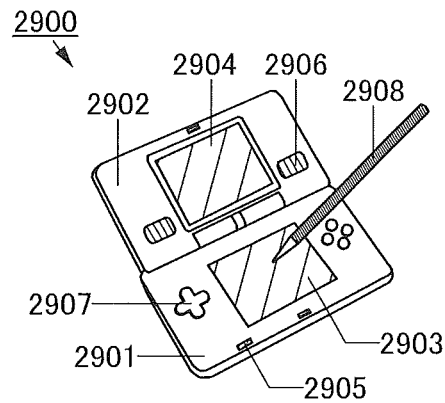
FIGS. 38A to 38H illustrate examples of electronic devices.

A portable game machine 2900 illustrated in FIG. 38A includes a housing 2901, a housing 2902, a display portion 2903, a display portion 2904, a microphone 2905, a speaker 2906, an operation switch 2907, and the like. In addition, the portable game machine 2900 includes an antenna, a battery, and the like inside the housing 2901. Although the portable game machine in FIG. 38A has the two display portions 2903 and 2904, the number of display portions included in a portable game machine is not limited to this. The display portion 2903 is provided with a touch screen as an input device, which can be handled with a stylus 2908 or the like.

Figure 38B:
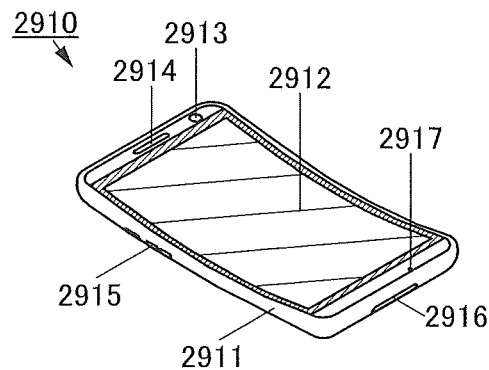

An information terminal 2910 illustrated in FIG. 38B includes a housing 2911, a display portion 2912, a microphone 2917, a speaker portion 2914, a camera 2913, an external connection portion 2916, an operation switch 2915, and the like. A display panel and a touch screen that use a flexible substrate are provided in the display portion 2912. In addition, the information terminal 2910 includes an antenna, a battery, and the like inside the housing 2911. The information terminal 2910 can be used as, for example, a smartphone, a mobile phone, a tablet information terminal, a tablet personal computer, or an e-book reader.

Figure 38C:
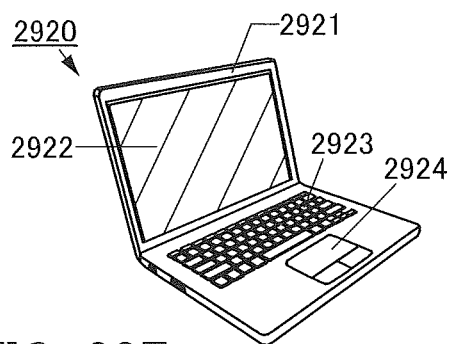

A notebook personal computer 2920 illustrated in FIG. 38C includes a housing 2921, a display portion 2922, a keyboard 2923, a pointing device 2924, and the like. In addition, the notebook personal computer 2920 includes an antenna, a battery, and the like inside the housing 2921.

Figure 38D:
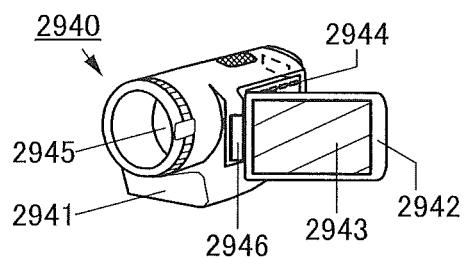

A video camera 2940 in FIG. 38D includes a housing 2941, a housing 2942, a display portion 2943, operation switches 2944, a lens 2945, a joint 2946, and the like. The operation switches 2944 and the lens 2945 are provided in the housing 2941, and the display portion 2943 is provided in the housing 2942. In addition, the video camera 2940 includes an antenna, a battery, and the like inside the housing 2941. The housings 2941 and 2942 are connected to each other with the joint 2946, and the angle between the housings 2941 and 2942 can be changed with the joint 2946. The direction of an image on the display portion 2943 may be changed and display and non-display of an image may be switched depending on the angle between the housings 2941 and 2942.

Figure 38E:
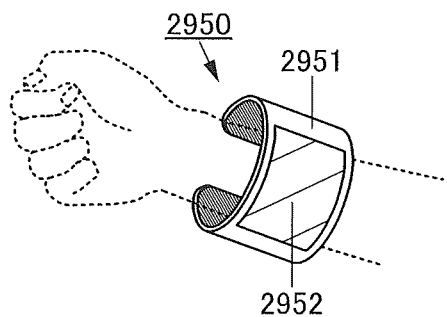

FIG. 38E illustrates an example of a bangle-type information terminal. An information terminal 2950 includes a housing 2951, a display portion 2952, and the like. In addition, the information terminal 2950 includes an antenna, a battery, and the like inside the housing 2951. The display portion 2952 is supported by the housing 2951 having a curved surface. A display panel formed with a flexible substrate is provided in the display portion 2952, whereby the information terminal 2950 can be a user-friendly information terminal that is flexible and lightweight.

Figure 38F:
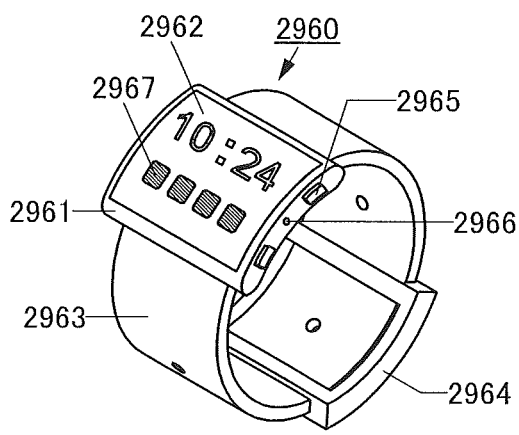

FIG. 38F illustrates an example of a watch-type information terminal. An information terminal 2960 includes a housing 2961, a display portion 2962, a band 2963, a buckle 2964, an operation switch 2965, an input/output terminal 2966, and the like. In addition, the information terminal 2960 includes an antenna, a battery, and the like inside the housing 2961. The information terminal 2960 is capable of executing a variety of applications such as mobile phone calls, e-mailing, viewing and editing texts, music reproduction, Internet communication, and computer games.

The display surface of the display portion 2962 is bent, and images can be displayed on the bent display surface. Furthermore, the display portion 2962 includes a touch sensor, and operation can be performed by touching the screen with a finger, a stylus, or the like. For example, by touching an icon 2967 displayed on the display portion 2962, an application can be started. With the operation switch 2965, a variety of functions such as time setting, ON/OFF of the power, ON/OFF of wireless communication, setting and cancellation of a silent mode, and setting and cancellation of a power saving mode can be performed. For example, the functions of the operation switch 2965 can be set by setting the operating system incorporated in the information terminal 2960.

The information terminal 2960 can employ near field communication that is a communication method based on an existing communication standard. In that case, for example, mutual communication between the information terminal 2960 and a headset capable of wireless communication can be performed, and thus hands-free calling is possible. Moreover, the information terminal 2960 includes the input/output terminal 2966, and data can be directly transmitted to and received from another information terminal via a connector. Power charging through the input/output terminal 2966 is possible. Note that the charging operation may be performed by wireless power feeding without using the input/output terminal 2966.

Figure 38G:
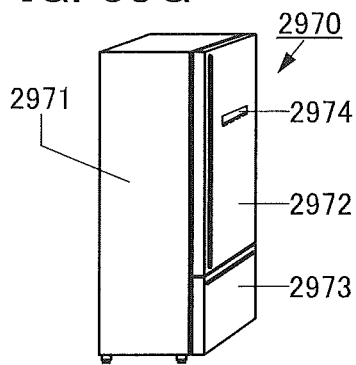

FIG. 38G illustrates an electric refrigerator-freezer as an example of a home electric appliance. An electric refrigerator-freezer 2970 includes a housing 2971, a refrigerator door 2972, a freezer door 2973, a display portion 2974, and the like.

Figure 38H:
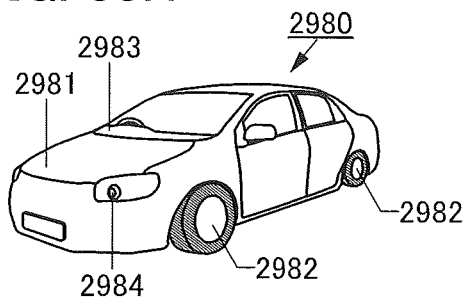

FIG. 38H is an external view illustrating an example of a motor vehicle. A motor vehicle 2980 includes a car body 2981, wheels 2982, a dashboard 2983, lights 2984, and the like. The motor vehicle 2980 includes an antenna, a battery, and the like.

The electronic devices shown in this embodiment each include the semiconductor device of one embodiment of the present invention.

This embodiment can be implemented in appropriate combination with any of the structures described in the other embodiments and the like.

This application is based on Japanese Patent Application serial no. 2015-214320 filed with Japan Patent Office on Oct. 30, 2015, the entire contents of which are hereby incorporated by reference.

What is claimed is:

1. A semiconductor device comprising:
   first to twelfth transistors,
   wherein the ninth to twelfth transistors each include a first gate and a second gate,
   wherein one of a source and a drain of the first transistor is electrically connected to a first wiring,
   wherein the other of the source and the drain of the first transistor is electrically connected to one of a source and a drain of the second transistor,
   wherein the other of the source and the drain of the second transistor is electrically connected to a second wiring,
   wherein one of a source and a drain of the third transistor is electrically connected to the first wiring,
   wherein the other of the source and the drain of the third transistor is electrically connected to the other of the source and the drain of the first transistor,
   wherein one of a source and a drain of the fourth transistor is electrically connected to the first wiring,
   wherein the other of the source and the drain of the fourth transistor is electrically connected to one of a source and a drain of the ninth transistor,
   wherein a gate of the fourth transistor is electrically connected to a gate of the second transistor,
   wherein the other of the source and the drain of the ninth transistor is electrically connected to the second wiring,
   wherein the first gate of the ninth transistor is electrically connected to the first gate of the tenth transistor,
   wherein the second gate of the ninth transistor is electrically connected to a third wiring,
   wherein one of a source and a drain of the eleventh transistor is electrically connected to the other of the source and the drain of the fourth transistor,
   wherein the other of the source and the drain of the eleventh transistor is electrically connected to a gate of the fifth transistor,
   wherein the first gate of the eleventh transistor is electrically connected to a fourth wiring,
   wherein the second gate of the eleventh transistor is electrically connected to the second gate of the ninth transistor,
   wherein one of a source and a drain of the fifth transistor is electrically connected to one of a source and a drain of the sixth transistor,
   wherein the other of the source and the drain of the fifth transistor is electrically connected to one of a source and a drain of the tenth transistor,
   wherein the second gate of the tenth transistor is electrically connected to the third wiring,
   wherein the other of the source and the drain of the sixth transistor is electrically connected to one of a source and a drain of the twelfth transistor,
   wherein a gate of the sixth transistor is electrically connected to the gate of the fifth transistor,
   wherein the other of the source and the drain of the twelfth transistor is electrically connected to the second wiring,
   wherein the first gate of the twelfth transistor is electrically connected to the first gate of the tenth transistor,
   wherein the second gate of the twelfth transistor is electrically connected to the third wiring,
   wherein one of a source and a drain of the seventh transistor is electrically connected to the first gate of the tenth transistor,
   wherein the other of the source and the drain of the seventh transistor is electrically connected to the second wiring,
   wherein a gate of the seventh transistor is electrically connected to the third wiring,
   wherein one of a source and a drain of the eighth transistor is electrically connected to the other of the source and the drain of the third transistor,
   wherein the other of the source and the drain of the eighth transistor is electrically connected to the first gate of the tenth transistor, and wherein a gate of the eighth transistor is electrically connected to the fourth wiring.

2. The semiconductor device according to claim 1, further comprising a first capacitor,
wherein one of electrodes of the first capacitor is electrically connected to the gate of the sixth transistor, and
wherein the other of the electrodes of the first capacitor is electrically connected to one of the source and the drain of the twelfth transistor.

3. The semiconductor device according to claim 1, further comprising a second capacitor,
wherein one of electrodes of the second capacitor is electrically connected to the other of the source and the drain of the third transistor, and
wherein the other of the electrodes of the second capacitor is electrically connected to the second wiring.

4. The semiconductor device according to claim 1, further comprising a third capacitor,
wherein one of electrodes of the third capacitor is electrically connected to the first gate of the tenth transistor, and
wherein the other of the electrodes of the third capacitor is electrically connected to the second wiring.

5. The semiconductor device according to claim 1, wherein one of the source and the drain of the sixth transistor is electrically connected to a wiring through which a first clock signal is supplied.

6. The semiconductor device according to claim 1, wherein a gate of the first transistor is electrically connected to a wiring through which a reset signal is supplied.

7. The semiconductor device according to claim 1, wherein the gate of the second transistor is electrically connected to a wiring through which a start signal is supplied.

8. The semiconductor device according to claim 1, wherein a gate of the third transistor is electrically connected to a wiring through which a second clock signal is supplied.

9. The semiconductor device according to claim 1, wherein the other of the source and the drain of the fifth transistor is configured to output a signal.

10. The semiconductor device according to claim 1, wherein the other of the source and the drain of the sixth transistor is configured to output a signal.

11. The semiconductor device according to claim 1, wherein the first to twelfth transistors have the same conductivity type.

12. The semiconductor device according to claim 1, wherein the first to twelfth transistors each comprise an oxide semiconductor layer where a channel is formed.

13. An electronic device comprising:
the semiconductor device according to claim 1; and
a touch sensor, an antenna, a battery, a housing, a speaker, a microphone, or an operation switch.

14. A semiconductor device comprising:
a pulse output circuit comprising:
a first transistor comprising a source, a drain, and a gate;
a second transistor comprising a source, a drain, a first gate, and a second gate;
a third transistor comprising a source, a drain, a first gate, and a second gate;
a fourth transistor comprising a source, a drain, and a gate;
a fifth transistor comprising a source, a drain, and a gate;
a sixth transistor comprising a source, a drain, and a gate; and a seventh transistor comprising a source, a drain and a gate;
wherein one of the source and the drain of the first transistor is electrically connected to a first wiring,
wherein the other of the source and the drain of the first transistor is electrically connected to one of the source and the drain of the second transistor,
wherein the other of the source and the drain of the second transistor is electrically connected to the other of the source and the drain of the third transistor,
wherein the gate of the first transistor is electrically connected to a second wiring through the source and the drain of the fifth transistor and to a third wiring through the source and the drain of the third transistor,
wherein one of the first gate and the second gate of the second transistor and one of the first gate and the second gate of the third transistor are each electrically connected to the second wiring through the source and the drain of the fourth transistor,
wherein the other of the first gate and the second gate of the second transistor and the other of the first gate and the second gate of the third transistor are each electrically connected to a fourth wiring,
wherein the gate of the fourth transistor is electrically connected to a fifth wiring,
wherein the gate of the sixth transistor is electrically connected to the fourth wiring, and
wherein the one of the first gate and the second gate of the second transistor and the one of the first gate and the second gate of the third transistor are each electrically connected to the third wiring through the source and the drain of the sixth transistor wherein the gate of the seventh transistor is electrically connected to the gate of the fifth transistor, and wherein the one of the first gate and the second gate of the second transistor and the one of the first gate and the second gate of the third transistor are each electrically connected to the third wiring through the source and the drain of the fourth transistor and the source and the drain of the seventh transistor.

15. The semiconductor device according to claim 14,
wherein the fourth wiring is configured to be supplied with a first signal, and
wherein the fifth wiring is configured to be supplied with a second signal that is opposite to the first signal.

16. The semiconductor device according to claim 14, comprising a capacitor comprising a first electrode and a second electrode,
wherein the first electrode of the capacitor is electrically connected to the gate of the first transistor, and
wherein the second electrode of the capacitor is electrically connected to the other of the source and the drain of the first transistor and the one of the source and the drain of the second transistor.

17. The semiconductor device according to claim 14,
wherein each of the second transistor and the third transistor comprises:
a semiconductor layer between the first gate and the second gate;
a first gate insulating layer between the first gate and the semiconductor layer; and
a second gate insulating layer between the second gate and the semiconductor layer, and
wherein the semiconductor layer is positioned between the first gate insulating layer and the second gate insulating layer.

18. The semiconductor device according to claim 17, wherein the semiconductor layer comprises an oxide semiconductor.

\* \* \* \* \*